US012707704B2

(12) United States Patent
Hsiao et al.

(10) Patent No.: US 12,707,704 B2
(45) Date of Patent: Aug. 11, 2026

(54) METHOD OF FORMING A SEMICONDUCTOR DEVICE HAVING GATE SPACERS WITH REGIONS OF DIFFUSED SILICON GERMANIUM

(71) Applicant: Taiwan Semiconductor Manufacturing Company, Ltd., Hsinchu (TW)

(72) Inventors: Hsu Ming Hsiao, Hsinchu (TW); Hsiu-Hao Tsao, Taichung (TW); Ming-Jhe Sie, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 694 days.

(21) Appl. No.: 17/662,185

(22) Filed: May 5, 2022

(65) Prior Publication Data

US 2023/0361191 A1 Nov. 9, 2023

(51) Int. Cl.
*H10D 64/66* (2025.01)
*H10D 30/01* (2025.01)
(Continued)

(52) U.S. Cl.
CPC ......... *H10D 64/679* (2025.01); *H10D 30/031* (2025.01); *H10D 30/6713* (2025.01); (Continued)

(58) Field of Classification Search
CPC ........... H10D 30/6757; H10D 30/6735; H10D 30/502; H10D 30/503; H10D 30/504; H10D 30/506; H10D 30/507; H10D 30/508; H10D 30/014; H10D 30/0191; H10D 30/0193; H10D 30/0194; H10D 30/0195; H10D 30/0196; H10D 30/0197; H10D 62/121; H10D 84/851; H10D 84/852; H10D 84/832; H10D 84/833; H10D 84/0158; H10D 84/0193; H10D 84/834; H10D 84/853; H10D 86/011; H10D 86/215; H10D 30/0241; H10D 30/0243; H10D 30/6211; H10D 30/6212; H10D 30/6213;
(Continued)

(56) References Cited

U.S. PATENT DOCUMENTS

2015/0243544 A1* 8/2015 Alptekin ........... H01L 21/28008 438/586
2016/0365426 A1* 12/2016 Ching .................... H10D 30/62
(Continued)

*Primary Examiner* — Younes Boulghassoul
(74) *Attorney, Agent, or Firm* — Harrity & Harrity, LLP

(57) ABSTRACT

Some implementations described herein provide techniques and semiconductor devices in which a dielectric region is included in a nanostructure transistor. The dielectric region, which may correspond to an air gap, may be located between dielectric spacer layers located along a sidewall of a metal gate structure. Techniques to form the dielectric region may include using a temporary spacer layer between the dielectric spacer layers during manufacturing of the nanostructure transistor. The temporary spacer layer may include a silicon germanium material having a reaction mechanism that allows the temporary spacer layer to be selectively removed without causing damage to the dielectric spacer layers, the metal gate structure, or other portions of the nanostructure transistor.

20 Claims, 33 Drawing Sheets

(51) Int. Cl.

| | |
|---|---|
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10P 14/20*** | (2026.01) |

(52) U.S. Cl.

CPC ..... *H10D 30/6735* (2025.01); *H10D 30/6757* (2025.01); *H10D 62/118* (2025.01); *H10D 64/01326* (2026.01); *H10D 64/015* (2025.01); *H10D 64/017* (2025.01); *H10D 64/018* (2025.01); *H10D 64/021* (2025.01); *H10D 84/0147* (2025.01); *H10P 14/3452* (2026.01)

(58) Field of Classification Search

CPC ........... H10D 30/6215; H10D 30/6217; H10D 30/6218; H10D 62/115; H10D 62/116; H10D 64/687; H10D 64/679; H10D 84/0147; H10D 84/0184; H10D 64/021; H10D 64/015; H10D 64/018; H10D 30/024–0245; H10D 30/62–6219; H10D 30/43–435; H10D 30/501–509; H10D 30/019–0198; H10D 62/119–123; H10D 64/675; H10B 12/36; H10B 12/056; H01L 21/764; H01L 21/7682; H01L 2221/1042–1047

See application file for complete search history.

(56) References Cited

U.S. PATENT DOCUMENTS

| | | | | |
|---|---|---|---|---|
| 2018/0138280 | A1* | 5/2018 | Li | H01L 29/41775 |
| 2019/0296123 | A1* | 9/2019 | Lee | H01L 21/7682 |
| 2019/0334008 | A1* | 10/2019 | Chen | H10D 64/687 |
| 2020/0027959 | A1* | 1/2020 | Cheng | H01L 29/66469 |
| 2020/0035804 | A1* | 1/2020 | Chen | H01L 29/6653 |
| 2020/0219989 | A1* | 7/2020 | Cheng | H01L 29/66545 |
| 2020/0381531 | A1* | 12/2020 | Chung | H10D 30/014 |
| 2021/0036122 | A1* | 2/2021 | Wong | H01L 21/823814 |
| 2021/0098592 | A1* | 4/2021 | Kang | H10D 64/017 |
| 2021/0098598 | A1* | 4/2021 | Yang | H01L 21/31116 |
| 2021/0193817 | A1* | 6/2021 | Chen | H01L 21/76897 |
| 2021/0305246 | A1* | 9/2021 | Huang | H10D 30/024 |
| 2021/0375864 | A1 | 12/2021 | Chang et al. | |
| 2021/0376111 | A1* | 12/2021 | Chuang | H10D 84/038 |
| 2021/0376114 | A1* | 12/2021 | Hsiao | H10D 30/024 |
| 2022/0028999 | A1* | 1/2022 | Chang | H10D 64/017 |
| 2022/0140115 | A1 | 5/2022 | Chu et al. | |
| 2022/0238689 | A1* | 7/2022 | Yoon | H01L 29/42392 |
| 2022/0328647 | A1* | 10/2022 | Liu | H10D 64/018 |

* cited by examiner 500
510
340
210
345
320
315
310
215
405
205
200
A
345a
345b 800
200
705
A
B
C
805
620
610
615
605
210
405
215
205
345
710
715
725
310
245
220
340
315
510
X
Y
Z 900
200
A
A
B
B
C
C
705
805
620
615
610
235
605
225
230
210
405
215
345
205
Z
X
Y
220
715
710
725
245
310
510

1105

1105

1100

METHOD OF FORMING A SEMICONDUCTOR DEVICE HAVING GATE SPACERS WITH REGIONS OF DIFFUSED SILICON GERMANIUM

BACKGROUND

As semiconductor device manufacturing advances and technology processing nodes decrease in size, transistors may become affected by short channel effects (SCEs) such as hot carrier degradation, barrier lowering, and quantum confinement, among other examples. In addition, as the gate length of a transistor is reduced for smaller technology nodes, source/drain (S/D) electron tunneling increases, which increases the off current for a transistor (the current that flows through the channel of the transistor when the transistor is in an off configuration). Silicon (Si)/silicon germanium (SiGe) nanostructure transistors such as nanowires, nanosheets, and gate-all-around (GAA) devices are potential candidates to overcome short channel effects at smaller technology nodes. Nanostructure transistors are efficient structures that may experience reduced SCEs and enhanced carrier mobility relative to other types of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
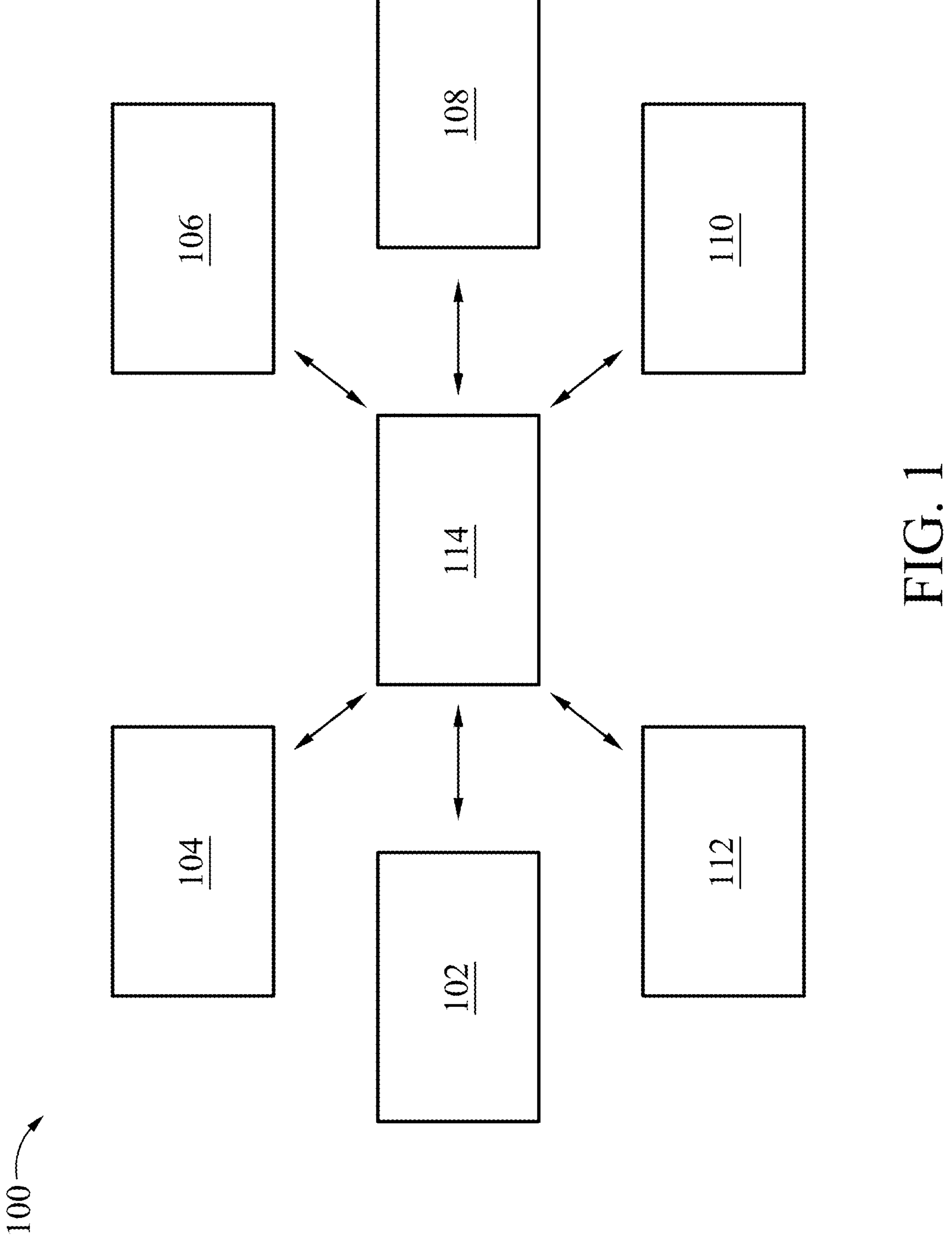
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, reducing geometric and dimensional properties of a fin field-effect transistor (finFET) may decrease a performance of the finFET. As an example, a likelihood of short channel effects such as drain-induced barrier lowering in a finFET may increase as finFET technology processing nodes decrease. Additionally or alternatively, a likelihood of electron tunneling and leakage in a finFET may increase as a gate length of the finFET decreases.

Nanostructure transistors (e.g., nanowire transistors, nanosheet transistors, gate-all-around (GAA) transistors, multi-bridge channel transistors, nanoribbon transistors, and/or other types of nanostructure transistors) may overcome one or more of the above-described drawbacks of finFETs. However, nanostructure transistors face fabrication challenges that can cause performance issues and/or device failures.

For example, in some cases, a nanostructure transistor may include one or more air gaps (e.g., regions of a dielectric gas) to improve a performance of the nanostructure transistor. For example, the nanostructure transistor may include dielectric spacer layers along a sidewall of a metal gate structure. The dielectric spacer layers may be separated by an air gap to improve a parasitic performance of the nanostructure transistor.

Manufacturing the nanostructure transistor may include depositing a sacrificial silicon dioxide ($SiO_2$) spacer layer between the dielectric spacer layers and removing the $SiO_2$ spacer layer to form the air gap. Due to a similarity of activation energies amongst the $SiO_2$ spacer layer, the dielectric spacer layers, and inter-layer dielectric materials that may be included in the nanostructure transistor, complications may arise during removal (e.g., etching) of the $SiO_2$ spacer layer. For example, an additional masking layer (e.g., a hard masking layer or a helmet layer) may be required to protect the inter-layer dielectric materials during removal of the $SiO_2$ spacer layer. Additionally, or alternatively, damage to the dielectric spacer layers or a metal gate structure of the transistor may occur.

Some implementations described herein provide techniques and semiconductor devices in which a dielectric region is included in a nanostructure transistor. The dielectric region, which may correspond to an air gap, may be located between dielectric spacer layers located along a sidewall of a metal gate structure. Techniques to form the dielectric region may include using a temporary spacer layer between the dielectric spacer layers during manufacturing of the nanostructure transistor. The temporary spacer layer may include a silicon germanium (SiGe) material having a reaction mechanism that allows the temporary spacer layer to be selectively removed without causing damage to the dielectric spacer layers, the metal gate structure, or other portions of the nanostructure transistor.

Using the SiGe material may simplify manufacturing and reduce a cost of semiconductor product including the dielectric region. Furthermore, use of the SiGe material may reduce a likelihood of damage to the dielectric spacer layers, the metal gate structure, or other portions of the nanostructure transistor. In this way, a yield of semiconductor product including the dielectric region may be increased.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (WEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, and as described in connection with FIGS. 2-15 and elsewhere herein, the semiconductor processing tools 102-114 may perform a method. The method may include forming, over a semiconductor substrate, a plurality of nanostructure layers in a direction that is perpendicular to the semiconductor substrate. In some implementations, the plurality of nanostructure layers includes a plurality of sacrificial layers alternating with a plurality of channel layers. The method may include forming, over the plurality of nanostructure layers, a dummy gate structure and forming, along a sidewall of the dummy gate structure, a first spacer layer including a first nitride material. The method may include forming, on the first spacer layer, a second spacer layer including a silicon germanium material and forming, on the second spacer layer, a third spacer layer including a second nitride material. The method may include removing the dummy gate structure, removing the plurality of sacrificial layers, and forming a metal gate structure. In some implementations, forming the metal gate structure includes forming a first portion in place of the dummy gate structure and forming a second portion that wraps around a plurality of nanostructure channels formed from the plurality of channel layers. The method may include removing the second spacer layer to form, between the first spacer layer and the third spacer layer, a dielectric region. In some implementations, the dielectric region includes air.

Additionally, or alternatively, the semiconductor processing tools 102-114 may perform another method. The method may include forming, over a semiconductor substrate, a plurality of nanostructure layers in a direction that is perpendicular to the semiconductor substrate. In some implementations, the plurality of nanostructure layers includes a plurality of sacrificial layers alternating with a plurality of channel layers. The method may include forming, over the plurality of nanostructure layers, a dummy gate structure and forming, along a sidewall of the dummy gate structure, a first spacer layer including a first material. The method may include forming, on the first spacer layer, a second spacer layer including a second material and forming, on the second spacer layer, a third spacer layer including a third material. The method may include removing the dummy gate structure and removing the plurality of sacrificial layers. The method may include forming a metal gate structure. In some implementations, forming the metal gate structure includes forming a first portion in place of the dummy gate structure and forming a second portion that wraps around a plurality of nanostructure channels formed from the plurality of channel layers. The method may include removing the second spacer layer to form, between the first spacer layer and the third spacer layer, a dielectric region. In some implementations, removing the second spacer layer includes using a gaseous mixture that has an accelerated reaction with the second material, relative to the first material and the third material, to perform an etch-selectivity operation that removes the second spacer layer from between the first spacer layer and the third spacer layer to form the dielectric region.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
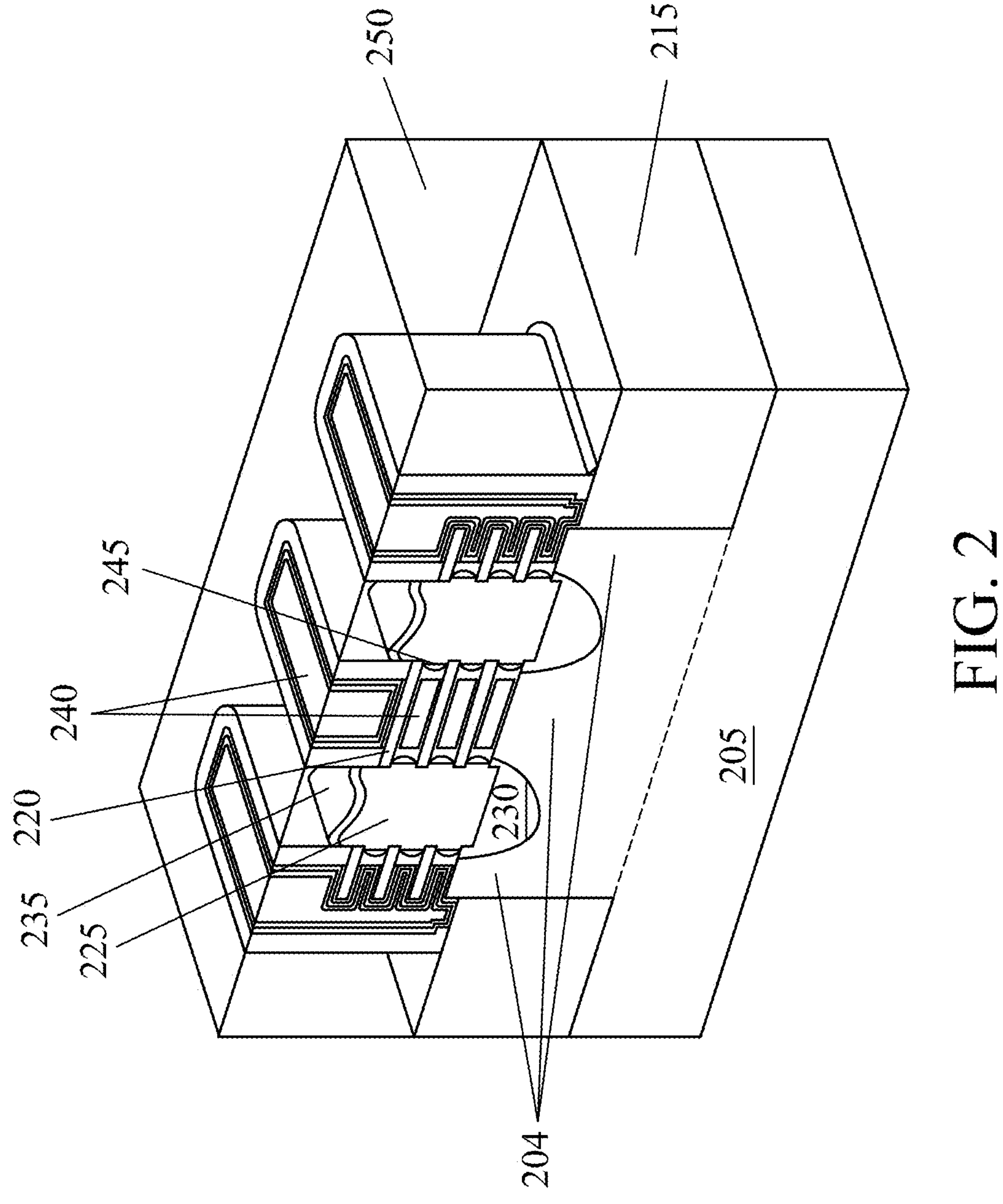
FIG. 2 is a diagram of an example semiconductor device described herein.

FIG. 2 is a diagram of an example semiconductor device 200 described herein. The semiconductor device 200 includes one or more transistors. The one or more transistors may include nanostructure transistor(s) such as nanowire transistors, nanosheet transistors, gate-all-around (GAA) transistors, multi-bridge channel transistors, nanoribbon transistors, and/or other types of nanostructure transistors. The semiconductor device 200 may include one or more additional devices, structures, and/or layers not shown in FIG. 2. For example, the semiconductor device 200 may include additional layers and/or dies formed on layers above and/or below the portion of the semiconductor device 200 shown in FIG. 2. Additionally, or alternatively, one or more additional semiconductor structures and/or semiconductor devices may be formed in a same layer of an electronic device or integrated circuit (IC) that includes the semiconductor device as the semiconductor device 200 shown in FIG. 2. FIGS. 3A-10D are schematic cross-sectional views of various portions of the semiconductor device 200 illustrated in FIG. 2, and correspond to various processing stages of forming nanostructure transistors of the semiconductor device 200.

The semiconductor device 200 includes a semiconductor substrate 205. The semiconductor substrate 205 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate. The semiconductor substrate 205 may include various layers, including conductive or insulating layers formed on a semiconductor substrate. The semiconductor substrate 205 may include a compound semiconductor and/or an alloy semiconductor. The semiconductor substrate 205 may include various doping configurations to satisfy one or more design parameters. For example, different doping profiles (e.g., n-wells, p-wells) may be formed on the semiconductor substrate 205 in regions designed for different device types (e.g., p-type metal-oxide semiconductor (PMOS) nanostructure transistors, n-type metal-oxide semiconductor (NMOS) nanostructure transistors). The suitable doping may include ion implantation of dopants and/or diffusion processes. Further, the semiconductor substrate 205 may include an epitaxial layer (epi-layer), may be strained for performance enhancement, and/or may have other suitable enhancement features. The semiconductor substrate 205 may include a portion of a semiconductor wafer on which other semiconductor devices are formed.

Mesa regions 210 are included above (and/or extend above) the semiconductor substrate 205. A mesa region 210 provides a structure on which nanostructures of the semiconductor device 200 are formed, such as nanostructure channels, nanostructure gate portions that wrap around each of the nanostructure channels, and/or sacrificial nanostructures, among other examples. In some implementations, one or more mesa regions 210 are formed in and/or from a fin structure (e.g., a silicon fin structure) that is formed in the semiconductor substrate 205. The mesa regions 210 may include the same material as the semiconductor substrate 205 and are formed from the semiconductor substrate 205. In some implementations, the mesa regions 210 are doped to form different types of nanostructure transistors, such as p-type nanostructure transistors and/or n-type nanostructure transistors. In some implementations, the mesa regions 210 include silicon (Si) materials or another elementary semiconductor material such as germanium (Ge). In some implementations, the mesa regions 210 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof.

The mesa regions 210 are fabricated by suitable semiconductor process techniques, such as masking, photolithography, and/or etch processes, among other examples. As an example, fin structures may be formed by etching a portion of the semiconductor substrate 205 away to form recesses in the semiconductor substrate 205. The recesses may then be filled with isolating material that is recessed or etched back to form shallow trench isolation (STI) regions 215 above the semiconductor substrate 205 and between the fin structures. Source/drain recesses may be formed in the fin structures, which results in formation of the mesa regions 210 between the source/drain recesses. However, other fabrication techniques for the STI regions 215 and/or for the mesa regions 210 may be used.

The STI regions 215 may electrically isolate adjacent fin structures 204 and may provide a layer on which other layers and/or structures of the semiconductor device 200 are formed. The STI regions 215 may include a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. The STI regions 215 may include a multi-layer structure, for example, having one or more liner layers.

The semiconductor device 200 includes a plurality of nanostructure channels 220 that extend between, and are electrically coupled with, source/drain regions 225. The nanostructure channels 220 are arranged in a direction that is approximately perpendicular to the semiconductor substrate 205. In other words, the nanostructure channels 220 are vertically arranged or stacked above the semiconductor substrate 205.

The nanostructure channels 220 include silicon-based nanostructures (e.g., nanosheets or nanowires, among other examples) that function as the semiconductive channels of the nanostructure transistor(s) of the semiconductor device 200. In some implementations, the nanostructure channels 220 may include silicon germanium (SiGe) or another silicon-based material. The source/drain regions 225 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the semiconductor device 200 may include p-type metal-oxide semiconductor (PMOS) nanostructure transistors that include p-type source/drain regions 225, n-type metal-oxide semiconductor (NMOS) nanostructure transistors that include n-type source/drain regions 225, and/or other types of nanostructure transistors.

In some implementations, a buffer region 230 is included under a source/drain region 225 between the source/drain region 225 and a fin structure above the semiconductor substrate 205. A buffer region 230 may provide isolation between a source/drain region 225 and adjacent mesa regions 210. A buffer region 230 may be included to reduce, minimize, and/or prevent electrons from traversing into the mesa regions 210 (e.g., instead of through the nanostructure channels 220, thereby reducing current leakage), and/or may be included to reduce, minimize and/or prevent dopants from the source/drain region 225 into the mesa regions 210 (which reduces short channel effects).

A capping layer 235 may be included over and/or on the source/drain region 225. The capping layer 235 may include silicon, silicon germanium, doped silicon, doped silicon germanium, and/or another material. The capping layer 235 may be included to reduce dopant diffusion and to protect the source/drain regions 225 in semiconductor processing operations for the semiconductor device 200 prior to contact formation. Moreover, the capping layer 235 may contribute to metal-semiconductor (e.g., silicide) alloy formation.

At least a subset of the nanostructure channels 220 extend through one or more gate structures 240. The gate structures 240 may be formed of one or more metal materials, one or more high dielectric constant (high-k) materials, and/or one or more other types of materials. In some implementations, dummy gate structures (e.g., polysilicon (PO) gate structures or another type of gate structures) are formed in the place of (e.g., prior to formation of) the gate structures 240 so that one or more other layers and/or structures of the semiconductor device 200 may be formed prior to formation of the gate structures 240. This reduces and/or prevents damage to the gate structures 240 that would otherwise be caused by the formation of the one or more layers and/or structures. A replacement gate process (RGP) is then performed to remove the dummy gate structures and replace the dummy gate structures with the gate structures 240 (e.g., replacement gate structures).

As further shown in FIG. 2, portions of a gate structure 240 are formed in between pairs of nanostructure channels 220 in an alternating vertical arrangement. In other words, the semiconductor device 200 includes one or more vertical stacks of alternating nanostructure channels 220 and portions of a gate structure 240, as shown in FIG. 2. In this way, a gate structure 240 wraps around an associated nanostructure channel 220 on all sides of the nanostructure channel 220 which increases control of the nanostructure channel 220, increases drive current for the nanostructure transistor(s) of the semiconductor device 200, and reduces short channel effects (SCEs) for the nanostructure transistor(s) of the semiconductor device 200.

Some source/drain regions 225 and gate structures 240 may be shared between two or more nanoscale transistors of the semiconductor device 200. In these implementations, one or more source/drain regions 225 and a gate structure 240 may be connected or coupled to a plurality of nanostructure channels 220, as shown in the example in FIG. 2. This enables the plurality of nanostructure channels 220 to be controlled by a single gate structure 240 and a pair of source/drain regions 225.

Inner spacers (InSP) 245 may be included between a source/drain region 225 and an adjacent gate structure 240. In particular, inner spacers 245 may be included between a source/drain region 225 and portions of a gate structure 240 that wrap around a plurality of nanostructure channels 220. The inner spacers 245 are included on ends of the portions of the gate structure 240 that wrap around the plurality of nanostructure channels 220. The inner spacers 245 are included in cavities that are formed in between end portions of adjacent nanostructure channels 220. The inner spacer 245 are included to reduce parasitic capacitance and to protect the source/drain regions 225 from being etched in a nanosheet release operation to remove sacrificial nanosheets between the nanostructure channels 220. The inner spacers 245 include a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material.

In some implementations, the semiconductor device 200 includes hybrid fin structures (not shown). The hybrid fin structures may also be referred to as dummy fins, H-fins, or non-active fins, among other examples. Hybrid fin structures may be included between adjacent source/drain regions 225, between portions of a gate structure 240, and/or between adjacent stacks of nanostructure channels 220, among other examples. The hybrid fins extend in a direction that is approximately perpendicular to the gate structures 240.

Hybrid fin structures are configured to provide electrical isolation between two or more structures and/or components included in the semiconductor device 200. In some implementations, a hybrid fin structure is configured to provide electrical isolation between two or more stacks of nanostructure channels 220. In some implementations, a hybrid fin structure is configured to provide electrical isolation between two or more source/drain regions 225. In some implementations, a hybrid fin structure is configured to provide electrical isolation between two or more gates structures or two or more portions of a gate structure. In some implementations, a hybrid fin structure is configured to provide electrical isolation between a source/drain region 225 and a gate structure 240.

A hybrid fin structure may include a plurality of types of dielectric materials. A hybrid fin structure may include a combination of one or more low dielectric constant (low-k) dielectric materials (e.g., a silicon oxide ($SiO_x$) and/or a silicon nitride ($Si_xN_y$), among other examples) and one or more high dielectric constant (high-k) dielectric materials (e.g., a hafnium oxide ($HfO_x$) and/or other high-k dielectric material).

The semiconductor device 200 may also include an interlayer dielectric (ILD) layer 250 above the STI regions 215. The ILD layer 250 may be referred to as an ILDO layer. The ILD layer 250 surrounds the gate structures 240 to provide electrical isolation and/or insulation between the gate structures 240 and/or the source/drain regions 225, among other examples. Conductive structures such as contacts and/or interconnects may be formed through the ILD layer 250 to the source/drain regions 225 and the gate structures 240 to provide control of the source/drain regions 225 and the gate structures 240.

In some implementations, and as described in connection with FIGS. 3A-15 and elsewhere herein, the semiconductor device 200 may include a plurality of nanostructure channels 220 over a semiconductor substrate 205. In some implementations, the plurality of nanostructure channels 220 are arranged in a direction that is perpendicular to the semiconductor substrate 205. The semiconductor device 200 may further include a gate structure 240 including a first portion over the plurality of nanostructure channels 220 and a second portion wrapping around each of the plurality of nanostructure channels 220. The semiconductor device 200 may include a portion of a first spacer layer, including a first region of diffused silicon germanium, along a sidewall of the first portion of the gate structure 240. The semiconductor device 200 may include a portion of a second spacer layer, including a second region of diffused silicon germanium, adjacent to the first spacer layer. The semiconductor device 200 may include a dielectric region including a portion between the portion of the first spacer layer and the portion of the second spacer layer. In some implementations, the dielectric region includes a dielectric gas.

As indicated above, FIG. 2 is provided as an example. Other examples may differ from what is described with regard to FIG. 2.

Figure 3A:
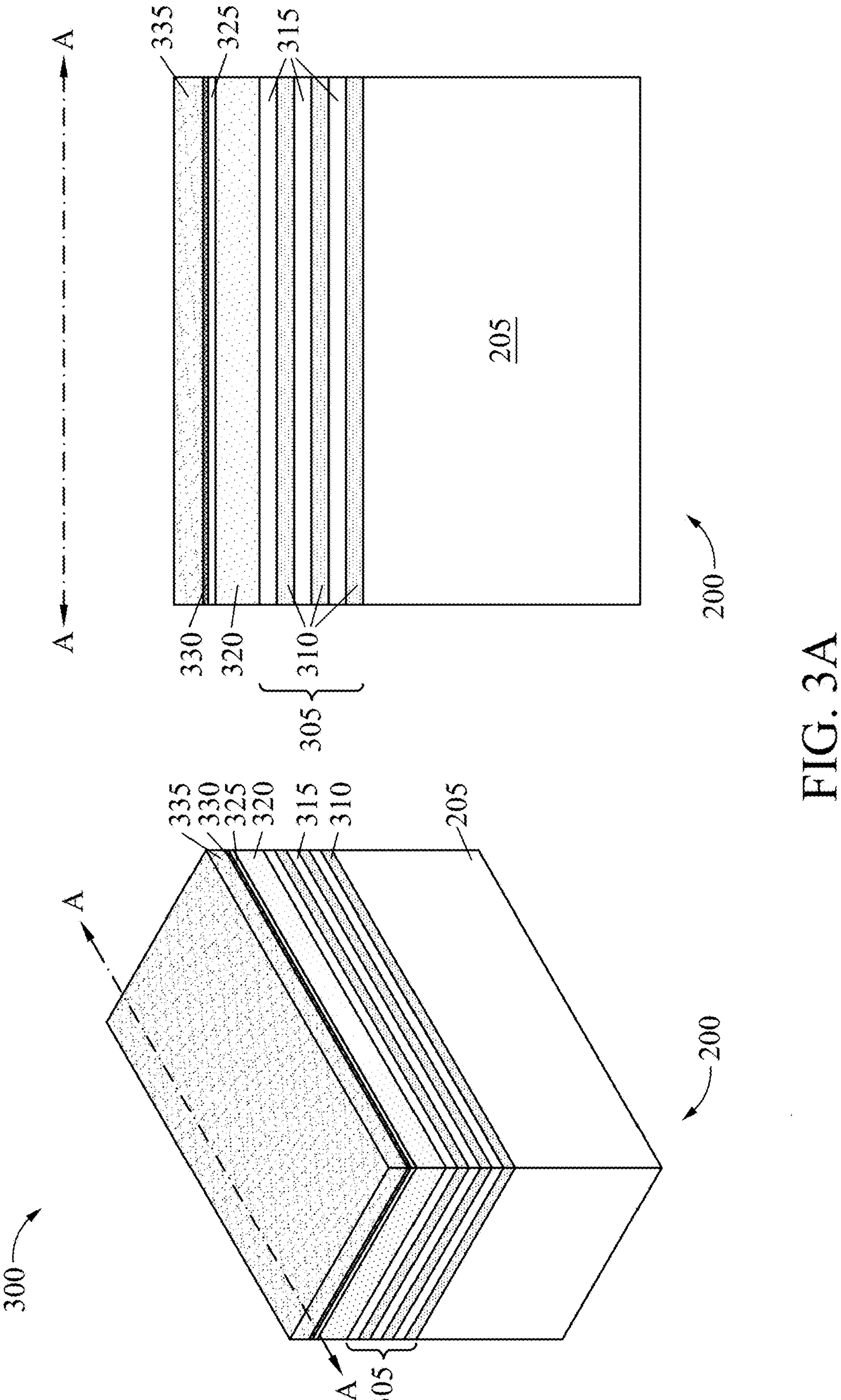
FIGS. 3A and 3B are diagrams of an example implementation of a fin formation process described herein.
Figure 3B:
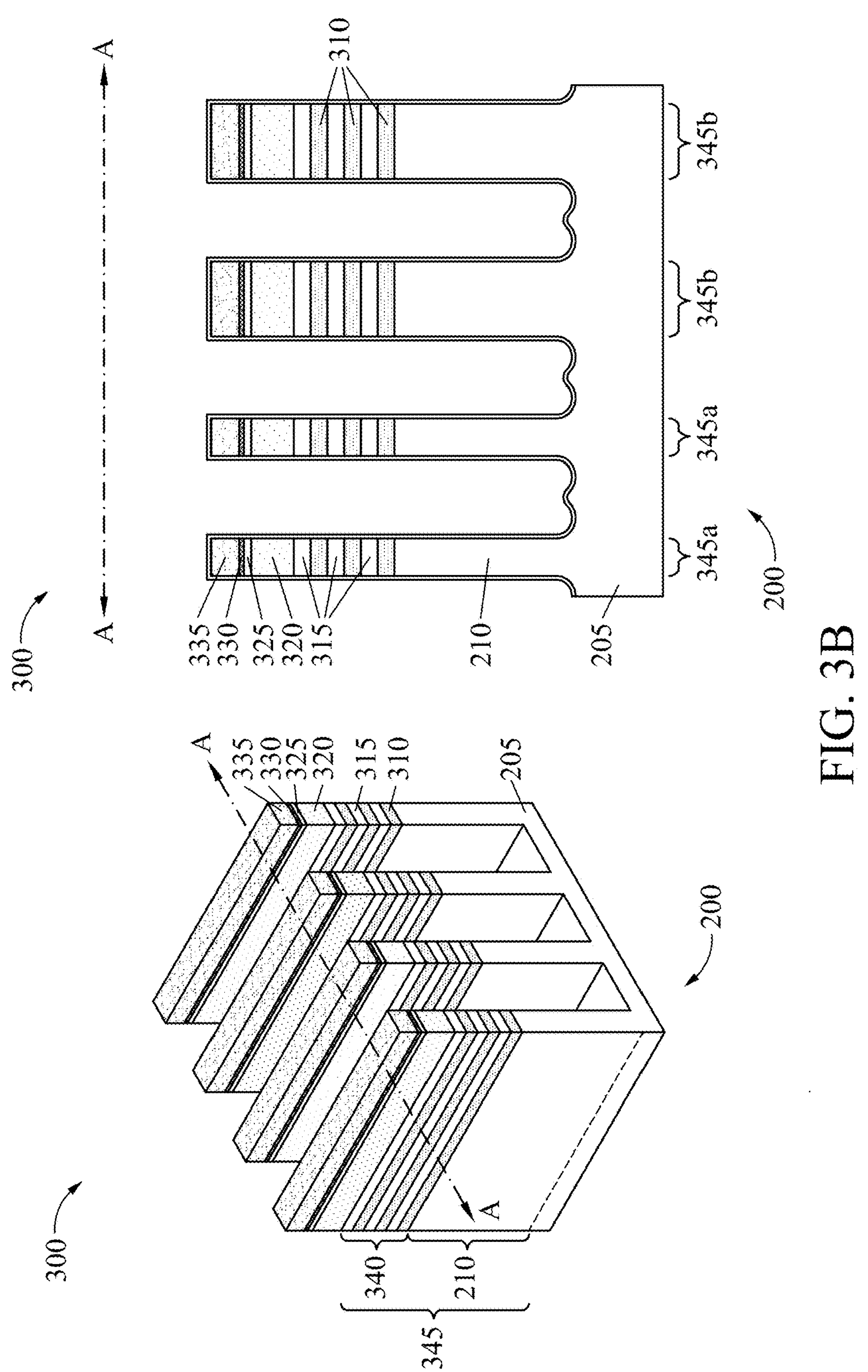

FIGS. 3A and 3B are diagrams of an example implementation 300 of a fin formation process described herein. The example implementation 300 includes an example of forming fin structures for the semiconductor device 200 or a portion thereof. The semiconductor device 200 may include one or more additional devices, structures, and/or layers not shown in FIGS. 3A and 3B. The semiconductor device 200 may include additional layers and/or dies formed on layers above and/or below the portion of the semiconductor device 200 shown in FIGS. 3A and 3B. Additionally, or alternatively, one or more additional semiconductor structures and/or semiconductor devices may be formed in a same layer of an electronic device that includes the semiconductor device 200.

FIG. 3A illustrates a perspective view of the semiconductor device 200 and a cross-sectional view along the line A-A in the perspective view. As shown in FIGS. 3A, processing of the semiconductor device 200 is performed in connection with the semiconductor substrate 205. A layer stack 305 is formed on the semiconductor substrate 205. The layer stack 305 may be referred to as a superlattice. In some implementations, one or more operations are performed in connection with the semiconductor substrate 205 prior to formation of the layer stack 305. For example, an anti-punch through (APT) implant operation may be performed. The APT implant operation may be performed in one or more regions of the semiconductor substrate 205 above which the nanostructure channels 220 are to be formed. The APT implant operation is performed, for example, to reduce and/or prevent punch-through or unwanted diffusion into the semiconductor substrate 205.

The layer stack 305 includes a plurality of alternating layers that are arranged in a direction that is approximately perpendicular to the semiconductor substrate 205. For example, the layer stack 305 includes vertically alternating layers of first layers 310 and second layers 315 above the semiconductor substrate 205. The quantity of the first layers 310 and the quantity of the second layers 315 illustrated in FIG. 3A are examples, and other quantities of the first layers 310 and the second layers 315 are within the scope of the present disclosure. In some implementations, the first layers 310 and the second layers 315 are formed to different thicknesses. For example, the second layers 315 may be formed to a thickness that is greater relative to a thickness of the first layers 310. In some implementations, the first layers 310 (or a subset thereof) are formed to a thickness in a range of approximately 4 nanometers to approximately 7 nanometers. In some implementations, the second layers 315 (or a subset thereof) are formed to a thickness in a range of approximately 8 nanometers to approximately 12 nanometers. However, other values for the thickness of the first layers 310 and for the thickness of the second layers 315 are within the scope of the present disclosure.

The first layers 310 include a first material composition, and the second layers 315 include a second material composition. In some implementations, the first material composition and the second material composition are the same material composition. In some implementations, the first material composition and the second material composition are different material compositions. As an example, the first layers 310 may include silicon germanium (SiGe) and the second layers 315 may include silicon (Si). In some implementations, the first material composition and the second material composition have different oxidation rates and/or etch selectivity.

As described herein, the second layers 315 may be processed to form the nanostructure channel 220 for subsequently-formed nanostructure transistors of the semiconductor device 200. The first layers 310 are sacrificial nanostructures that are eventually removed and serve to define a vertical distance between adjacent nanostructure channels 220 for subsequently-formed gate structure 240 of the semiconductor device 200. Accordingly, the first layers 310 are referred to as sacrificial layers and the second layers 315 may be referred to as channel layers.

The deposition tool 102 deposits and/or grows the alternating layers of the layer stack 305 to include nanostructures (e.g., nanosheets) on the semiconductor substrate 205. For example, the deposition tool 102 grows the alternating layers by epitaxial growth. However, other processes may be used to form the alternating layers of the layer stack 305. Epitaxial growth of the alternating layers of the layer stack 305 may be performed by a molecular beam epitaxy (MBE) process, a metalorganic chemical vapor deposition (MOCVD) process, and/or another suitable epitaxial growth process. In some implementations, the epitaxially grown layers such as the second layers 315 include the same material as the material of the semiconductor substrate 205. In some implementations, the first layers 310 and/or the second layers 315 include a material that is different from the material of the semiconductor substrate 205. As described above, in some implementations, the first layers 310 include epitaxially grown silicon germanium (SiGe) layers and the second layers 315 include epitaxially grown silicon (Si) layers. Alternatively, the first layers 310 and/or the second layers 315 may include other materials such as germanium (Ge), a compound semiconductor material such as silicon carbide (SiC), gallium arsenide (GaAs), gallium phosphide (GaP), indium phosphide (InP), indium arsenide (IAs), indium antimonide (InSb), an alloy semiconductor such as silicon germanium (SiGe), gallium arsenide phosphide (GaAsP), aluminum indium arsenide (AlInAs), aluminum gallium arsenide (AlGaAs), indium gallium arsenide (InGaAs), gallium indium phosphide (GaInP), gallium indium arsenide phosphide (GaInAsP), and/or a combination thereof. The material(s) of the first layers 310 and/or the material(s) of the second layers 315 may be chosen based on providing different oxidation properties, different etching selectivity properties, and/or other different properties.

As further shown in FIG. 3A, the deposition tool 102 may form one or more additional layers over and/or on the layer stack 305. For example, a hard mask (HM) layer 320 may be formed over and/or on the layer stack 305 (e.g., on the top-most second layer 315 of the layer stack 305). As another example, a capping layer 325 may be formed over and/or on the hard mask layer 320. As another example, another hard mask layer including an oxide layer 330 and a nitride layer 335 may be formed over and/or on the capping layer 325. The one or more hard mask (HMI) layers 320, 325, and 330 may be used to form one or more structures of the semiconductor device 200. The oxide layer 330 may function as an adhesion layer between the layer stack 305 and the nitride layer 335, and may act as an etch stop layer for etching the nitride layer 335. The one or more hard mask layers 320, 325, and 330 may include silicon germanium (SiGe), a silicon nitride ($Si_xN_y$), a silicon oxide ($SiO_x$), and/or another material. The capping layer 325 may include silicon (Si) and/or another material. In some implementations, the capping layer 325 is formed of the same material as the semiconductor substrate 205. In some implementations, the one or more additional layers are thermally grown, deposited by CVD, PVD, ALD, and/or are formed using another deposition technique.

FIG. 3B illustrates a perspective view of the semiconductor device 200 and a cross-sectional view along the line A-A. As shown in FIG. 3B, the layer stack 305 and the semiconductor substrate 205 are etched to remove portions of the layer stack 305 and portions of the semiconductor substrate 205. The portions 340 of the layer stack 305, and mesa portions (also referred to as silicon mesas 210), remaining after the etch operation are referred to a fin structures 345 above the semiconductor substrate 205 of the semiconductor device 200. A fin structure 345 includes a portion 340 of the layer stack 305 over and/or on a mesa region 210 formed in and/or above the semiconductor substrate 205. The fin structures 345 may be formed by any suitable semiconductor processing technique. For example, the deposition tool 102, the exposure tool 104, the developer tool 106, and/or the etch tool 108 may form the fin structures 345 using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fin structures.

In some implementations, the deposition tool 102 forms a photoresist layer over and/or on the hard mask layer including the oxide layer 330 and the nitride layer 335, the exposure tool 104 exposes the photoresist layer to radiation (e.g., deep ultraviolet (UV) radiation, extreme UV (EUV) radiation), a post-exposure bake process is performed (e.g., to remove residual solvents from the photoresist layer), and the developer tool 106 develops the photoresist layer to form a masking element (or pattern) in the photoresist layer. In some implementations, patterning the photoresist layer to form the masking element is performed using an electron beam (e-beam) lithography process. The masking element may then be used to protect portions of the semiconductor substrate 205 and portions the layer stack 305 in an etch operation such that the portions of the semiconductor substrate 205 and portions the layer stack 305 remain non-etched to form the fin structures 345. Unprotected portions of the substrate and unprotected portions of the layer stack 305 are etched (e.g., by the etch tool 108) to form trenches in the semiconductor substrate 205. The etch tool may etch the unprotected portions of the substrate and unprotected portions of the layer stack 305 using a dry etch technique (e.g., reactive ion etching), a wet etch technique, and/or a combination thereof.

In some implementations, another fin formation technique is used to form the fin structures 345. For example, a fin region may be defined (e.g., by mask or isolation regions), and the portions 340 may be epitaxially grown in the form of the fin structures 345. In some implementations, forming the fin structures 345 includes a trim process to decrease the width of the fin structures 345. The trim process may include wet and/or dry etching processes, among other examples.

As further shown in FIG. 3B, fin structures 345 may be formed for different types of nanostructure transistors for the semiconductor device 200. In particular, a first subset of fin structures 345*a* may be formed for p-type nanostructure transistors (e.g., p-type metal oxide semiconductor (PMOS) nanostructure transistors), and a second subset of fin structures 345*b* may be formed for n-type nanostructure transistors (e.g., n-type metal oxide semiconductor (NMOS) nanostructure transistors). The second subset of fin structures 345*b* may be doped with a p-type dopant (e.g., boron (B) and/or germanium (Ge), among other examples) and the first subset of fin structures 345*a* may be doped with an n-type dopant (e.g., phosphorous (P) and/or arsenic (As), among other examples). Additionally or alternatively, p-type source/drain regions 225 may be subsequently formed for the p-type nanostructure transistors that include the first subset of fin structures 345*a*, and n-type source/drain regions 225 may be subsequently formed for the n-type nanostructure transistors that include the second subset of fin structures 345*b*.

The first subset of fin structures 345*a* (e.g., PMOS fin structures) and the second subset of fin structures 345*b* (e.g., NMOS fin structures) may be formed to include similar properties and/or different properties. For example, the first subset of fin structures 345*a* may be formed to a first height and the second subset of fin structures 345*b* may be formed to a second height, where the first height and the second height are different heights. As another example, the first subset of fin structures 345*a* may be formed to a first width and the second subset of fin structures 345*b* may be formed to a second width, where the first width and the second width are different widths. In the example shown in FIG. 3B, the second width of the second subset of fin structures 345*b* (e.g., for the NMOS nanostructure transistors) is greater relative to the first width of the first subset of fin structures 345*b* (e.g., for the PMOS nanostructure transistors). However, other examples are within the scope of the present disclosure.

As indicated above, FIGS. 3A and 3B are provided as an example. Other examples may differ from what is described with regard to FIGS. 3A and 3B. Example implementation 300 may include additional operations, fewer operations, different operations, and/or a different order of operations than those described in connection with FIGS. 3A and 3B.

Figure 4A:
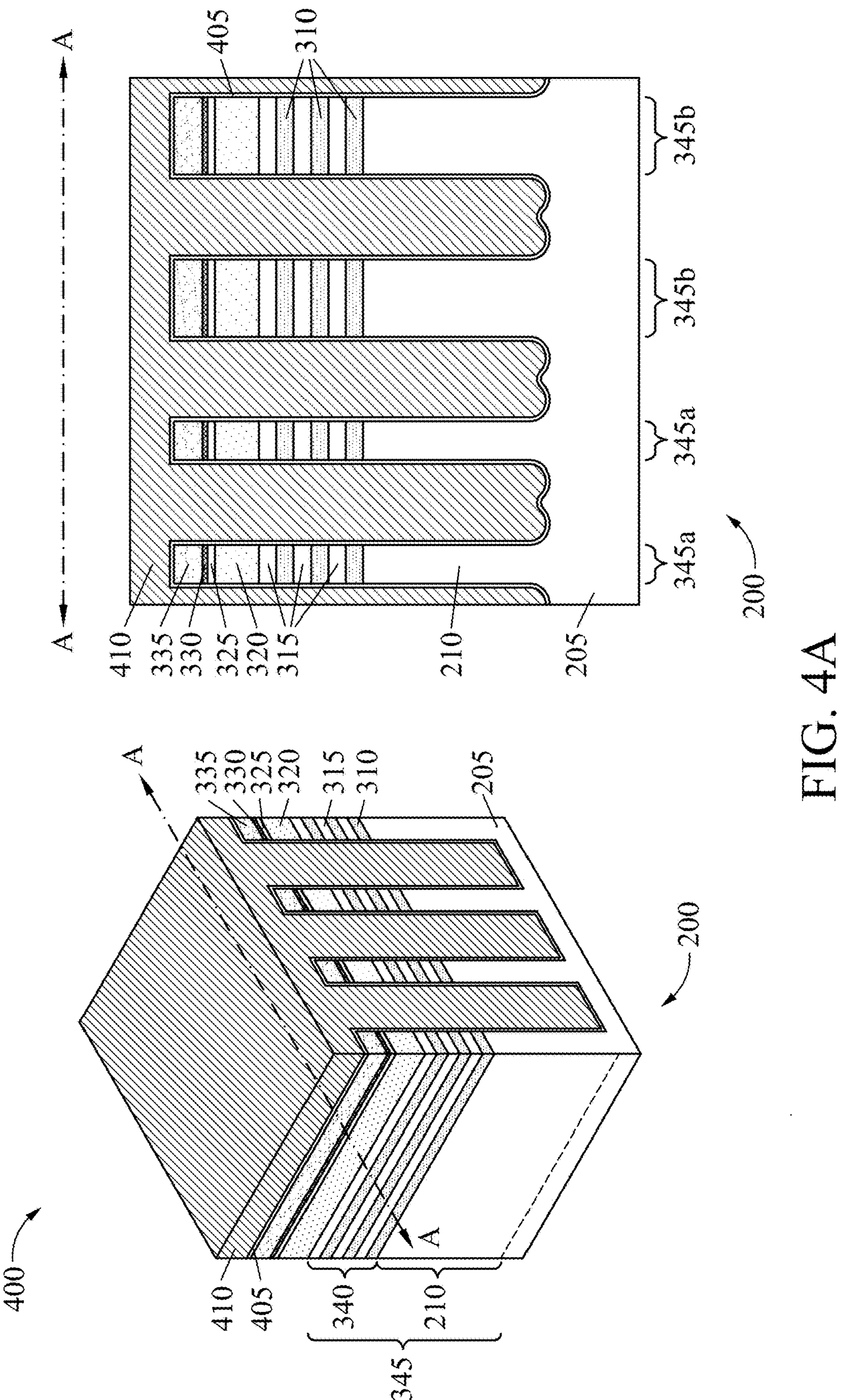
FIGS. 4A and 4B are diagrams of an example implementation of a shallow trench isolation (STI) process described herein.
Figure 4B:
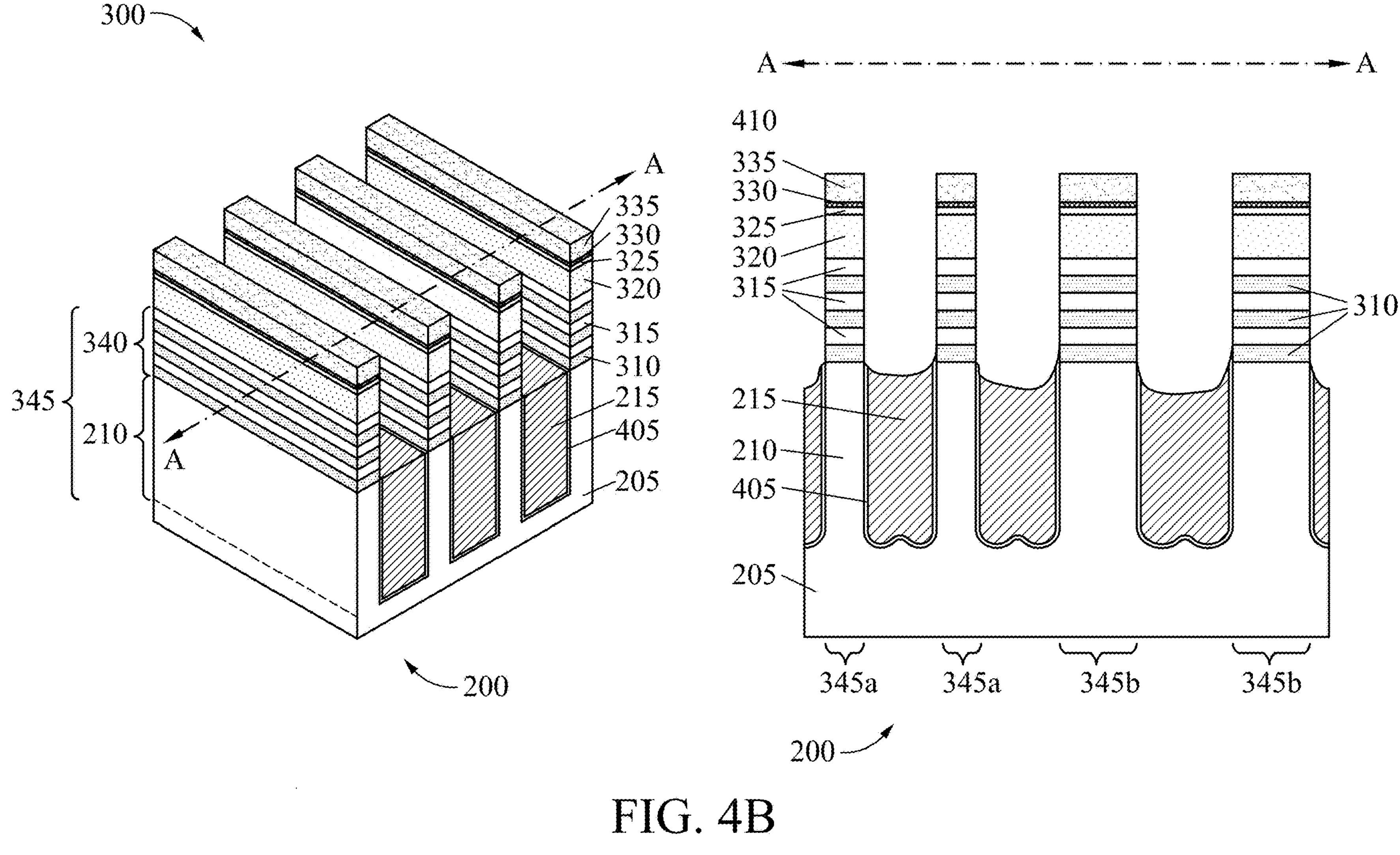

FIGS. 4A and 4B are diagrams of an example implementation 400 of an STI formation process described herein. The example implementation 400 includes an example of forming STI regions 215 between the fin structures 345 for the semiconductor device 200 or a portion thereof. The semiconductor device 200 may include one or more additional devices, structures, and/or layers not shown in FIGS. 4A and/or 4B. The semiconductor device 200 may include additional layers and/or dies formed on layers above and/or below the portion of the semiconductor device 200 shown in FIGS. 4A and 4B. Additionally, or alternatively, one or more additional semiconductor structures and/or semiconductor devices may be formed in a same layer of an electronic device that includes the semiconductor device 200. In some implementations, the operations described in connection with the example implementation 400 are performed after the processes described in connection with FIGS. 3A and 3B.

FIG. 4A illustrates a perspective view of the semiconductor device 200 and a cross-sectional view along the line A-A. As shown in FIG. 4A, a liner 405 and a dielectric layer 410 are formed above the semiconductor substrate 205 and interposing (e.g., in between) the fin structures 345. The deposition tool 102 may deposit the liner 405 and the dielectric layer 410 over the semiconductor substrate 205 and in the trenches between the fin structures 345. The deposition tool 102 may form the dielectric layer 410 such that a height of a top surface of the dielectric layer 410 and a height of a top surface of the nitride layer 335 are approximately a same height.

Alternatively, the deposition tool 102 may form the dielectric layer 410 such that the height of the top surface of the dielectric layer 410 is greater relative to the height of the top surface of the nitride layer 335, as shown in FIG. 4A. In this way, the trenches between the fin structures 345 are overfilled with the dielectric layer 410 to ensure the trenches are fully filled with the dielectric layer 410. Subsequently, the planarization tool 110 may perform a planarization or polishing operation (e.g., a CMP operation) to planarize the dielectric layer 410. The nitride layer 335 of the hard mask layer may function as a CMP stop layer in the operation. In other words, the planarization tool 110 planarizes the dielectric layer 410 until reaching the nitride layer 335 of the hard mask layer. Accordingly, a height of top surfaces of the dielectric layer 410 and a height of top surfaces of the nitride layer 335 are approximately equal after the operation.

The deposition tool 102 may deposit the liner 405 using a conformal deposition technique. The deposition tool 102 may deposit the dielectric layer using a CVD technique (e.g., a flowable CVD (FCVD) technique or another CVD technique), a PVD technique, an ALD technique, and/or another deposition technique. In some implementations, after deposition of the liner 405, the semiconductor device 200 is annealed, for example, to increase the quality of the liner 405.

The liner 405 and the dielectric layer 410 each includes a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. In some implementations, the dielectric layer 410 may include a multi-layer structure, for example, having one or more liner layers.

FIG. 4B illustrates a perspective view of the semiconductor device 200 and a cross-sectional view along the line A-A. As shown in FIG. 4B, an etch back operation is performed to remove portions of the liner 405 and portions of the dielectric layer 410 to form the STI regions 215. The etch tool 108 may etch the liner 405 and the dielectric layer 410 in the etch back operation to form the STI regions 215. The etch tool 108 etches the liner 405 and the dielectric layer 410 based on the hard mask layer (e.g., the hard mask layer including the oxide layer 330 and the nitride layer 335). The etch tool 108 etches the liner 405 and the dielectric layer 410 such that the height of the STI regions 215 are less than or approximately a same height as the bottom of the portions 340 of the layer stack 305. Accordingly, the portions 340 of the layer stack 305 extend above the STI regions 215. In some implementations, the liner 405 and the dielectric layer 410 are etched such that the heights of the STI regions 215 are less than heights of top surfaces of the mesa regions 210.

In some implementations, the etch tool 108 uses a plasma-based dry etch technique to etch the liner 405 and the dielectric layer 410. Ammonia ($NH_3$), hydrofluoric acid (HF), and/or another etchant may be used. The plasma-based dry etch technique may result in a reaction between the etchant(s) and the material of the liner 405 and the dielectric layer 410, including:

$$SiO_2+4HF \rightarrow SiF_4+2H_2O$$

where silicon dioxide ($SiO_2$) of the liner 405 and the dielectric layer 410 react with hydrofluoric acid to form byproducts including silicon tetrafluoride ($SiF_4$) and water ($H_2O$). The silicon tetrafluoride is further broken down by the hydrofluoric acid and ammonia to form an ammonium fluorosilicate ($(NH_4)_2SiF_6$) byproduct:

$$SiF_4+2HF+2NH_3 \rightarrow (NH_4)_2SiP_6$$

The ammonium fluorosilicate byproduct is removed from a processing chamber of the etch tool 108. After removal of the ammonium fluorosilicate, a post-process temperature in a range of approximately 200 degrees Celsius to approximately 250 degrees Celsius is used to sublimate the ammonium fluorosilicate into constituents of silicon tetrafluoride ammonia and hydrofluoric acid.

In some implementations, the etch tool 108 etches the liner 405 and the dielectric layer 410 such that a height of the STI regions 215 between the first subset of fin structures 345*a* (e.g., for the PMOS nanostructure transistors) is greater relative to a height of the STI regions 215 between the second subset of fin structures 345*b* (e.g., for the NMOS nanostructure transistors). This primarily occurs due to the greater width the fin structures 345*b* relative to the width of the fin structures 345*a*. Moreover, this results in a top surface of an STI region 215 between a fin structure 345*a* and a fin structure 345*b* being sloped or slanted (e.g., downward sloped from the fin structure 345*a* to the fin structure 345*b*, as shown in the example in FIG. 4A). The etchants used to etch the liner 405 and the dielectric layer 410 first experience physisorption (e.g., a physical bonding to the liner 405 and the dielectric layer 410) as a result of a Van der Waals force between the etchants and the surfaces of the liner 405 and the dielectric layer 410. The etchants become trapped by dipole movement force. The etchants then attach to dangling bonds of the liner 405 and the dielectric layer 410, and chemisorption begins. Here, the chemisorption of the etchant on the surface of the liner 405 and the dielectric layer 410 results in etching of the liner 405 and the dielectric layer 410. The greater width of the trenches between the second subset of fin structures 345*a* provides a greater surface area for chemisorption to occur, which results in a greater etch rate between the second subset of fin structures 345*b*. The greater etch rate results in the height of the STI regions 215 between the second subset of fin structures 345*b* being lesser relative to the height of the STI regions 215 between the first subset of fin structures 345*a*.

As indicated above, FIGS. 4A and 4B are provided as an example. Other examples may differ from what is described with regard to FIGS. 4A and 4B. Example implementation 400 may include additional operations, fewer operations, different operations, and/or a different order of operations than those described in connection with FIGS. 4A and 4B.

Figure 5A:
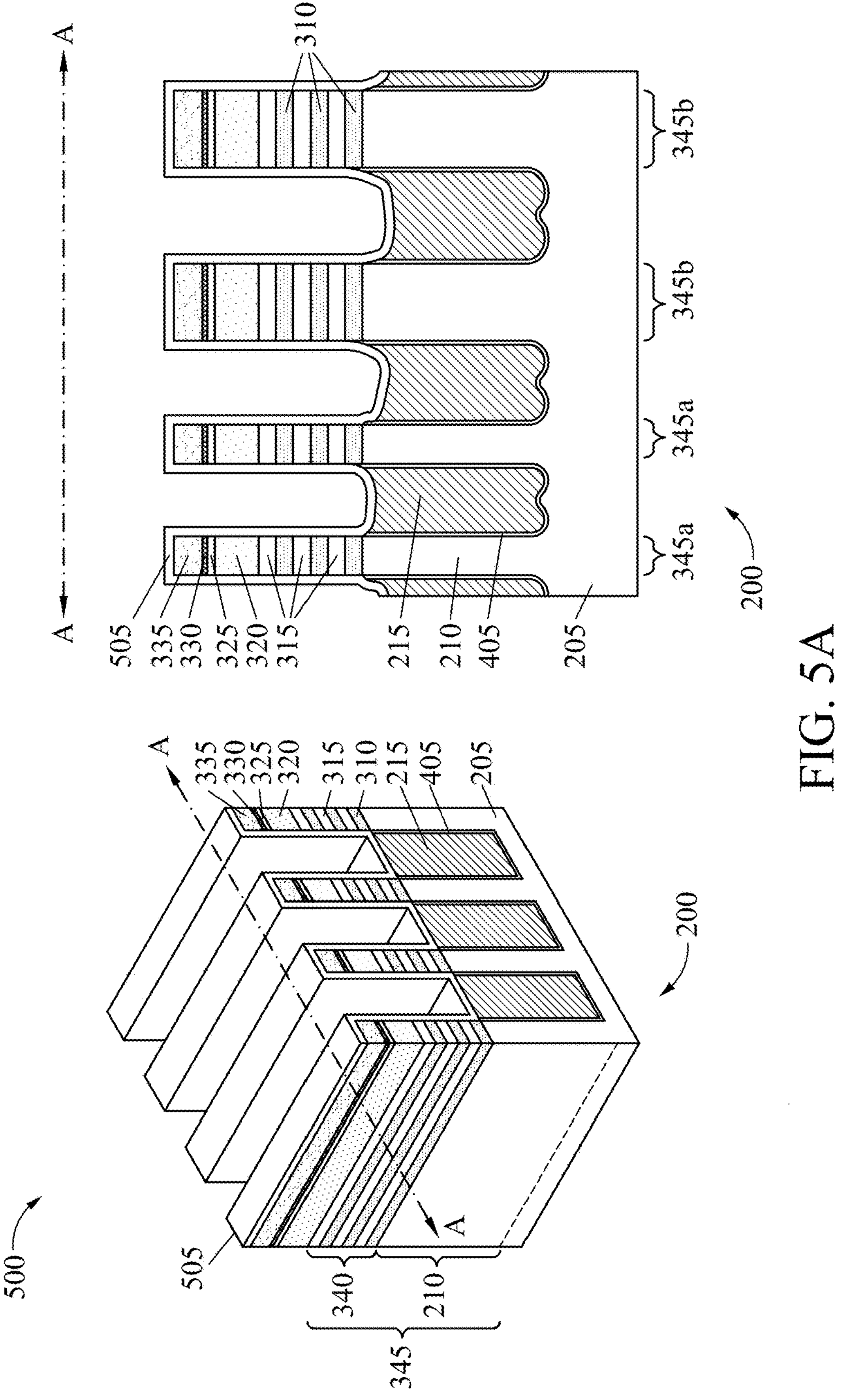
FIGS. 5A-5C are diagrams of an example implementation of a cladding sidewall formation process described herein.
Figure 5B:
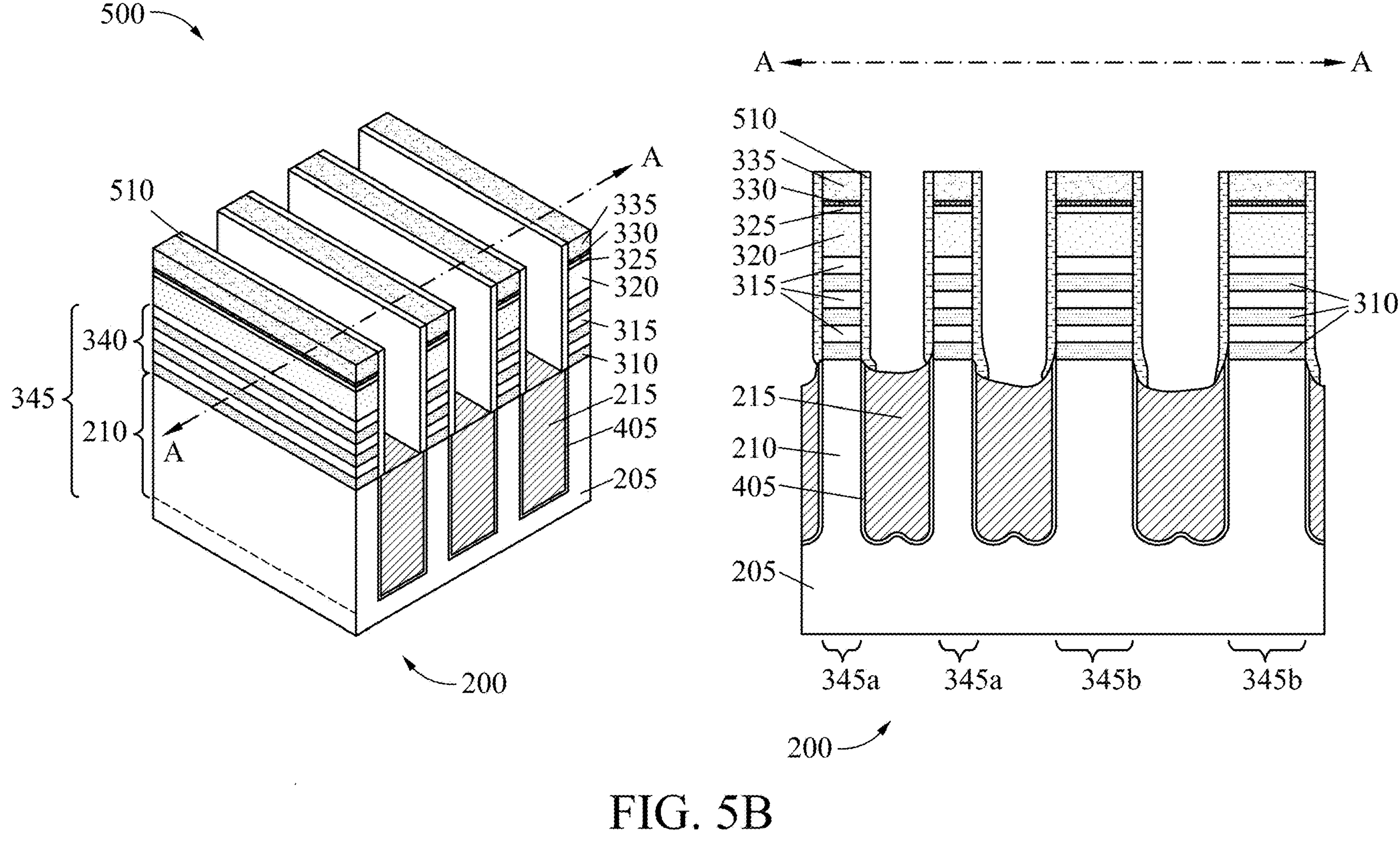
Figure 5C:
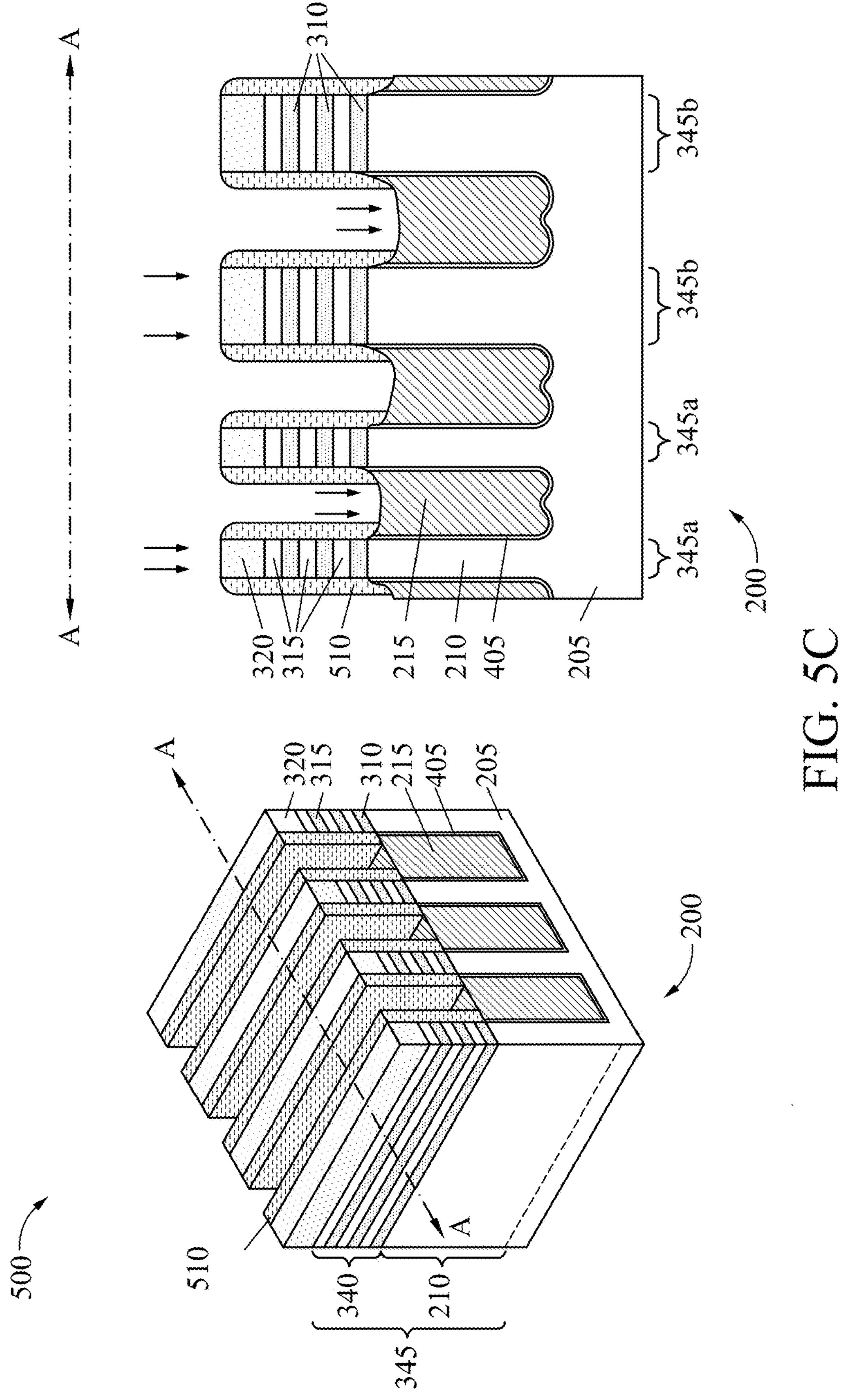

FIGS. 5A-5C are diagrams of an example implementation 500 of a cladding sidewall process described herein. The example implementation 400 includes an example of forming cladding sidewalls over sides of the portions 340 of the layer stacks 305 for the semiconductor device 200 or a portion thereof. The semiconductor device 200 may include one or more additional devices, structures, and/or layers not shown in FIGS. 5A-5C. The semiconductor device 200 may include additional layers and/or dies formed on layers above and/or below the portion of the semiconductor device 200 shown in FIGS. 5A-5C. Additionally, or alternatively, one or more additional semiconductor structures and/or semiconductor devices may be formed in a same layer of an electronic device that includes the semiconductor device 200. In some implementations, the operations described in connection with the example implementation 500 are performed after the processes described in connection with FIGS. 3A-4B.

FIG. 5A illustrates a perspective view of the semiconductor device 200 and a cross-sectional view along the line A-A. As shown in FIG. 5A, a cladding layer 505 is formed over the fin structures 345 (e.g., over the top surfaces and over the sidewalls of the fin structures 345) and over the STI regions 215 between the fin structures 345. The cladding layer 505 includes silicon germanium (Site) or another material. The cladding layer 505 may be formed of the same material as the first layers 310 to enable the cladding sidewalls (that are to be formed from the cladding layer 505) and the first layers 310 to be removed in the same etch operation (a nanostructure release operation) so that a replacement gate (e.g., a gate structure 240) may be formed in the areas occupied by the cladding sidewalls and the first layers 310. This enables the replacement gate to fully surround the nanostructure channels of the nanostructure transistors of the semiconductor device 200.

The deposition tool 102 may deposit the cladding layer 505. In some implementations, the deposition tool 102 deposits a seed layer (e.g., a silicon (Si) seed layer or another type of seed layer) over the fin structures 345 (e.g., over the top surfaces and over the sidewalls of the fin structures 345) and over the STI regions 215 between the fin structures 345. Then, the deposition tool 102 deposits SiGe on the seed layer to form the cladding layer 505. The seed layer promotes growth and adhesion of the cladding layer 505.

Deposition of the seed layer may include providing a silicon precursor to a processing chamber of the deposition tool 102 using a carrier gas such as nitrogen ($N_2$) or hydrogen ($H_2$), among other examples. In some implementations, a pre-clean operation is performed prior to deposition of the seed layer to reduce the formation of germanium oxide ($GeO_x$). The silicon precursor may include disilane ($Si_2H_6$) or another silicon precursor. The use of disilane may enable formation of a seed layer to a thickness that is in a range of approximately 0.5 nanometers to approximately 1.5 nanometers to provide sufficient cladding sidewall thickness while achieving a controllable and uniform thickness for the cladding layer 505. However, other ranges and values for the thickness of the seed layer are within the scope of the present disclosure.

Deposition of the seed layer may be performed at a temperature in a range of approximately 450 degrees Celsius to approximately 500 degrees Celsius (or at a temperature in another range), at a pressure in a range of approximately 30 torr to approximately 100 torr (or at a pressure in another range), and/or for a time duration in a range of approximately 100 seconds to approximately 300 seconds (or for a time duration in another range), among other examples.

Deposition of the SiGe of the cladding layer 505 may include forming the cladding layer 505 to include an amorphous texture to promote conformal deposition of the cladding layer 505. The SiGe may include a germanium content in a range of approximately 15% germanium to approximately 25% germanium. However, other values for the germanium content are within the scope of the present disclosure. Deposition of the cladding layer 505 may include providing a silicon precursor (e.g., disilane ($Si_2H_6$) or silicon tetrahydride ($SiH_4$), among other examples) and a germanium precursor (e.g., germanium tetrahydride ($GeH_4$) or another germanium precursor) to a processing chamber of the deposition tool 102 using a carrier gas such as nitrogen ($N_2$) or hydrogen ($H_2$), among other examples. Deposition of the cladding layer 505 may be performed at a temperature in a range of approximately 500 degrees Celsius to approximately 550 degrees Celsius (or at a temperature in another range) and/or at a pressure in a range of approximately 5 torr to approximately 20 torr (or at a pressure in another range).

FIG. 5B illustrates a perspective view of the semiconductor device 200 and a cross-sectional view along the line A-A. As shown in FIG. 5B, an etch back operation is performed to etch the cladding layer 505 to form cladding sidewalls 510. The etch tool 108 may etch the cladding layer 505 using a plasma-based dry etch technique or another etch technique. The etch tool 108 may perform the etch back operation to remove portions of the cladding layer 505 from the tops of the fin structures 345 and from the tops of the STI regions 215. Removal of the cladding layer 505 from the tops of the STI regions 215 between the fin structures 345 ensures that the cladding sidewalls 510 do not include a footing on the STI regions 215 between the fin structures 345. This ensures that the cladding sidewalls 510 do not include a footing under hybrid fin structures that are to be formed over the STI regions 215 between the fin structures 345.

In some implementations, the etch tool 108 uses a fluorine-based etchant to etch the cladding layer 505. The fluorine-based etchant may include sulfur hexafluoride ($SF_6$), fluoromethane ($CH_3F$), and/or another fluorine-based etchant Other reactants and/or carriers such as methane ($CH_4$), hydrogen (H2), argon (Ar), and/or helium (He) may be used in the etch back operation. In some implementations, the etch back operation is performed using a plasma bias in a range of approximately 500 volts to approximately 2000 volts. However, other values for the plasma bias are within the scope of the present disclosure. In some implementations, removing portions of the cladding layer 505 from the tops of the STI regions 215 includes performing a highly directional (e.g., anisotropic) etch to selectively remove (e.g., selectively etch) the cladding layer 505 on the tops of the STI regions 215 between the fin structures 345.

In some implementations, the cladding sidewalls 510 include asymmetric properties (e.g., different lengths, depths, and/or angles). The asymmetric properties may provide increased depth of gate structures 240 for different types of nanostructure transistors (e.g., for p-type nanostructure transistors, for n-type nanostructure transistors) while reducing and/or minimizing footing of the cladding sidewalls 510 (and thus, reducing and/or minimizing footing of the gate structures 240 that are formed in the areas that are occupied by the cladding sidewalls 510 after removal of the cladding sidewalls 510) on the STI region 215 under hybrid fin structures of the nanostructure transistors of the semiconductor device 200. The reduced and/or minimized footing further reduces a likelihood of electrical shorting and/or current leakage.

FIG. 5C illustrates a perspective view of the semiconductor device 200 and a cross-sectional view along the line A-A. As shown in FIG. 5C, the hard mask layer (including the oxide layer 330 and the nitride layer 335) and the capping layer 325 are removed to expose the hard mask layer 320. In some implementations, the capping layer 325, the oxide layer 330, and the nitride layer 335 are removed using an etch operation (e.g., performed by the etch tool 108), a planarization technique (e.g., performed by the planarization tool 110), and/or another semiconductor processing technique.

As indicated above, FIGS. 5A-5C are provided as an example. Other examples may differ from what is described with regard to FIGS. 5A-5C. Example implementation 500 may include additional operations, fewer operations, different operations, and/or a different order of operations than those described in connection with FIGS. 5A-5C.

Figure 6A:
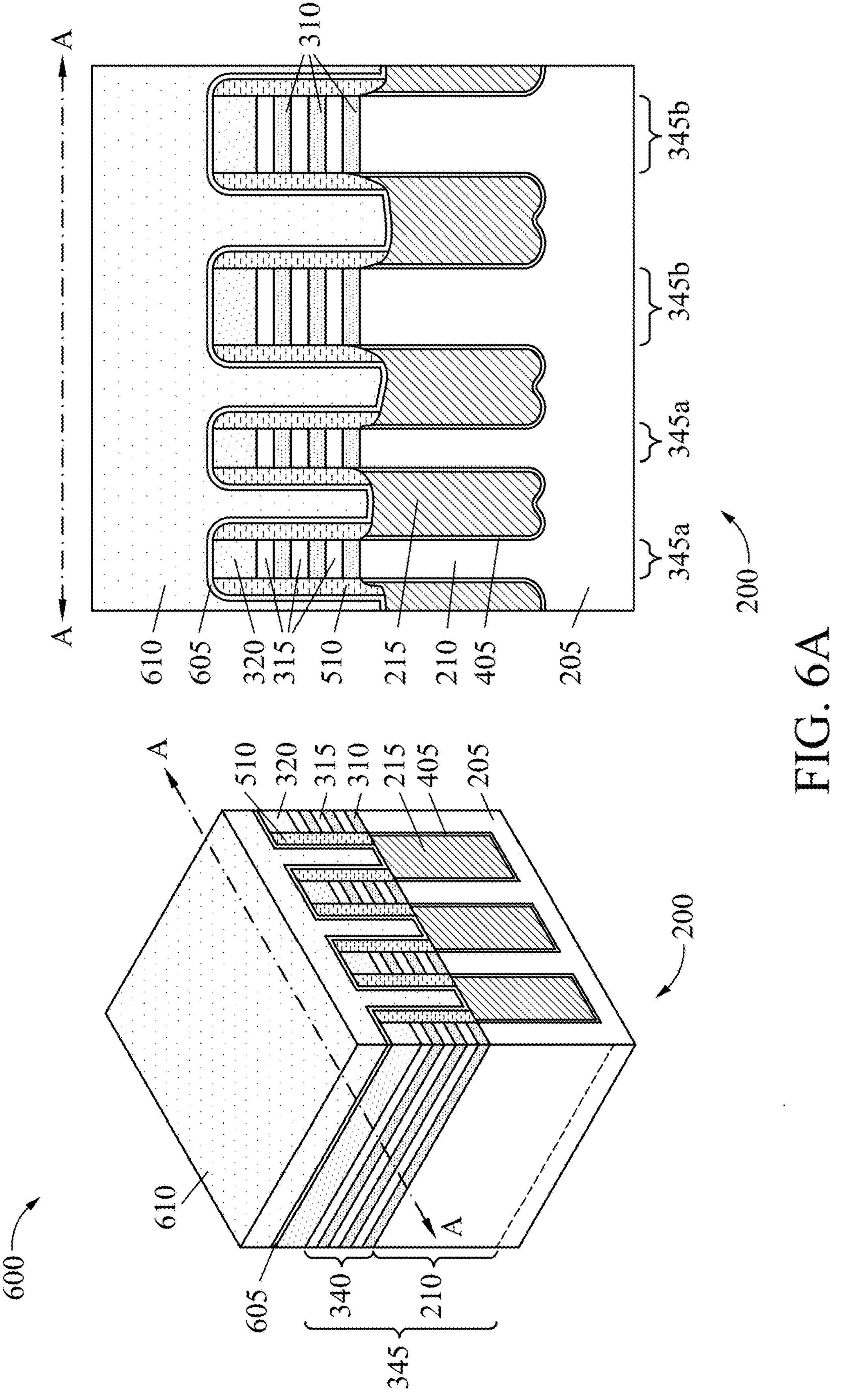
FIGS. 6A-6C are diagrams of an example implementation of a hybrid fin structure formation process described herein.
Figure 6B:
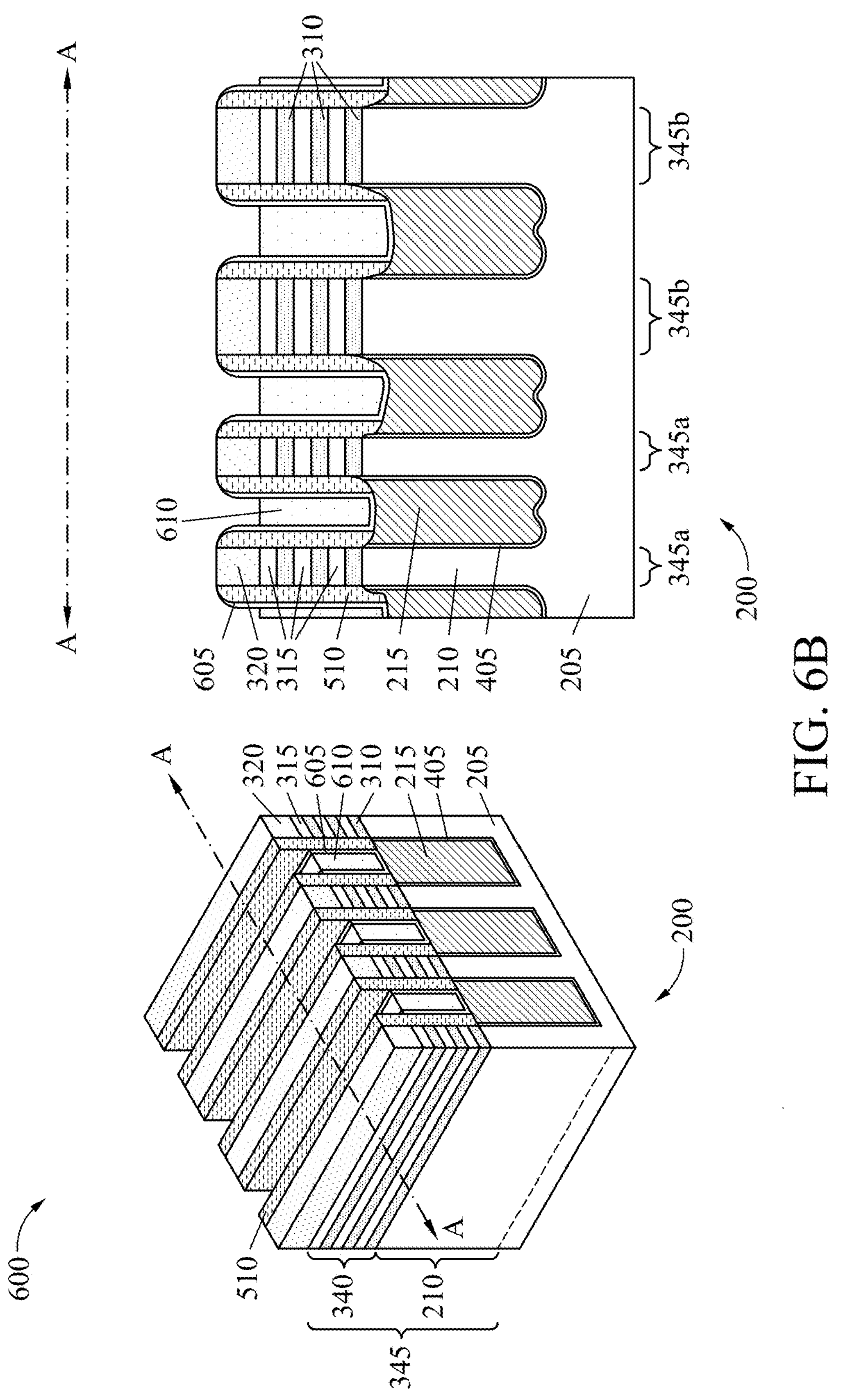
Figure 6C:
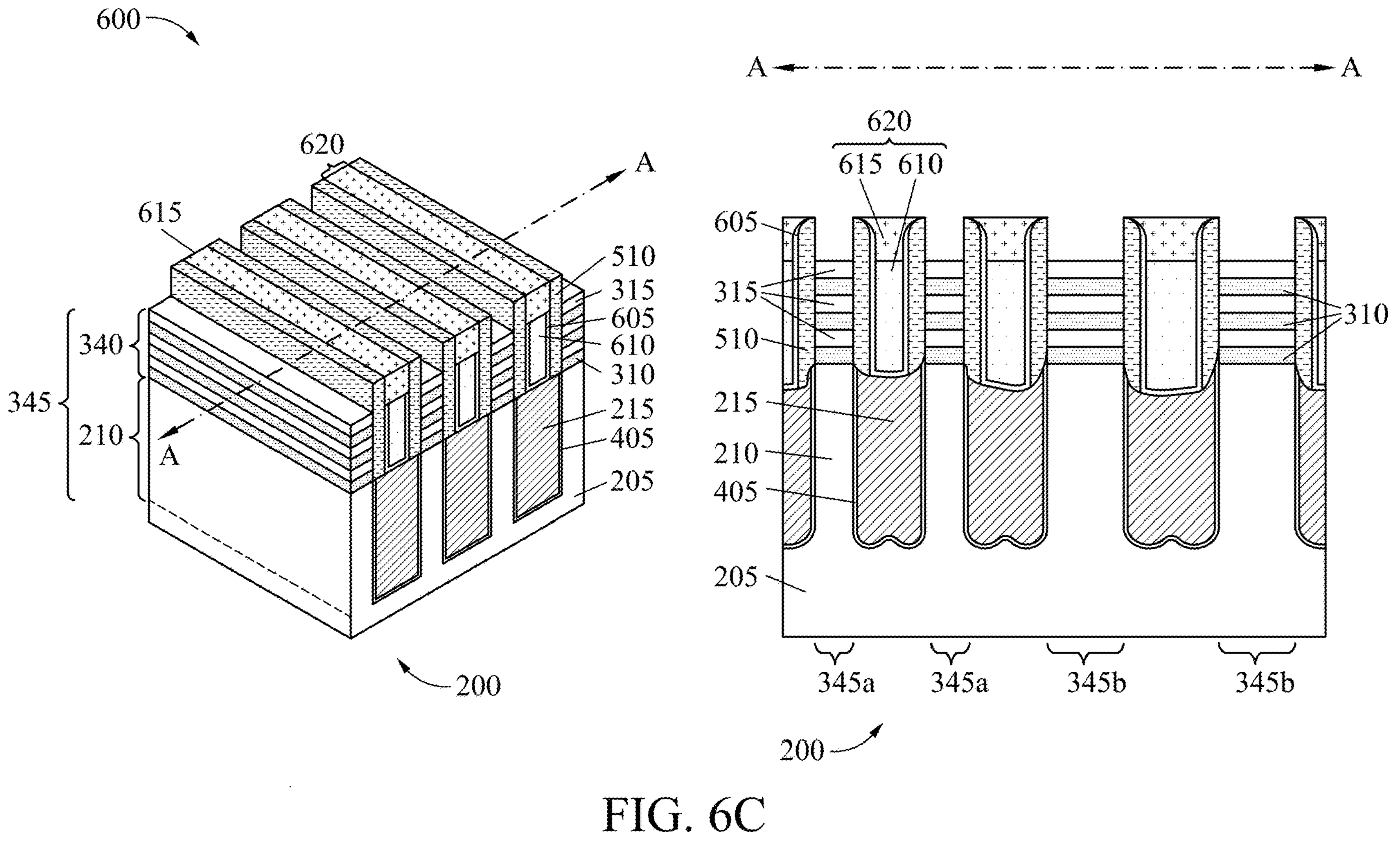

FIGS. 6A-6C are diagrams of an example implementation 600 of a hybrid fin structure process described herein. The example implementation 600 includes an example of forming hybrid fin structures between the fin structures 345 for the semiconductor device 200 or a portion thereof. The semiconductor device 200 may include one or more additional devices, structures, and/or layers not shown in FIGS. 6A-6C. The semiconductor device 200 may include additional layers and/or dies formed on layers above and/or below the portion of the semiconductor device 200 shown in FIGS. 6A-6C. Additionally, or alternatively, one or more additional semiconductor structures and/or semiconductor devices may be formed in a same layer of an electronic device that includes the semiconductor device 200. In some implementations, the operations described in connection with the example implementation 600 are performed after the processes described in connection with FIGS. 3A-5C.

FIG. 6A illustrates a perspective view of the semiconductor device 200 and a cross-sectional view along the line A-A. As shown in FIG. 6A, a liner 605 and a dielectric layer 610 are formed over the STI regions 215 interposing (e.g., in between) the fin structures 345, and over the fin structures 345. The deposition tool 102 may deposit the liner 605 and the dielectric layer 610. The deposition tool 102 may deposit the liner 605 using a conformal deposition technique. The deposition tool 102 may deposit the dielectric layer 610 using a CVD technique (e.g., a flowable CVD (FCVD) technique or another CVD technique), a PVD technique, an ALD technique, and/or another deposition technique. In some implementations, after deposition of the dielectric layer 610, the semiconductor device 200 is annealed, for example, to increase the quality of the dielectric layer 610.

The deposition tool 102 may form the dielectric layer 610 such that a height of a top surface of the dielectric layer 610 and a height of a top surface of the hard mask layer 320 are approximately a same height. Alternatively, the deposition tool 102 may form the dielectric layer 610 such that the height of the top surface of the dielectric layer 610 is greater relative to the height of the top surface of the hard mask layer 320, as shown in the example in FIG. 6A. In this way, the trenches between the fin structures 345 are overfilled with the dielectric layer 610 to ensure the trenches are fully filled with the dielectric layer 610. Subsequently, the planarization tool 110 may perform a planarization or polishing operation (e.g., a CMP operation) to planarize the dielectric layer 610.

The liner 605 and the dielectric layer 610 each includes a dielectric material such as a silicon oxide ($SiO_x$), a silicon nitride ($Si_xN_y$), a silicon oxynitride (SiON), a silicon carbon nitride (SiCN), fluoride-doped silicate glass (FSG), a low-k dielectric material, and/or another suitable insulating material. In some implementations, the dielectric layer 610 may include a multi-layer structure, for example, having one or more liner layers.

FIG. 6B illustrates a perspective view of the semiconductor device 200 and a cross-sectional view along the line A-A. As shown in FIG. 6B, an etch back operation is performed to remove portions of the dielectric layer 610. The etch tool 108 may etch the dielectric layer 610 in the etch back operation to reduce a height of a top surface of the dielectric layer 610. In particular, the etch tool 108 etches the dielectric layer 610 such that the height of portions of the dielectric layer 610 between the fin structures 345 is less than the height of the top surface of the hard mask layer 320. In some implementations, the etch tool 108 etches the dielectric layer 610 such that the height of portions of the dielectric layer 610 between the fin structures 345 is approximately equal to a height of top surfaces of the top-most of the second layers 315 of the portions 340.

FIG. 6C illustrates a perspective view of the semiconductor device 200 and a cross-sectional view along the line A-A. As shown in FIG. 6C, a high dielectric constant (high-k) layer 615 is deposited over the portions of the dielectric layer 610 between the fin structures 345. The deposition tool 102 may deposit a high-k material such as a hafnium oxide ($HfO_x$) and/or another high-k dielectric material to form the high-k layer 615 using a CVD technique, a PVD technique, an ALD technique, and/or another deposition technique. The combination of the portions of the dielectric layer 610 between the fin structures 345 and the high-k layer 615 between the fin structures 345 is referred to as a hybrid fin structure 620 (or dummy fin structure). In some implementations, the planarization tool 110 may perform a planarization operation to planarize the high-k layer 615 such that a height of a top surface of the high-k layer 615 and the height of the hard mask layer 320 are approximately equal.

Subsequently, and as shown in FIG. 6C, the hard mask layer 320 is removed. Removal of the hard mask layer 320 may include using an etch technique (e.g., a plasma etch technique, a wet chemical etch technique, and/or another type of etch technique) or another removal technique.

As indicated above, FIGS. 6A-6C are provided as an example. Other examples may differ from what is described with regard to FIGS. 6A-6C. Example implementation 600 may include additional operations, fewer operations, different operations, and/or a different order of operations than those described in connection with FIGS. 6A-6C.

Figure 7A:
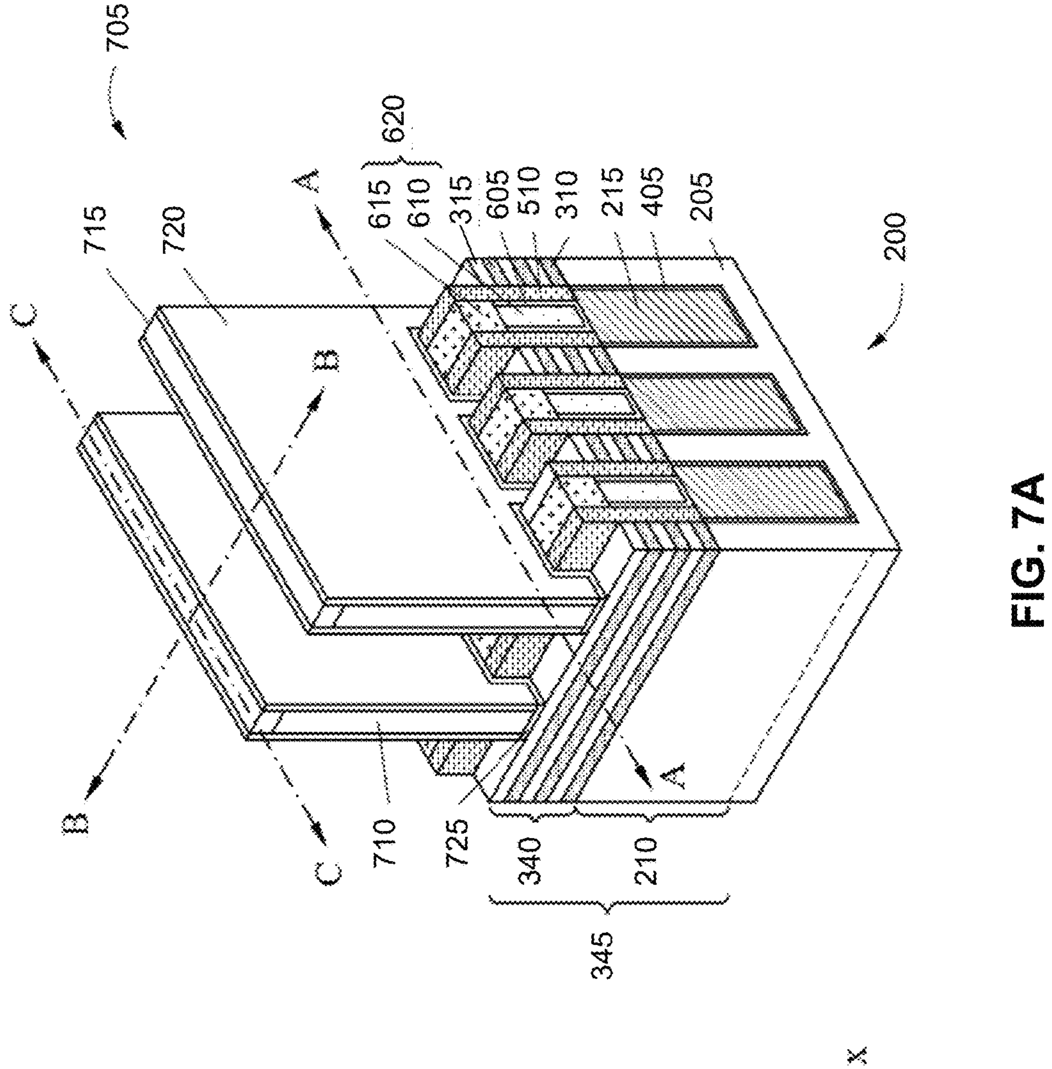
FIGS. 7A-7C are diagrams of an example dummy gate structure formation process described herein.
Figure 7B:
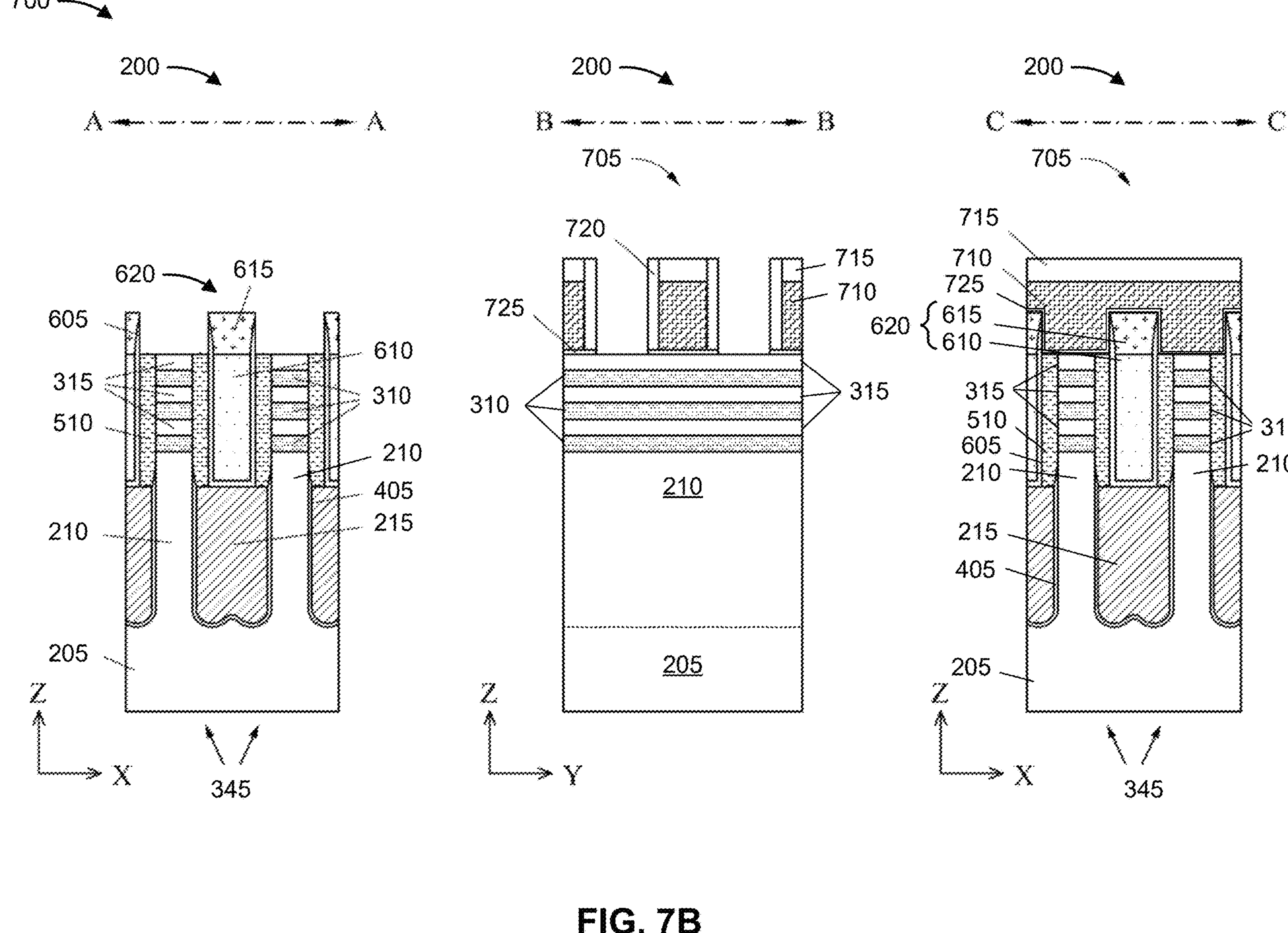
Figure 7C:
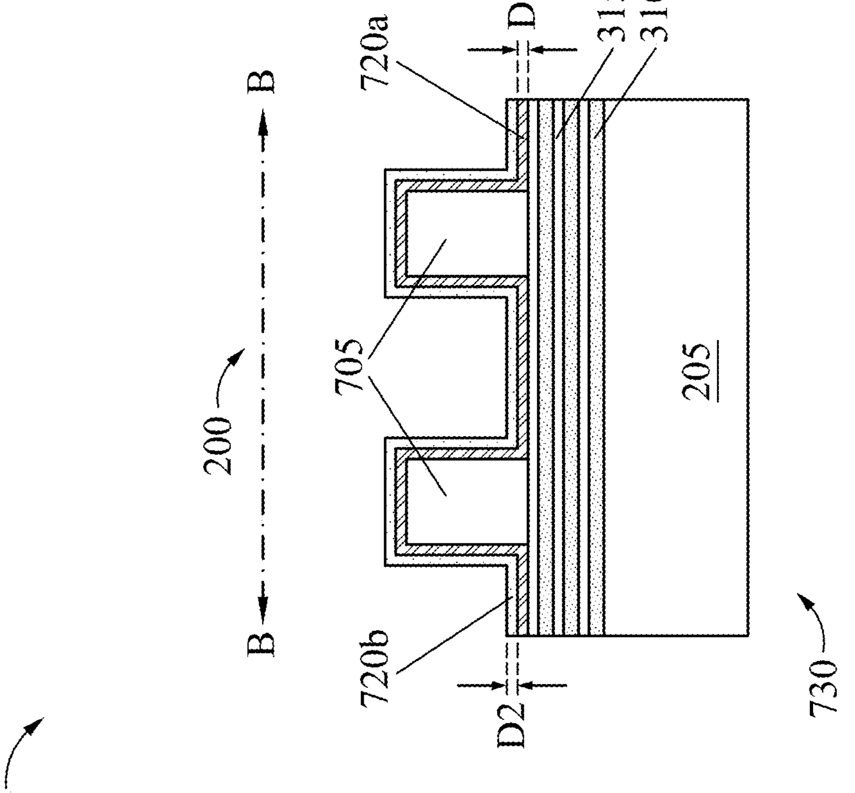

FIGS. 7A-7C are diagrams of an example implementation 700 of a dummy gate formation process described herein. The example implementation 700 includes an example of forming dummy gate structures for the semiconductor device 200 or a portion thereof. The semiconductor device 200 may include one or more additional devices, structures, and/or layers not shown in FIGS. 7A-7C. The semiconductor device 200 may include additional layers and/or dies formed on layers above and/or below the portion of the semiconductor device 200 shown in FIGS. 7A-7C. Additionally, or alternatively, one or more additional semiconductor structures and/or semiconductor devices may be formed in a same layer of an electronic device that includes the semiconductor device 200. In some implementations, the operations described in connection with the example implementation 700 are performed after the processes described in connection with FIGS. 3A-6C.

FIG. 7A illustrates a perspective view of the semiconductor device 200. As shown in FIG. 7A, dummy gate structures 705 (also referred to as dummy gate stacks or temporary gate structures) are formed over the fin structures 345 and over the hybrid fin structures 620. The dummy gate structures 705 are sacrificial structures that are to be replaced by replacement gate structures or replacement gate stacks (e.g., the gate structures 240) at a subsequent processing stage for the semiconductor device 200. Portions of the fin structures 345 underlying the dummy gate structures 705 may be referred to as channel regions. The dummy gate structures 705 may also define source/drain (S/D) regions of the fin structures 345, such as the regions of the fin structures 345 adjacent and on opposing sides of the channel regions.

A dummy gate structure 705 may include a gate electrode layer 710, a hard mask layer 715 over and/or on the gate electrode layer 710, and spacer layers 720 on opposing sides of the gate electrode layer 710 and on opposing sides of the hard mask layer 715. The dummy gate structures 705 may be formed on a gate dielectric layer 725 between the topmost second layer 315 and the dummy gate structures 705, and between the hybrid fin structures 620 and the dummy gate structures 705. The gate electrode layer 710 includes polycrystalline silicon (polysilicon or PO) or another material. The hard mask layer 715 includes one or more layers such as an oxide layer (e.g., a pad oxide layer that may include silicon dioxide ($SiO_2$) or another material) and a nitride layer (e.g., a pad nitride layer that may include a silicon nitride such as $Si_3N_4$ or another material) formed over the oxide layer. The spacer layers 720 include a silicon oxycarbide (SiOC), a nitrogen free SiOC, or another suitable material. The gate dielectric layer 725 may include a silicon oxide (e.g., $SiO_x$ such as $SiO_2$), a silicon nitride (e.g., $Si_xN_y$ such as $Si_3N_4$), a high-K dielectric material and/or another suitable material.

The layers of the dummy gate structures 705 may be formed using various semiconductor processing techniques such as deposition (e.g., by the deposition tool 102), patterning (e.g., by the exposure tool 104 and the developer tool 106), and/or etching (e.g., by the etch tool 108), among other examples. Examples include CVD, PVD, ALD, thermal oxidation, e-beam evaporation, photolithography, e-beam lithography, photoresist coating (e.g., spin-on coating), soft baking, mask aligning, exposure, post-exposure baking, photoresist developing, rinsing, drying (e.g., spin-drying and/or hard baking), dry etching (e.g., reactive ion etching), and/or wet etching, among other examples.

In some implementations, the gate dielectric layer 725 is conformally deposited on the semiconductor device 200 and then selectively removed from portions of the semiconductor device 200 (e.g., the source/drain areas). The gate electrode layer 710 is then deposited onto the remaining portions of the gate dielectric layer 725. The hard mask layers 715 are then deposited onto the gate electrode layers 710. The spacer layers 720 may be conformally deposited in a similar manner as the gate dielectric layer 725 and etched back such that the spacer layers 720 remain on the sidewalls of the dummy gate structures 705. In some implementations, the spacer layers 720 include a plurality of types of spacer layers. For example, the spacer layers 720 may include a seal spacer layer that is formed on the sidewalls of the dummy gate structures 705 and a bulk spacer layer that is formed on the seal spacer layer. The seal spacer layer and the bulk spacer layer may be formed of similar materials or different materials. In some implementations, the bulk spacer layer is formed without plasma surface treatment that is used for the seal spacer layer. In some implementations, the bulk spacer layer is formed to a greater thickness relative to the thickness of the seal spacer layer. In some implementations, the gate dielectric layer 725 is omitted from the dummy gate structure formation process and is instead formed in the replacement gate process.

FIG. 7A further illustrates reference cross-sections that are used in subsequent figures described herein. Cross-section A-A is in an x-z plane (referred to as a y-cut) across the fin structures 345 and the hybrid fin structures 620 in source/drain areas of the semiconductor device 200. Cross-section B-B is in a y-z plane (referred to as an x-cut) perpendicular to the cross-section A-A, and is across the dummy gate structures 705 in the source/drain areas of the semiconductor device 200. Cross-section C-C is in the x-z plane parallel to the cross-section A-A and perpendicular to the cross-section B-B, and is along a dummy gate structures 705. Subsequent figures refer to these reference cross-sections for clarity. In some figures, some reference numbers of components or features illustrated therein may be omitted to avoid obscuring other components or features for ease of depicting the figures.

FIG. 7B includes cross-sectional views along the cross-sectional planes A-A, B-B, and C-C of FIG. 7A. As shown in the cross-sectional planes B-B and C-C in FIG. 7B, the dummy gate structures 705 are formed above the fin structures 345. As shown in the cross-sectional plane C-C in FIG. 7B, portions of the gate dielectric layer 725 and portions of the gate electrode layers 710 are formed in recesses above the fin structures 345 that are formed as a result of the removal of the hard mask layer 320.

FIG. 7C shows a variation of implementing the dummy gate structures 705 including example 730. The variation of the dummy gate structures 705 in the example may use a combination of one or more techniques described in FIG. 7A and FIG. 7B. FIG. 7C includes a cross-sectional view along the cross-sectional plane B-B of an example implementation of the dummy gate structures 705 including a plurality of types of the spacer layers 720. The dummy gate structures 705 are over a plurality of nanostructure layers (e.g., the first layer 310 and the second layer 315) arranged perpendicular to the substrate 205. The spacer layers 720 as shown in FIG. 7C include a spacer layer 720*a* and a spacer layer 720*b*. As shown in FIG. 7C, the spacer layer 720*a* is formed over the dummy gate structures 705, including along sidewalls of the dummy gate structures 705. Forming the spacer layer 720*a* may include the deposition tool 102 depositing a silicon nitride ($Si_xN_y$) material, a silicon oxycarbonnitride (SiOCN) material, a silicon oxycarbide (SiCO) material, or a silicon carbon nitride (SiCN) material, among other examples. The spacer layer 720*a* may be deposited using a deposition process, such as ALD, CVD, or another deposition technique.

In some implementations, a thickness D1 of the spacer layer 720*a* is included in a range of approximately 1 nanometer to approximately 5 nanometers. If the thickness D1 is less than approximately 1 nanometer, the spacer layer 720*a* may not provide adequate protection to a subsequently formed gate structure (e.g., the gate structure 240). If the thickness D1 is greater than approximately 5 nanometers, a pitch or size of the semiconductor device 200 may increase. However, other values and ranges for the thickness D1 are within the scope of the present disclosure.

As further shown in FIG. 7C, the spacer layer 720*b* is formed over the spacer layer 720*a*. The spacer layer 720*b* may be a sacrificial layer which is subsequently removed using an etch-selectivity operation to form a dielectric region (e.g., a gap containing a dielectric gas or air, among other examples). Forming the spacer layer 720*b* may include the deposition tool 102 depositing a SiGe material, among other examples. The spacer layer 720*b* may be deposited using a deposition process, such as ALD, CVD, or another deposition technique.

A content of Ge in the material of the spacer layer 720*b* may be included in a range of approximately 10% to approximately 40%. If the content is less than approximately 10%, an effectiveness of etching-selectivity operation may be reduced. If the content of Ge is greater than approximately 40%, a cost of the material for the spacer layer 720*b* may increase. However, other values and ranges for the content of Ge in the material of the spacer layer 720*b* are within the scope of the present disclosure.

In some implementations, a thickness D2 of the spacer layer 720*b* is included in a range of approximately 1 nanometer to approximately 5 nanometers. If the thickness D2 is less than approximately 1 nanometer, the dielectric region that is subsequently formed may not improve parasitic performance of the semiconductor device 200. If the thickness D2 is greater than approximately 5 nanometers, a pitch or size of the semiconductor device 200 may increase. However, other values and ranges for the thickness D2 are within the scope of the present disclosure.

Use of the SiGe material for the spacer layer 720*b* may provide multiple benefits in comparison to use of another material (e.g., $SiO_2$). As described in connection with FIG. 10E, use of the SiGe material may lend itself to an etching-selectivity operation that eliminates the need for additional hard masking (e.g., "helmet") layers (and manufacturing cycles) to protect portions of the semiconductor device 200 during removal of the spacer layer 720*b*. Additionally, or alternatively, use of the SiGe material may reduce a likelihood of damage to portions of the semiconductor device 200.

As indicated above, FIGS. 7A-7C are provided as examples. Other examples may differ from what is described with regard to FIGS. 7A-7C. Example implementation 700 may include additional operations, fewer operations, different operations, and/or a different order of operations than those described in connection with FIGS. 7A-7C.

FIGS. 8A-8D are diagrams of an example implementation 800 of a source/drain recess formation process and an inner spacer formation process described herein. The example implementation 800 includes an example of forming source/drain recesses and the inner spacers 245 for the semiconductor device 200. FIGS. 8A-8D are illustrated from a plurality of perspectives illustrated in FIG. 7A, including the perspective of the cross-sectional plane A-A in FIG. 7A, the perspective of the cross-sectional plane B-B in FIG. 7A, and the perspective of the cross-sectional plane C-C in FIG. 7A. In some implementations, the operations described in connection with the example implementation 800 are performed after the processes described in connection with FIGS. 3A-7C.

Figure 8A:
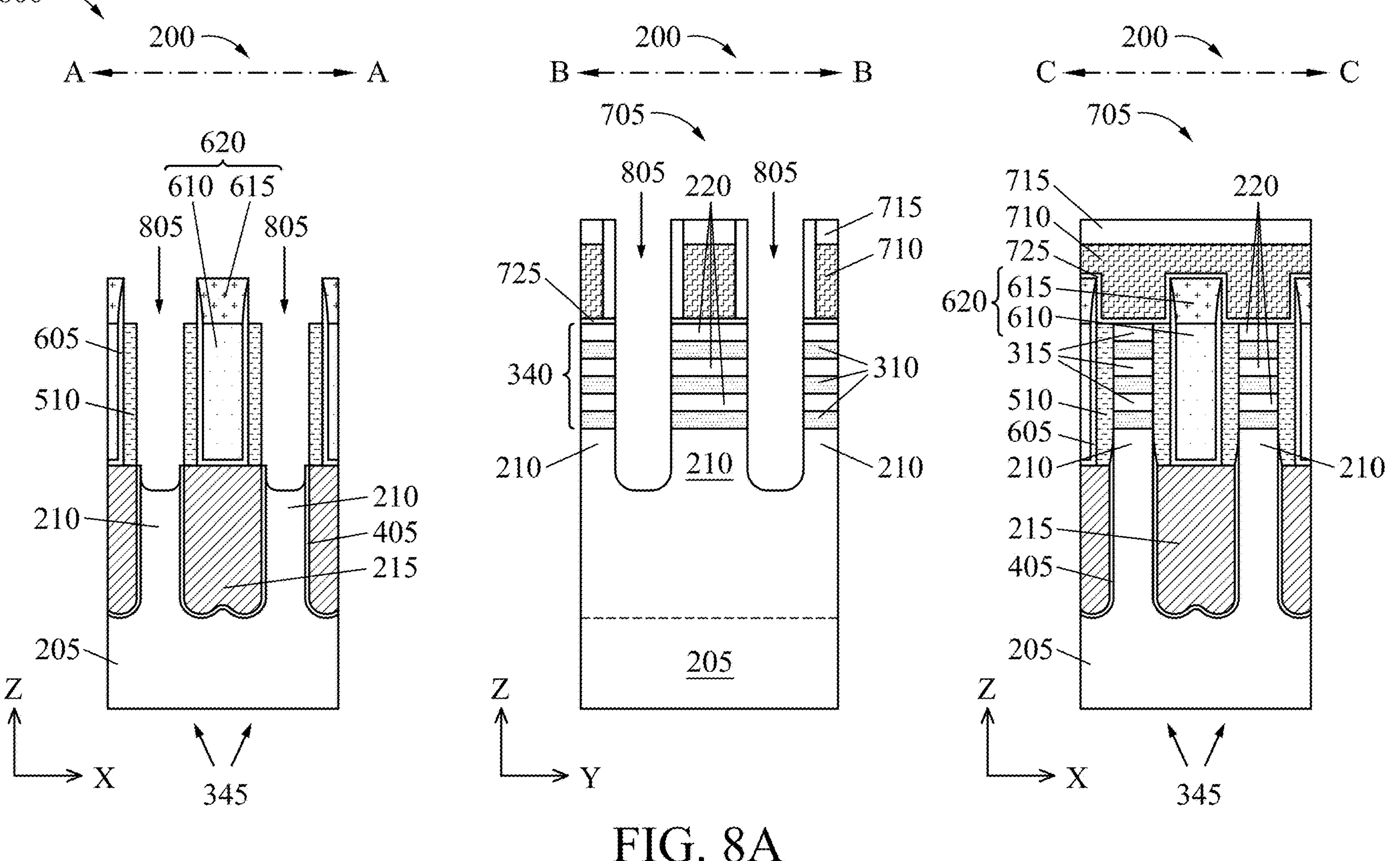
FIGS. 8A-8D are diagrams of example implementations of a source/drain recess formation process and an inner spacer formation process described herein.

As shown in the cross-sectional plane A-A and cross-sectional plane B-B in FIG. 8A, source/drain recesses 805 are formed in the portions 340 of the fin structure 345 in an etch operation. The source/drain recesses 805 are formed to provide spaces in which source/drain regions 225 are to be formed on opposing sides of the dummy gate structures 705. The etch operation may be performed by the etch tool 108 and may be referred to a strained source/drain (SSD) etch operation. In some implementations, the etch operation includes a plasma etch technique, a wet chemical etch technique, and/or another type of etch technique.

The source/drain recesses 805 also extend into a portion of the mesa regions 210 of the fin structure 345. This results in the formation of a plurality of mesa regions 210 in each fin structure 345, where sidewalls of the portions of each source/drain recess 805 below the portions 340 correspond to sidewalls of mesa regions 210. The source/drain recesses 805 may penetrate into a well portion (e.g., a p-well, an n-well) of the fin structure 345. In implementations in which the semiconductor substrate 205 includes a silicon (Si) material having a (100) orientation, (111) faces are formed at bottoms of the source/drain recesses 805, resulting in formation of a V-shape or a triangular shape cross section at the bottoms of the source/drain recesses 805. In some implementations, a wet etching using tetramethylammonium hydroxide (TMAH) and/or a chemical dry etching using hydrochloric acid (HCl) are employed to form the V-shape profile. However, the cross section at the bottoms of the source/drain recesses 805 may include other shapes, such as round or semi-circular, among other examples.

As shown in the cross-sectional plane B-B and the cross-sectional plane C-C in FIG. 8A, portions of the first layers 310 and portions of the second layers 315 of the layer stack 305 remain under the dummy gate structures 705 after the etch operation to form the source/drain recesses 805. The portions of the second layers 315 under the dummy gate structures 705 form the nanostructure channels 220 of the nanostructure transistors of the semiconductor device 200. The nanostructure channels 220 extend between adjacent source/drain recesses 805 and between adjacent hybrid fin structures 620.

Figure 8B:
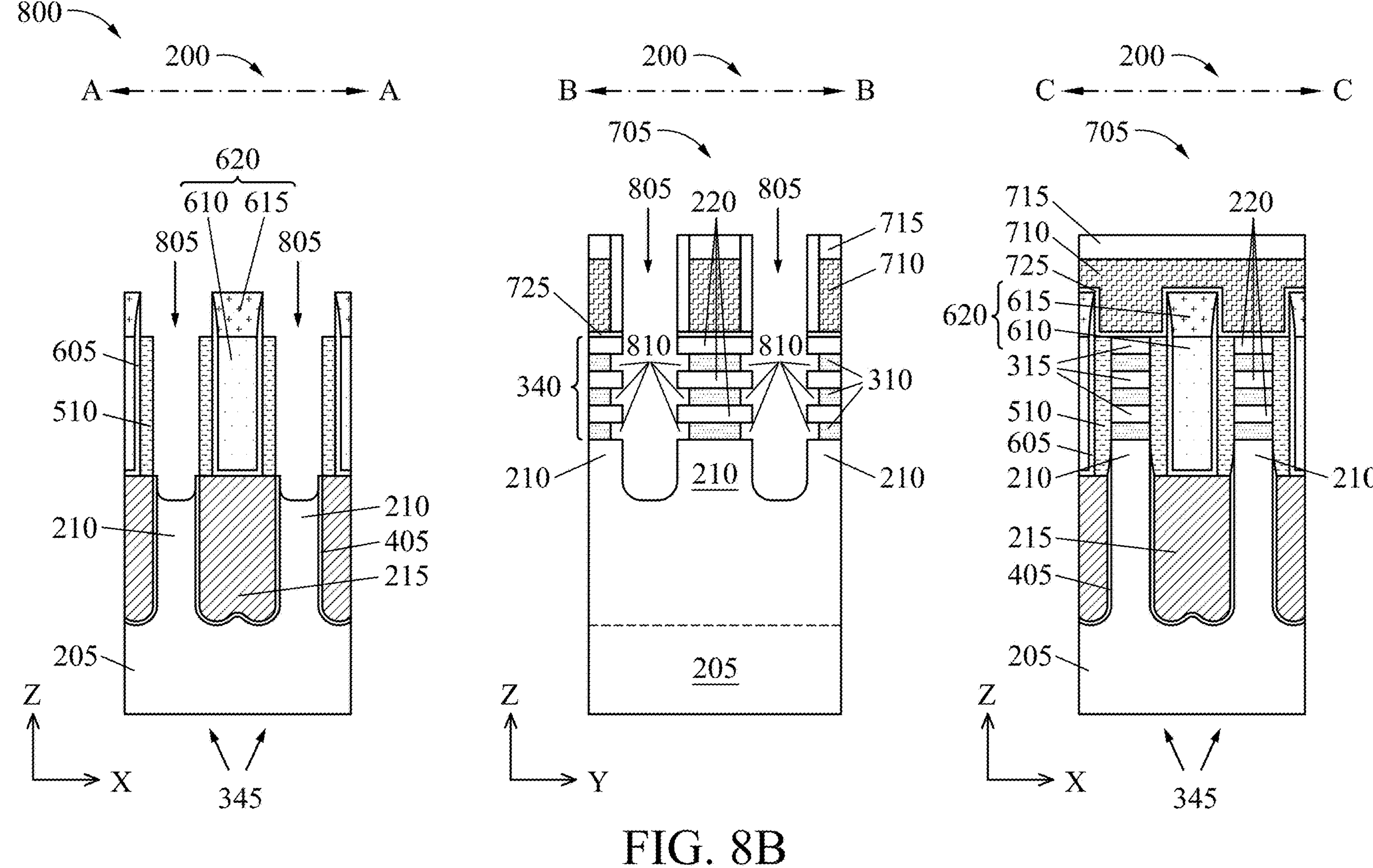

As shown in the cross-sectional plane B-B in FIG. 8B, the first layers 310 are laterally etched (e.g., in a direction that is approximately parallel to a length of the first layers 310) in an etch operation, thereby forming cavities 810 between portions of the nanostructure channels 220. In particular, the etch tool 108 laterally etches ends of the first layers 310 under the dummy gate structures 705 through the source/drain recesses 805 to form the cavities 810 between ends of the nanostructure channels 220. In implementations where the first layers 310 are silicon germanium (SiGe) and the second layers 315 are silicon (Si), the etch tool 108 may selectively etch the first layers 310 using a wet etchant such as, a mixed solution including hydrogen peroxide ($H_2O_2$), acetic acid ($CH_3COOH$), and/or hydrogen fluoride (HF), followed by cleaning with water ($H_2O$). The mixed solution and the water may be provided into the source/drain recesses 805 to etch the first layers 310 from the source/drain recesses 805. In some embodiments, the etching by the mixed solution and cleaning by water is repeated approximately 10 to approximately 20 times. The etching time by the mixed solution is in a range from about 1 minute to about 2 minutes in some implementations. The mixed solution may be used at a temperature in a range of approximately 60° Celsius to approximately 90° Celsius. However, other values for the parameters of the etch operation are within the scope of the present disclosure.

The cavities 810 may be formed to an approximately curved shape, an approximately triangular shape, an approximately square shape, or to another shape. In some implementations, the depth of one or more of the cavities 810 (e.g., the dimension of the cavities extending into the first layers 310 from the source/drain recesses 805) is in a range of approximately 0.5 nanometers to about 5 nanometers. In some implementations, the depth of one or more of the cavities 810 is in a range of approximately 1 nanometer to approximately 3 nanometers. However, other values for the depth of the cavities 810 are within the scope of the present disclosure. In some implementations, the etch tool 108 forms the cavities 810 to a length (e.g., the dimension of the cavities extending from a nanostructure channel 220 below a first layer 310 to another nanostructure channel 220 above the first layer 310) such that the cavities 810 partially extend into the sides of the nanostructure channels 220 (e.g., such that the width or length of the cavities 810 are greater than the thickness of the first layers 310). In this way, the inner spacers that are to be formed in the cavities 810 may extend into a portion of the ends of the nanostructure channels 220. In some implementations, forming the cavities 810 results in thinning of the cladding sidewalls 510 in the source/drain recesses 805.

Figure 8C:
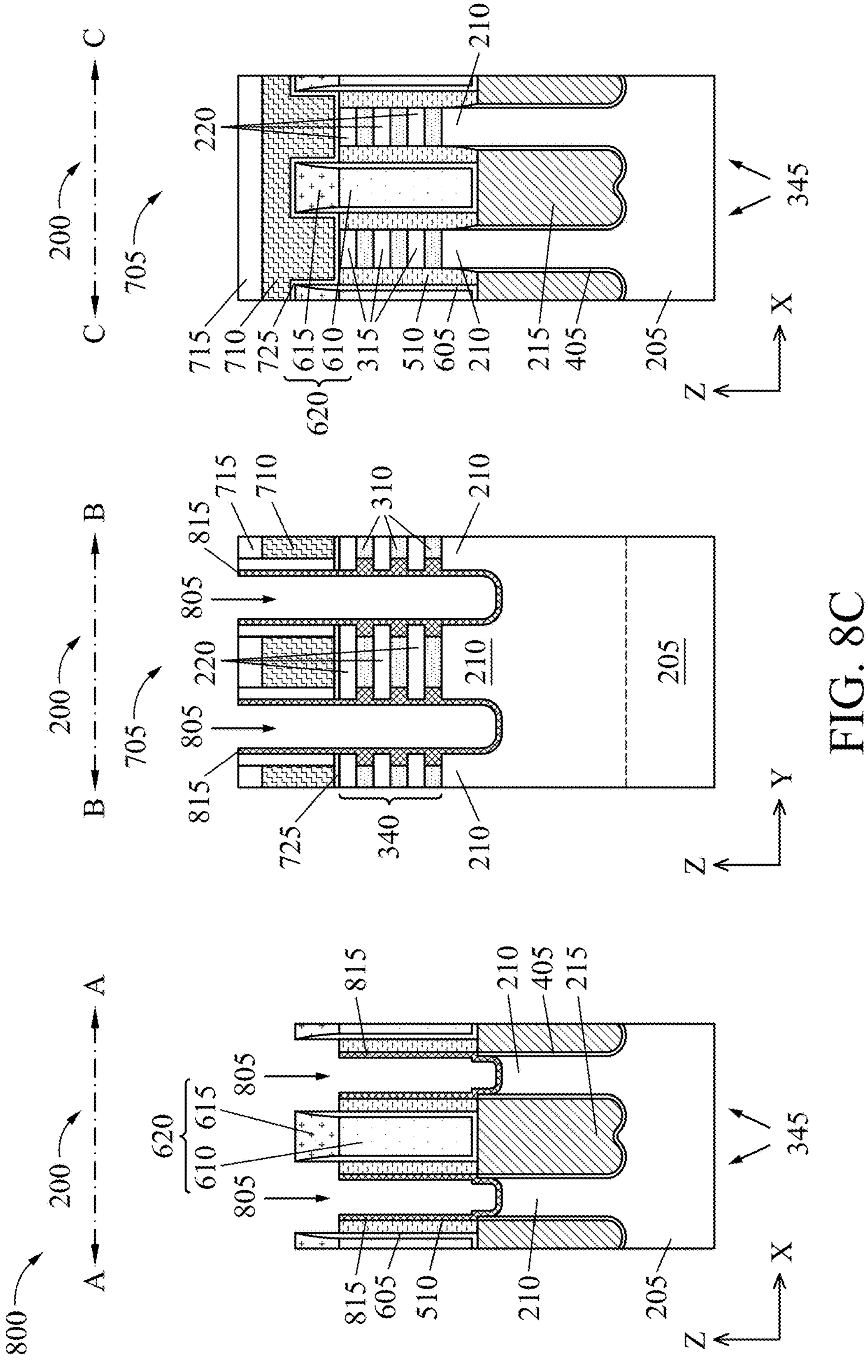

As shown in the cross-sectional plane A-A and in the cross-sectional plane B-B in FIG. 8C, an insulating layer 815 is conformally deposited along the bottom and along the sidewalls of the source/drain recesses 805. The insulating layer 815 further extends along the spacer layer 720. The deposition tool 102 may deposit the insulating layer 815 using a CVD technique, a PVD technique, and ALD technique, and/or another deposition technique. The insulating layer 815 includes a silicon nitride ($Si_x$—$N_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material. The insulating layer 815 may include a material that is different from the material of spacer layers 720.

The deposition tool 102 forms the insulating layer 815 to a thickness sufficient to fill in the cavities 810 between the nanostructure channels 220 with the insulating layer 815. For example, the insulating layer 815 may be formed to a thickness in a range of approximately 1 nanometer to approximately 10 nanometers. As another example, the insulating layer 815 is formed to a thickness in a range of approximately 2 nanometers to approximately 5 nanometers. However, other values for the thickness of the insulating layer 815 are within the scope of the present disclosure.

Figure 8D:
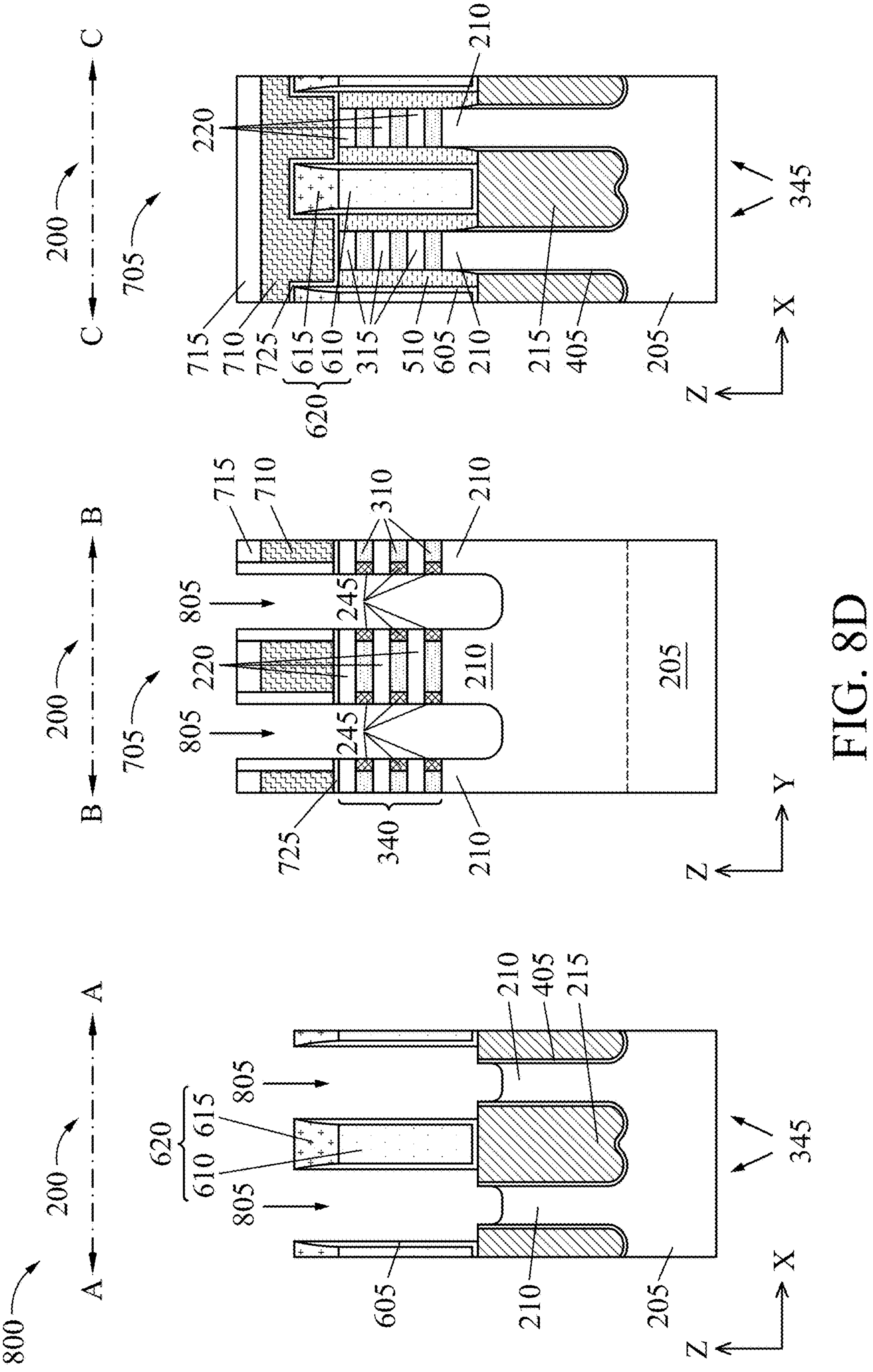

As shown in the cross-sectional plane A-A and in the cross sectional plane B-B in FIG. 8D, the insulating layer 815 is partially removed such that remaining portions of the insulating layer 815 correspond to the inner spacers 245 in the cavities 810. The etch tool 108 may perform an etch operation to partially remove the insulating layer 815. As further shown in the cross-sectional plane A-A in FIG. 8D, the cladding sidewalls 510 may also be removed from the source/drain recesses 805 in the etch operation to partially remove the insulating layer 815.

In some implementations, the etch operation may result in the surfaces of the inner spacers 245 facing the source/drain recesses 805 being curved or recessed. The depth of the recesses in the inner spacers 245 may be in a range of approximately 0.2 nanometers to approximately 3 nanometers. As another example, the depth of the recesses in the inner spacers 245 may be in a range of approximately 0.5 nanometers to approximately 2 nanometers. As another example, the depth of the recesses in the inner spacers 245 may be in a range of less than approximately 0.5 nanometers. In some implementations, the surfaces of the inner spacers 245 facing the source/drain recesses 805 are approximately flat such that the surfaces of the inner spacers 245 and the surfaces of the ends of the nanostructure channels 220 are approximately even and flush.

As indicated above, FIGS. 8A-8D are provided as examples. Other examples may differ from what is described with regard to FIGS. 8A-8D. Example implementation 800 may include additional operations, fewer operations, different operations, and/or a different order of operations than those described in connection with FIGS. 8A-8D.

Figure 9A:
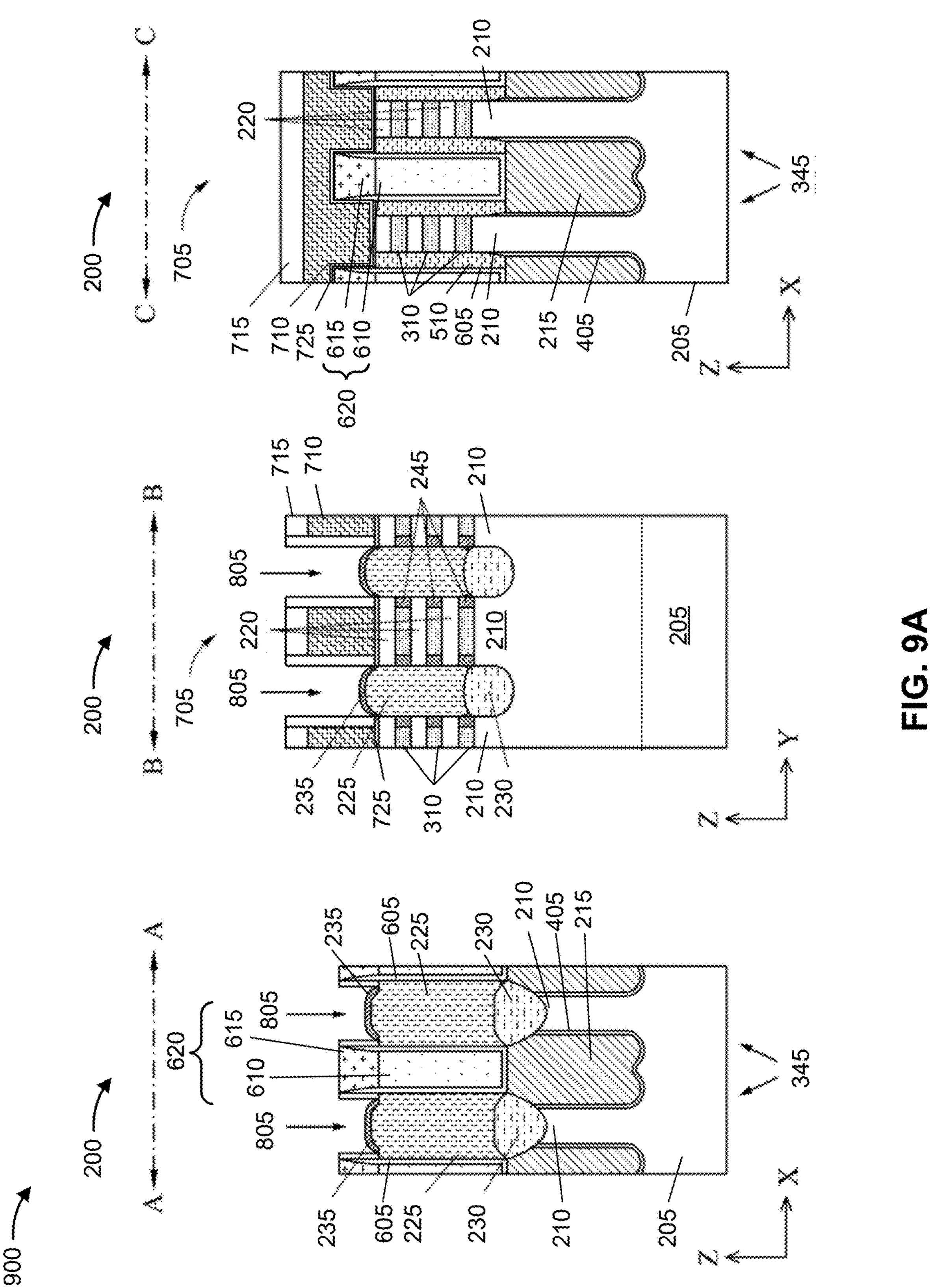
FIGS. 9A and 9B are diagrams of an example implementation of a source/drain region formation process described herein.
Figure 9B:
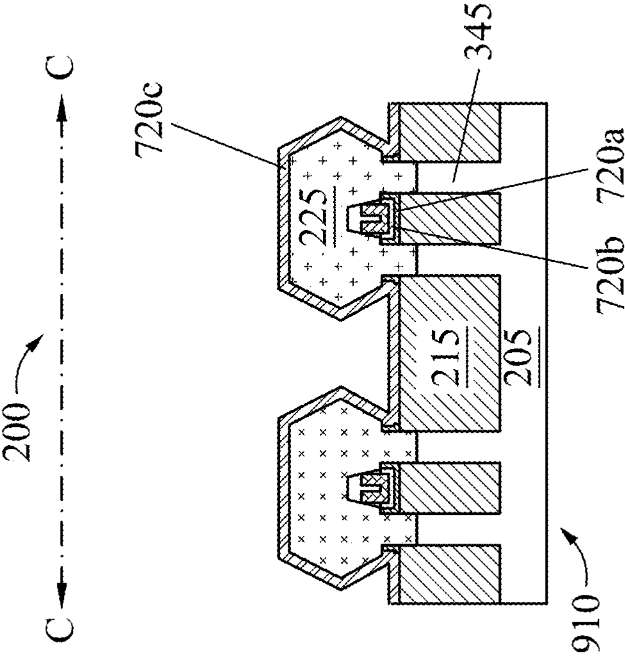
Figure 9B:
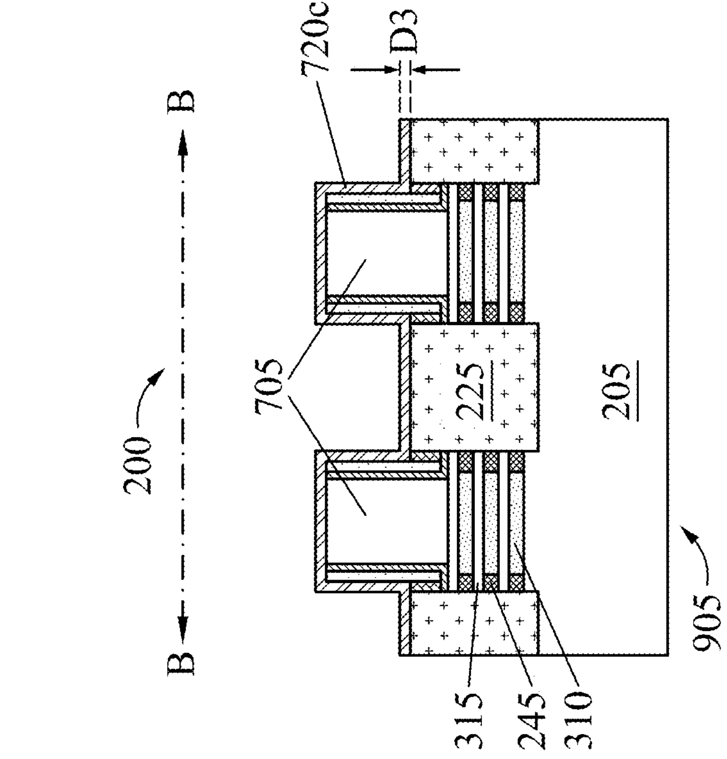

FIGS. 9A and 9B are diagrams of an example implementation 900 of a source/drain region formation process described herein. The example implementation 900 includes an example of forming the source/drain regions 225 in the source/drain recesses 805 for the semiconductor device 200. FIGS. 9A and 9B are illustrated from a plurality of perspectives illustrated in FIG. 7A, including the perspective of the cross-sectional plane A-A in FIG. 7A, the perspective of the cross-sectional plane B-B in FIG. 7A, and the perspective of the cross-sectional plane C-C in FIG. 7A. In some implementations, the operations described in connection with the example implementation 900 are performed after the processes described in connection with FIGS. 3A-8D.

As shown in the cross-sectional plane A-A and the cross-sectional plane B-B in FIG. 9A, the source/drain recesses 805 are filled with one or more layers to form the source/drain regions 225 in the source/drain recesses 805. For example, the deposition tool 102 may deposit a buffer layer 230 at the bottom of the source/drain recesses 805, the deposition tool 102 may deposit the source/drain regions 225 on the buffer layer 230, and the deposition tool 102 may deposit a capping layer 235 on the source/drain regions 225. The buffer layer 230 may include silicon (Si), silicon doped with boron (SiB) or another dopant, and/or another material. The buffer layers 230 may be included to reduce, minimize, and/or prevent dopant migration and/or current leakage from the source/drain regions 225 into the adjacent mesa regions 210, which might otherwise cause short channel effects in the semiconductor device 200. Accordingly, the buffer layers 230 may increase the performance of the semiconductor device 200 and/or increase yield of the semiconductor device 200.

The source/drain regions 225 may include one or more layers of epitaxially grown material. For example, the deposition tool 102 may epitaxially grow a first layer of the source/drain regions 225 (referred to as an L1) over the buffer layer 230, and may epitaxially grow a second layer of the source/drain regions 225 (referred to as an L2, an L2-1, and/or an L2-2) over the first layer. The first layer may include a lightly doped silicon (e.g., doped with boron (B), phosphorous (P), and/or another dopant), and may be included as shielding layer to reduce short channel effects in the semiconductor device 200 and to reduce dopant extrusion or migration into the nanostructure channels 220. The second layer may include a highly doped silicon or highly doped SiGe. The second layer may be included to provide a compressive stress in the source/drain regions 225 to reduce boron loss.

FIG. 9B shows a variation of the source/drain regions 225 using example 905 and example 910. The source/drain regions 225 of the example may be formed in combination with one or more techniques described in FIG. 7C and FIG. 9A. Example 905 includes a cross-sectional view along the cross-sectional plane B-B of the source/drain regions 225, further including a spacer layer 720*c* formed over the source/drain regions 225. As shown in FIG. 9B, forming the spacer layer 720*c* over the source/drain regions 225 includes forming the spacer layer 720*c* along sidewalls of the dummy gate structures 705 and adjacent to the spacer layer 720*a*. Furthermore, the spacer layer 720*c* is formed above the substrate 205, above the plurality of nanostructure layers (e.g., the first layers 310 and the second layers 315), and above the inner spacers 245.

Forming the spacer layer 720*c* may include the deposition tool 102 depositing a silicon nitride material or a nitrogen containing material, a silicon containing material, and/or a carbon containing material (e.g., $Si_xN_y$, SiOCN, SiCO, or SICN, among other examples). In some implementations, the spacer layer 720*c* may correspond to a contact etch stop layer (CESL). In such a case, the spacer layer 720*c* may provide a mechanism to stop an etch process when forming contacts or vias for the source/drain regions 225. The spacer layer 720*c* may be formed of a dielectric material having a different etch selectivity from adjacent layers or components. The spacer layer 720*c* may be deposited using a deposition process, such as ALD, CVD, or another deposition technique.

In some implementations, a thickness D3 of the spacer layer 720*c* is included in a range of approximately 1 nanometer to approximately 5 nanometers. If the thickness D3 is less than approximately 1 nanometer, the spacer layer 720*c* may not provide adequate protection to a subsequently formed gate structure (e.g., the gate structure 240). If the thickness D3 is greater than approximately 5 nanometers, a pitch or size of the semiconductor device 200 may increase. However, other values and ranges for the thickness D3 are within the scope of the present disclosure.

Example 910 includes an example of the source/drain regions 225 including merged epitaxial regions. As shown, example 910 corresponds to a cross-sectional view along the cross-sectional plane C-C of the source/drain regions 225. In the example 910, the spacer layer 720*c* is shown over merged epitaxial regions corresponding to the source/drain regions 225. Also, as shown in example 910, the merged epitaxial regions are over the spacer layer 720*a* and the spacer layer 720*b*.

In some implementations, and as shown, the merged epitaxial regions are used in two fin (2F) structures (e.g., a merged epitaxial region may join two fin structures 345). In some implementations, the merged epitaxial regions include multiple layers of different epitaxial materials.

Example 910 further shows the STI regions 215. The STI regions 215, as shown, are below the merged epitaxial regions and between the fin structures 345. Furthermore, the STI regions are below the spacer layer 720*a*, the spacer layer 720*b*, and the spacer layer 720*c*.

As described in connection with FIG. 10E, and elsewhere herein, the spacer layer 720*b* may be removed (e.g., removed using an etching-selectivity operation) from between the spacer layer 720*a* and the spacer layer 720*c* to form a dielectric region between the spacer layer 720*a* and the spacer layer 720*c*.

As indicated above, FIGS. 9A and 9B are provided as examples. Other examples may differ from what is described with regards to FIGS. 9A and 9B. Example implementation 900 may include additional operations, fewer operations, different operations, and/or a different order of operations than those described in connection with FIGS. 9A and 9B.

FIGS. 10A-10E are diagrams of an example implementation 1000 of a replacement gate (RPG) process described herein. The example implementation 1000 includes an example of a replacement gate process for replacing the dummy gate structures 705 with the gate structures 240 (e.g., the replacement gate structures) of the semiconductor device 200. FIGS. 10A-10E are illustrated from a plurality of perspectives illustrated in FIG. 7A, including the perspective of the cross-sectional plane A-A in FIG. 7A, the perspective of the cross-sectional plane B-B in FIG. 7A, and the perspective of the cross-sectional plane C-C in FIG. 7A. In some implementations, the operations described in connection with the example implementation 1000 are performed after the operations described in connection with FIGS. 3A-9B.

As shown in the cross-sectional plane A-A and the cross-sectional plane B-B in FIG. 101, the dielectric layer 250 is formed over the source/drain regions 225. The dielectric layer 250 fills in areas between the dummy gate structures 705, between the hybrid fin structures 620, and over the source/drain regions 225. The dielectric layer 250 is formed to reduce the likelihood of and/or prevent damage to the source/drain regions 225 during the replacement gate process. The dielectric layer 250 may be referred to as an interlayer dielectric (ILD) zero (ILDO) layer or another ILD layer.

Figure 10A:
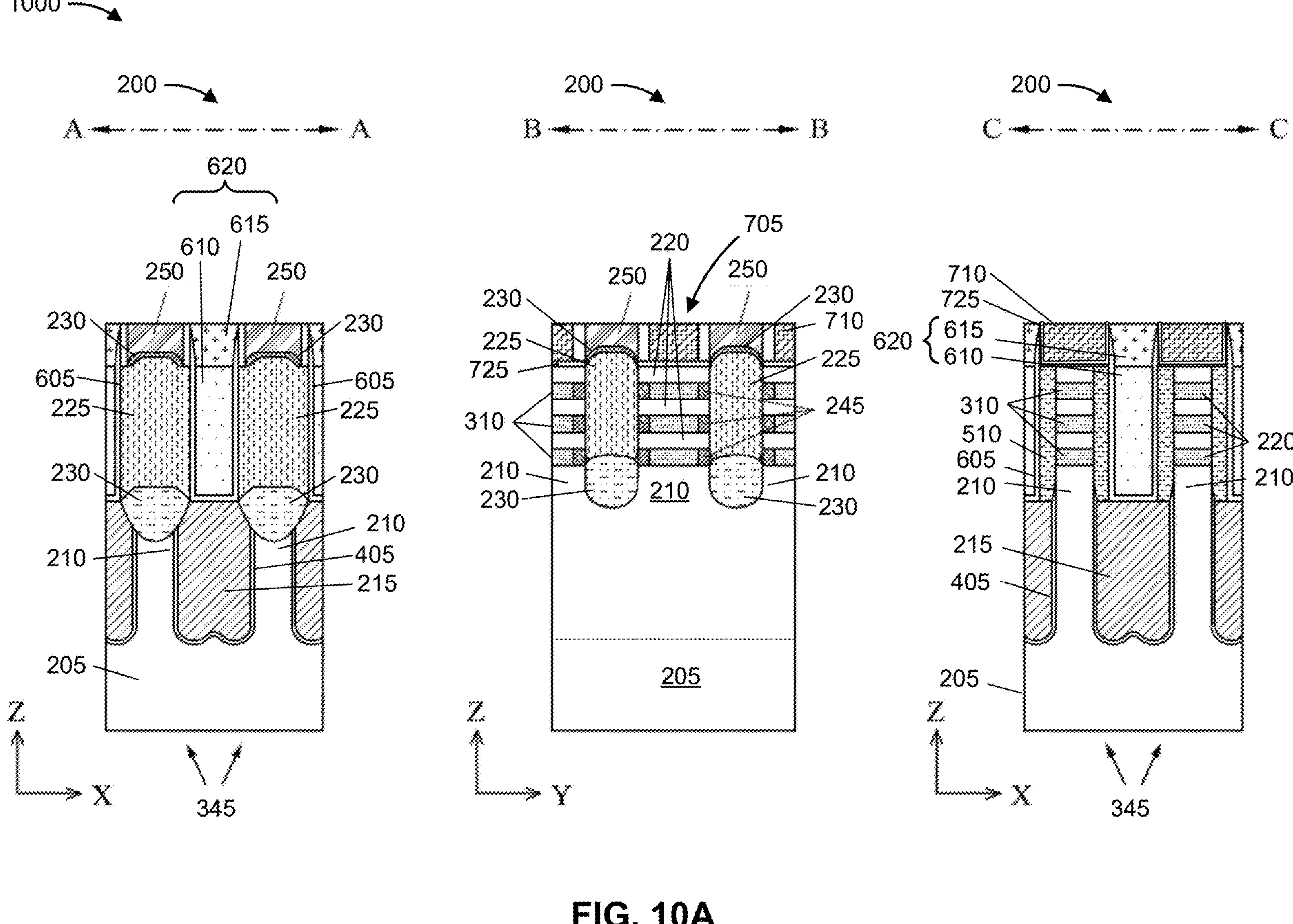
FIGS. 10A-10E are diagrams of an example implementation of a replacement gate process described herein.
Figure 10B:
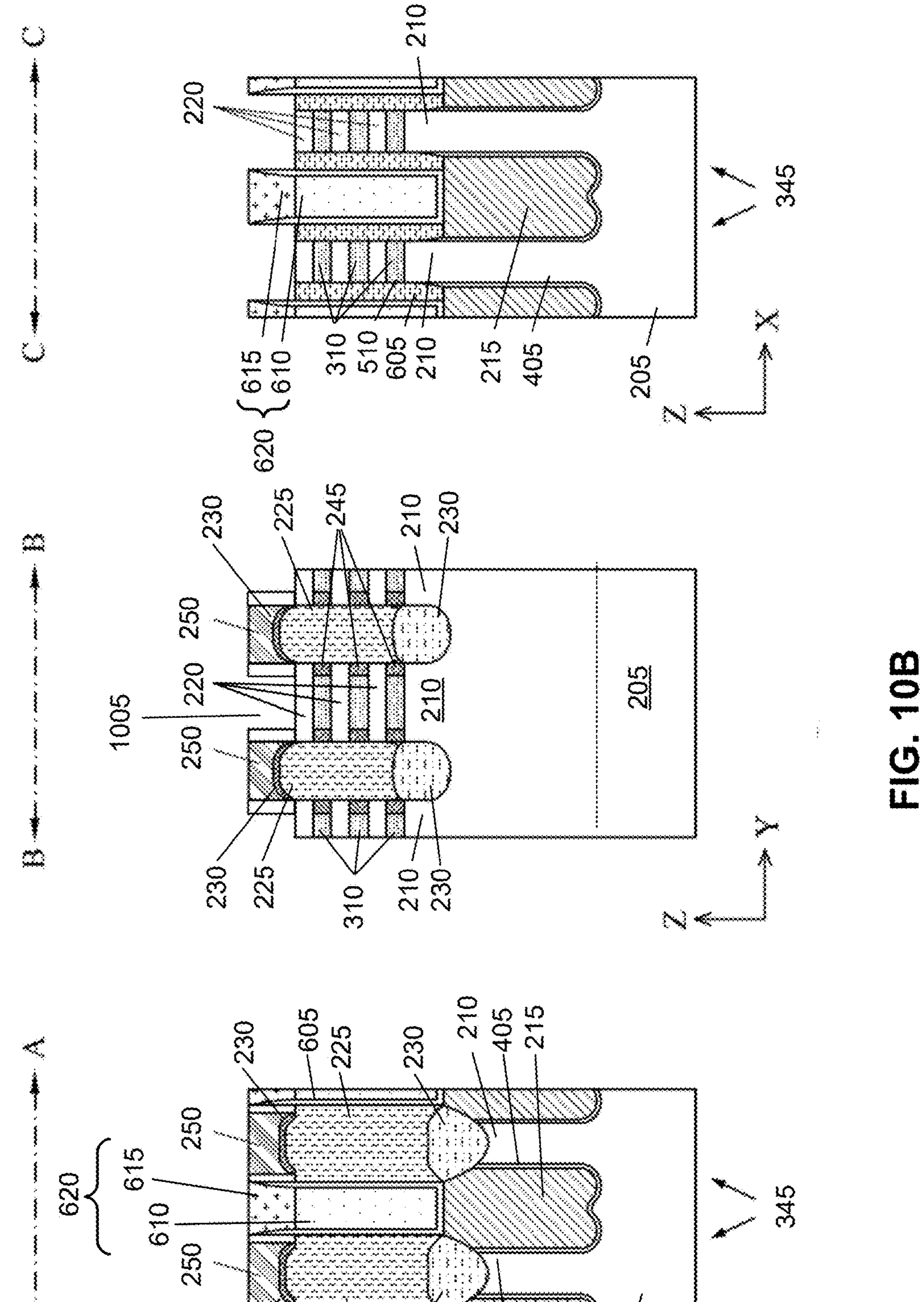

As shown in the cross-sectional plane B-B and the cross-sectional plane C-C in FIG. 10B, the replacement gate operation is performed (e.g., by one or more of the semiconductor processing tools 102-112) to remove the dummy gate structures 705 from the semiconductor device 200. The removal of the dummy gate structures 705 leaves behind cavities 1005 between the dielectric layer 250 over the source/drain regions 225, and between the hybrid fin structures 620. The dummy gate structures 705 may be removed in one or more etch operations. Such etch operations may include a plasma etch technique, a wet chemical etch technique, and/or another type of etch technique.

Figure 10C:
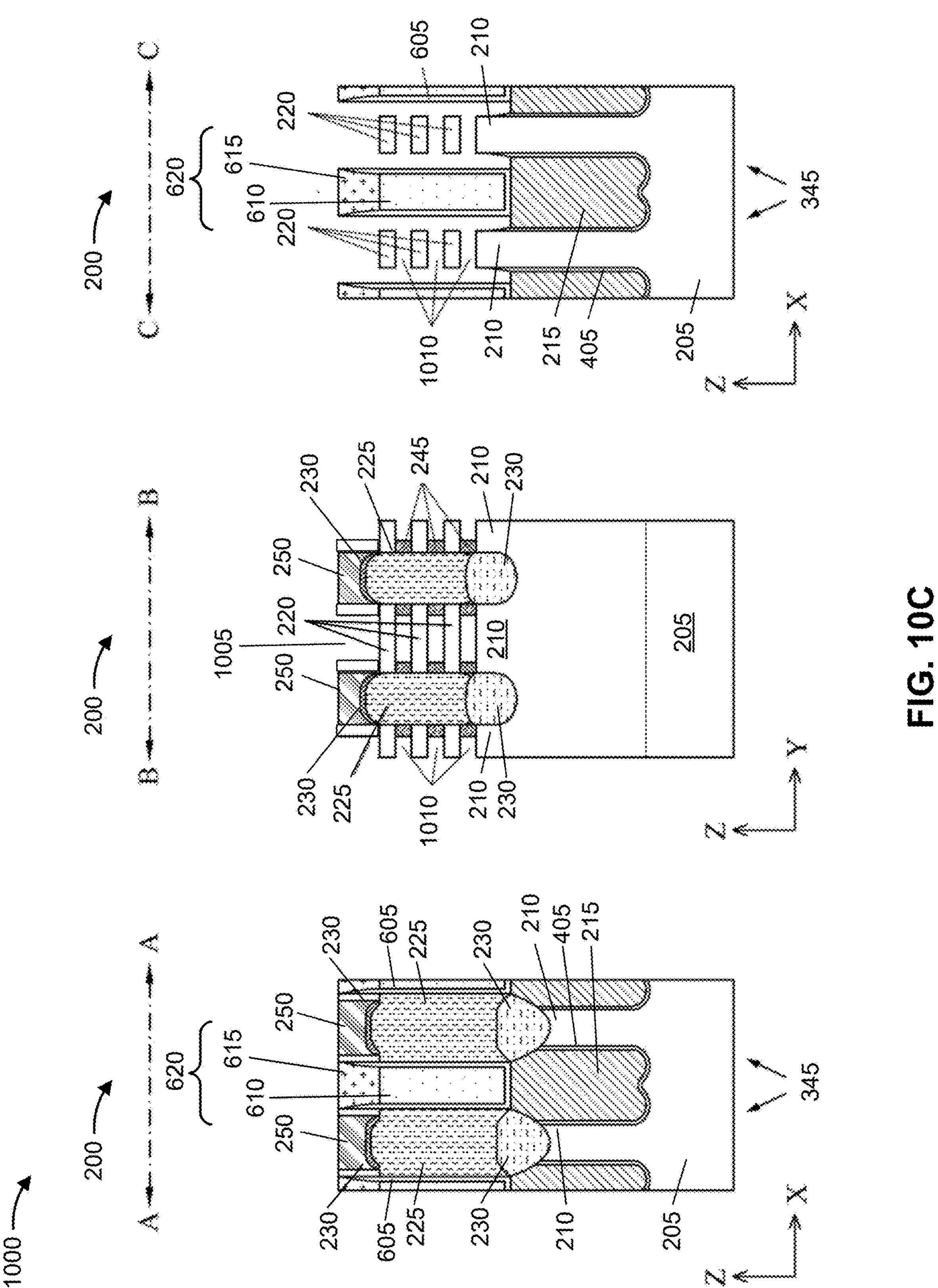

As shown in the cross-sectional plane B-B and the cross-sectional plane C-C in FIG. 10C, a nanostructure release operation (e.g., an SiGe release operation) is performed to remove the first layers 310 (e.g., the SiGe layers). This results in openings 1010 between the nanostructures channels 220 (e.g., the areas around the nanostructure channels 220). The nanostructure release operation may include the etch tool 108 performing an etch operation to remove the first layer 310 based on a difference in etch selectivity between the material of the first layers 310 and the material of the nanostructure channels 220, and between the material of the first layers 310 and the material of the inner spacer layers 245. The inner spacer layers 245 may function as etch stop layers in the etch operation to protect the source/drain regions 225 from being etched. As further shown in FIG. 10C, the cladding sidewalls 510 are removed in the nanostructure release operation. This provides access to the areas around the nanostructure channels 220, which enables replacement gate structures (e.g., the gate structures 240) to be formed fully around the nanostructure channels 220.

Figure 10D:
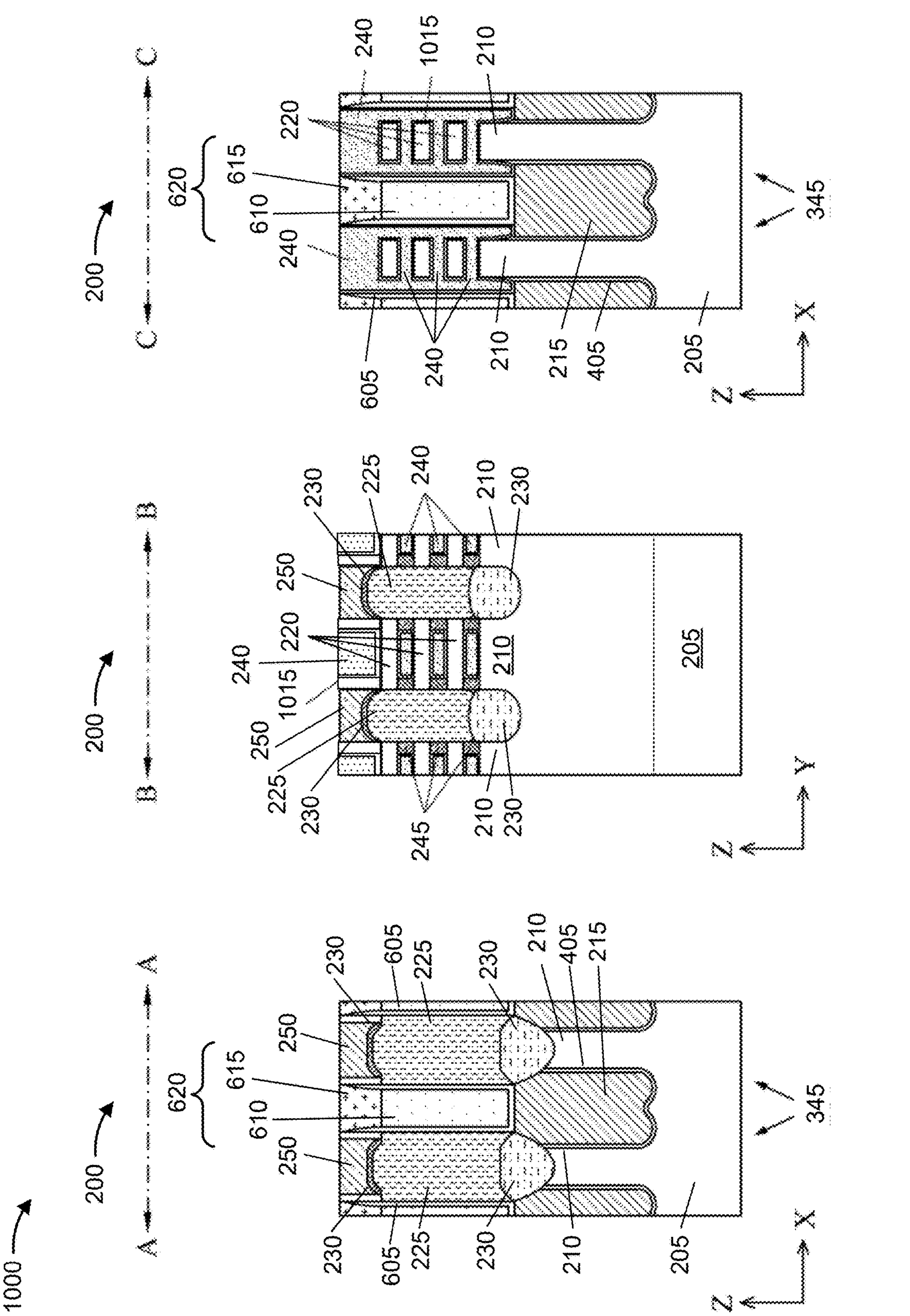

As shown in the cross-sectional plan B-B and the cross-sectional plane C-C in FIG. 10D, the replacement gate operation continues where deposition tool 102 and/or the plating tool 112 forms the gate structures (e.g., replacement gate structures) 240 in the openings 1010 between the source/drain regions 225 and between the hybrid fin structures 620. In particular, the gate structures 240 fill the areas between and around the nanostructure channels 220 that were previously occupied by the first layers 310 and the cladding sidewalls 510 such that the gate structures 240 fully wrap around the nanostructure channels 220 and surround the nanostructure channels 220. The gate structures 240 may include metal gate structures. A conformal high-k dielectric liner 1015 may be deposited onto the nanostructure channels 220 and on sidewalls prior to formation of the gate structures 240. The gate structures 240 may include additional layers such as an interfacial layer, a work function tuning layer, and/or a metal electrode structure, among other examples.

As further shown in the cross-sectional plane C-C in FIG. 10D, the removal of the cladding layer 505 from the tops of the STI regions 215 to prevent cladding sidewalls from including footings under the hybrid fin structures 620 between adjacent fin structures 345 enables the gate structures 240 to be formed such that the gate structure 240 does not include a footing under the hybrid fin structures 620. In other words, since the gate structures 240 are formed in the areas that were previously occupied by cladding sidewalls, the absence of a footing under the hybrid fin structures 620 for the cladding sidewalls also results in an absence of a footing under the hybrid fin structures 620 for the gate structures 240. This reduces and/or prevents shorting between the gate structures 240 and the source/drain regions 225 under the hybrid fin structures 620.

Figure 10E:
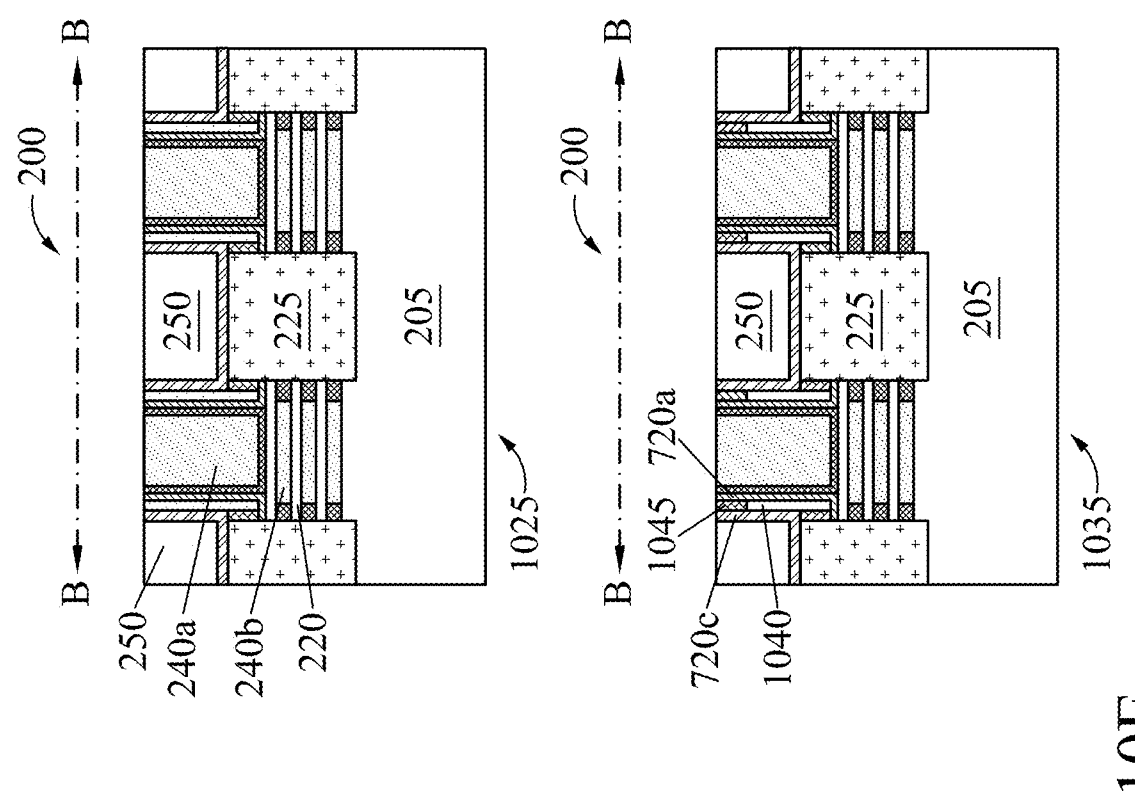

FIG. 10E shows a variation of the gate replacement process including examples 1020, 1025, 1030, and 1035. The variations of FIG. 10E may be performed in combination with one or more techniques described in FIG. 7C, FIG. 9B, and FIGS. 10A-10D.

Example 1020 shows the cavities 1005 formed after removal of the dummy gate structures 705. Adjacent to the cavities 1005 are respective portions of the spacer layer 720*a*, the spacer layer 720*b*, and the spacer layer 720*c*.

Example 1025 shows forming the metal gate structure 240 as a result of the nanosheet release and replacement gate processes. During release or removal of the nanosheets (e.g., the first layers 310) the spacer layer 720*b* may be masked (e.g., protected with a "helmet"). The metal gate structure 240 includes a portion 240*a* over a plurality of the nanostructure channels 220 and a portion 240*b* that wraps around the plurality of nanostructure channels 220. Example 1025 further shows the ILD layer 250 after deposition and CMP operations.

Example 1030 shows forming a dielectric region 1040 between the spacer layer 720*a* and the spacer layer 720*c*. The dielectric region 1040 may correspond to a gap containing a dielectric gas (e.g., air, among other examples).

To form the dielectric region 1040, the etch tool 108 may remove the spacer layer 720*b* using an etching-selectivity operation to selectively remove the spacer layer 720*b* from between the spacer layer 720*a* and the spacer layer 720*c*. To selectively remove the spacer layer 720*b*, the etching-selectivity operation may use a gaseous mixture that has an accelerated reaction with the material of the spacer layer 720*b* (e.g., SiGe) relative to the material of the spacer layer 720*a* and/or the spacer layer 720*c* (e.g., $Si_xN_y$, SiOCN, SiCO, or SiCN, among other examples). As an example, the gaseous mixture may include a hydrogen fluoride (HF) gas, which may assist in the removal of Ge due to a migration of hydrogen (H). The gaseous mixture may also include a fluorine ($F_2$) gas, which may assist removal of Si due to a migration of fluoride (F).

In some implementations, the accelerated reaction corresponds to a blanket film loss rate (e.g., a loss trend). As an example, and for the etching-selectivity operation using the $HF/F_2$ gaseous mixture, the blanket film loss rate for SiGe (e.g., the spacer layer 720*b*) may be approximately 129.6 angstroms per minute. Comparatively, and for the etching-selectivity operation using the $HF/F_2$ gaseous mixture, the blanket film loss rate for SiCN (e.g., the spacer layer 720*a* and/or the spacer layer 720*c*) may be approximately 0.7 angstroms per minute. Although selectively etching the SiGe and SiCN materials using the $HF/F_2$ gaseous mixture is presented as an example, selectively etching other combinations of materials using other gaseous mixtures are within the scope of the present disclosure. Similarly, other blanket film loss rates are within the scope of the present disclosure.

Use of the SiGe material for the spacer layer 720*b*, in combination with the $HF/F_2$ gaseous mixture for the etching selectivity operation, may provide multiple benefits in comparison to use of another material (e.g., $SiO_2$) and/or gaseous mixture. As an example, using the SiGe material for the spacer layer 720*b*, in combination with removing the spacer layer 720*b* using the $HF/F_2$ gaseous mixture, may eliminate the need for additional hard masking (e.g., "helmet") layers (and manufacturing cycles) to protect portions of the semiconductor device 200 (e.g., the metal gate structure 240, the ILD layer 250, and/or STI regions 215) during removal of the spacer layer 720*b*. Additionally, or alternatively, a likelihood of damage to portions of the metal gate structure 240, the spacer layer 720*a*, and/or the spacer layer 720*c* may be reduced.

Example 1035 shows forming a filler material 1045 between a portion of the spacer layer 720*a* and a portion of the spacer layer 720*c*. To form the filler material 1045, the deposition tool 102 may deposit a nitride material using a deposition process, such as ALD, CVD, or another deposition technique. In some implementations, the filler material 1045 corresponds to a hard masking layer.

As indicated above, the number and arrangement of operations and devices shown in FIGS. 10A-10E are provided as one or more examples. In practice, there may be additional operations and devices, fewer operations and devices, different operations and devices, or differently arranged operations and devices than those shown in FIGS. 10A-10E.

Figure 11:
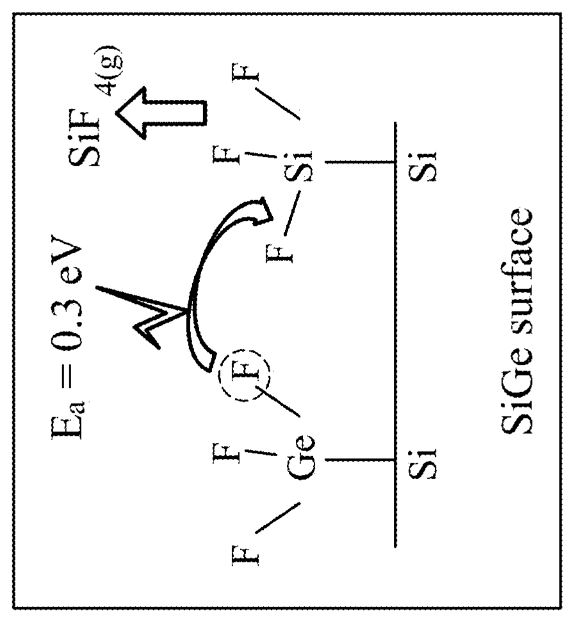
FIG. 11 is a diagram of an example implementation of reaction mechanisms for an etching-selectivity operation described herein.
Figure 11:
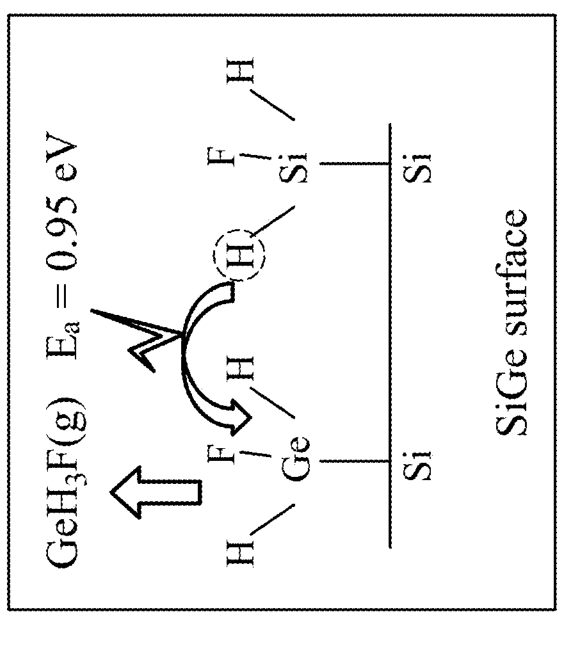

FIG. 11 is a diagram of an example implementation 1100 of reaction mechanisms for an etching-selectivity operation described herein. The implementation includes an example Ge removal reaction mechanism 1105 and an example Si removal reaction mechanism 1110.

As shown in the Ge removal reaction mechanism 1105, the HF component of the $HF/F_2$ gaseous mixture may assist removal of Ge from a SiGe surface due to migration of H. In some implementations, the Ge removal reaction mechanism 1105 occurs at a temperature of approximately 68 degrees Celsius.

As shown in the Si removal reaction mechanism 1110, the $F_2$ component of the $HF/F_2$ gaseous mixture may assist removal of Si from the SiGe surface due to migration of F. In some implementations, the Si removal reaction mechanism 1110 occurs at a temperature of approximately −165 degrees Celsius.

As indicated above, the reaction mechanisms in FIG. 11 are provided as one or more examples. In practice, there may be additional reaction mechanisms, fewer reaction mechanisms, different reaction mechanisms, or differently arranged reaction mechanisms than those shown in FIG. 11.

Figure 12A:
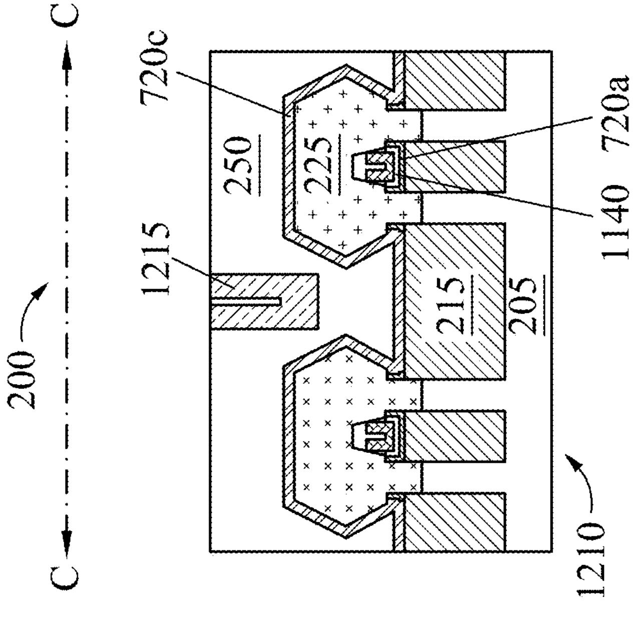
FIGS. 12A-12C are diagrams of an example implementation of a semiconductor device described herein.
Figure 12A:
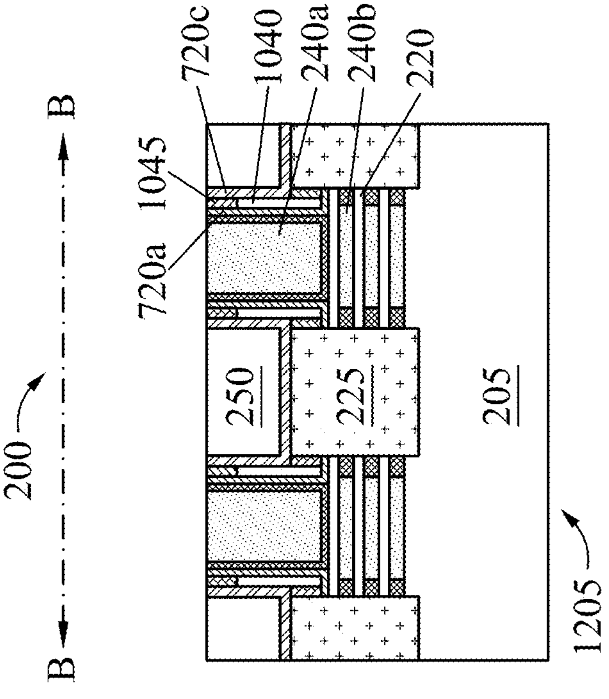
Figure 12B:
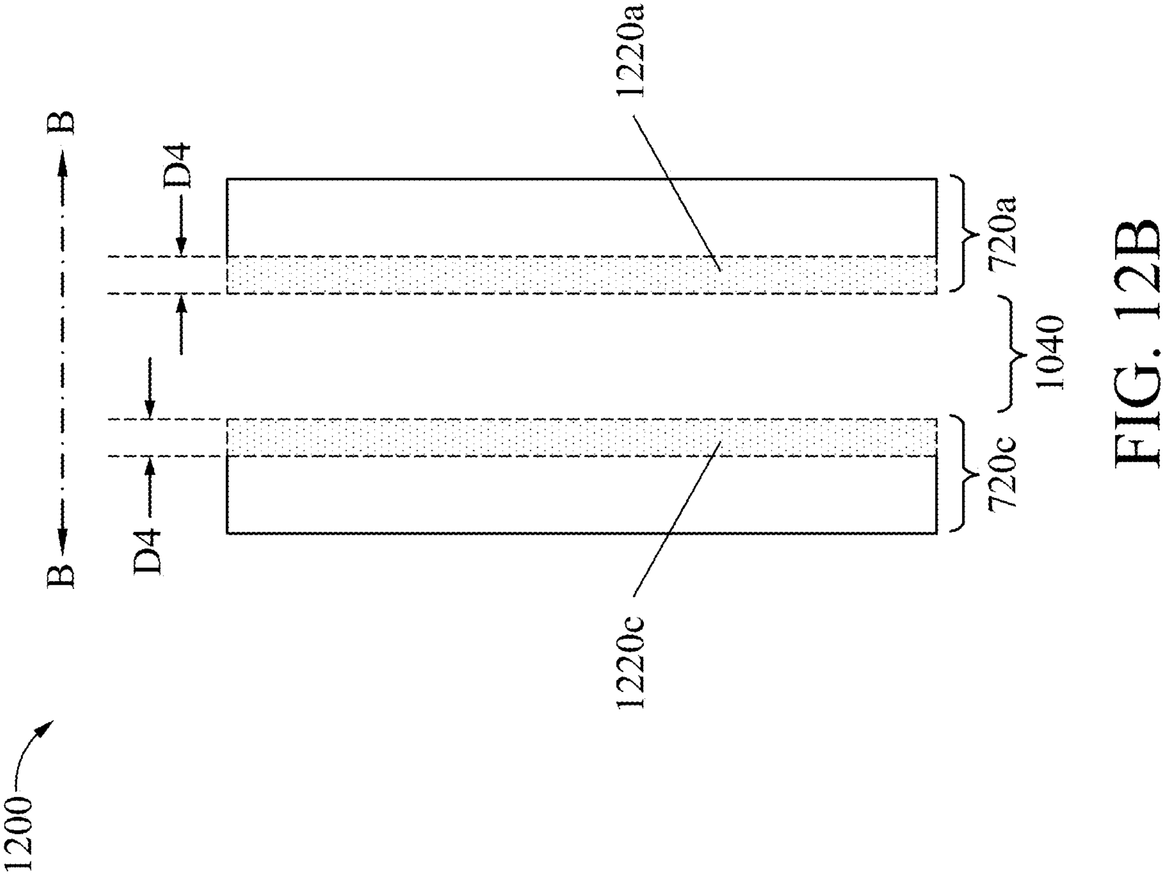
Figure 12C:
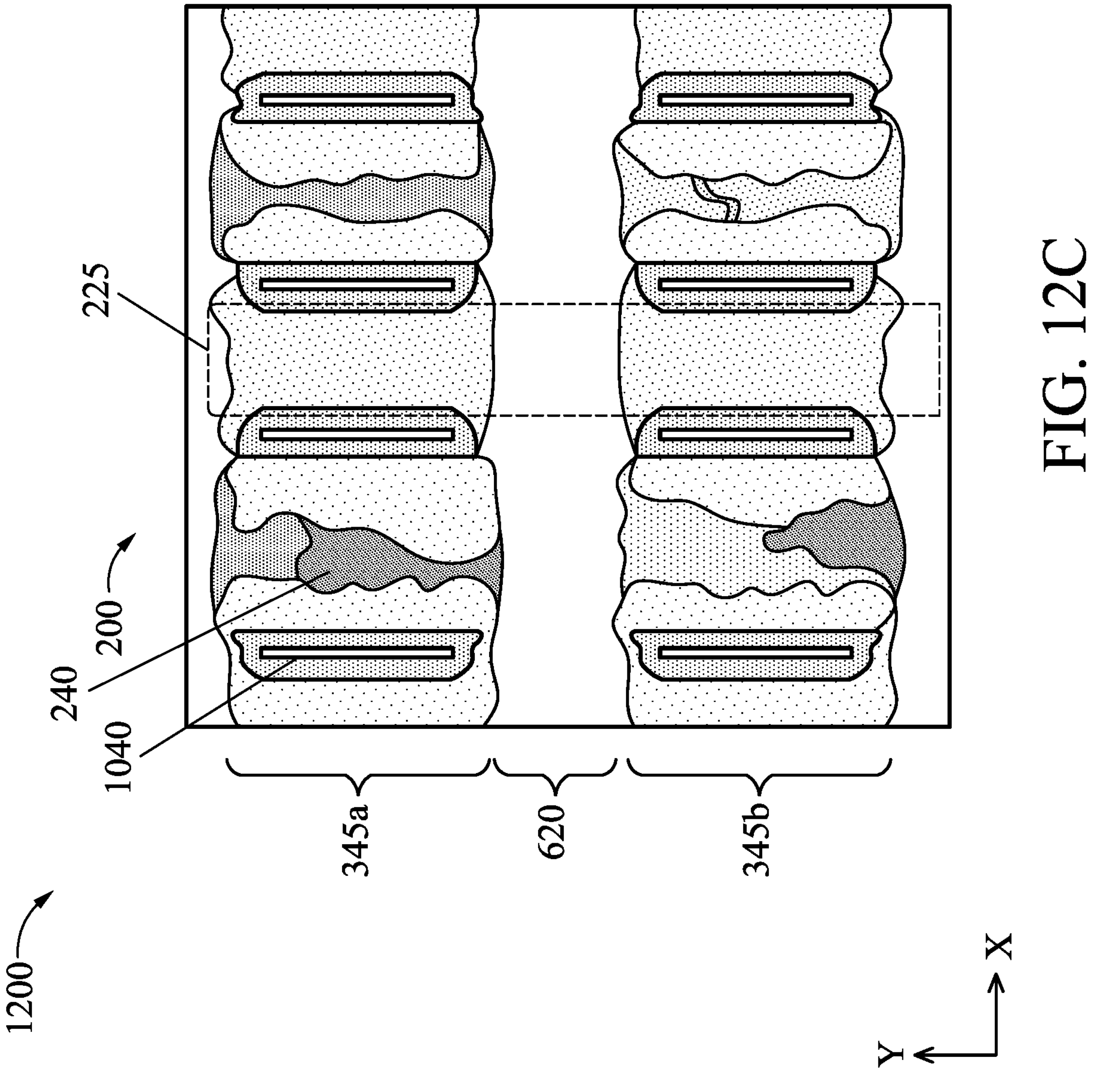

FIGS. 12A-12C are diagrams of an example implementation 1200 of the semiconductor device 200 described herein. The semiconductor device 200 may be formed in connection with techniques described FIGS. 1A-11, and elsewhere herein.

Example 1205 is illustrated from the perspective of the cross-sectional plane B-B in FIG. 7A. As shown in the example, the semiconductor device 200 includes the semiconductor substrate 205, the source/drain regions 225, and the ILD layer 250. The semiconductor device 200 further includes a plurality of the nanostructure channels 220 over the semiconductor substrate 205. In some implementations, and as shown, the plurality of the nanostructure channels 220 are arranged in a direction that is perpendicular to the semiconductor substrate 205. The semiconductor device 200 further includes the gate structure 240 including the first portion 240*a* over the plurality of nanostructure channels 220 and the second portion 240*b* wrapping around each of the plurality of nanostructure channels 220. The semiconductor device 200 includes a portion of the spacer layer 720*a* (e.g., a first spacer layer remaining after formation of the semiconductor device 200) along a sidewall of the first portion 240*a* of the gate structure 240. The semiconductor device 200 also includes a portion of the spacer layer 720*c* (e.g., a second spacer layer remaining after formation of the semiconductor device) adjacent to the spacer layer 720*a*. The semiconductor device 200 also includes the dielectric region 1040 including a portion between the portion of the spacer layer 720*a* and the portion of the spacer layer 720*c*. In some implementations, the dielectric region 1040 includes a dielectric gas (e.g., air). The example further shows the filler material 1045 between the portion of the spacer layer 720*a* and the portion of the spacer layer 720*c*.

Example 1210 is illustrated from the perspective of the cross-sectional plane C-C in FIG. 7A. In addition to showing the semiconductor substrate 205, the STI regions 215, the source/drain regions 225, and the ILD layer 250, and as shown, the semiconductor device 200 may include one or more additional refill regions (e.g., the region 1215 which may be refilled with a nitride material, among other examples).

As shown in the example 1210, the spacer layer 720*c* is over the merged epitaxial regions (e.g., the source/drain regions 225). Furthermore, and as shown, a portion of the dielectric region 1040 and a portion of the spacer layer 720*a* are below the merged epitaxial regions.

FIG. 12B shows details of the spacer layer 720*a*, the spacer layer 720*c*, and the dielectric region 1040. FIG. 12B is illustrated from the perspective of the cross-sectional plane B-B in FIG. 7A. As shown, a width of dielectric region 1040 corresponds to the thickness D2 of the spacer layer 720*b* as described in connection with FIG. 7C.

The spacer layer 720*a* includes a region 1220*a* of diffused SiGe. The diffused SiGE in the region 1220*a* may be due to the spacer layer 720*a* (previously adjacent to the spacer layer 720*b*, since removed) undergoing a thermal load during patterning of the source/drain regions 225. Additionally, or alternatively, the diffused SiGe in the region 1220*a* may be due to the spacer layer 720*a* (previously adjacent to the spacer layer 720*b*, since removed) being subjected to annealing processes associated with the spacer layer 720*c* or the ILD layer 250.

The region 1220*a* may include a depth D4 that is in a range of approximately 1 nanometer to approximately 2 nanometers. The depth D4 may correspond to a depth from a surface of the spacer layer 720*a* facing the dielectric region 1040. If the depth D4 is less than approximately 1 nanometer, content of the Ge in the SiGe material in the spacer layer 720*a* may have been less than a targeted amount. Additionally, or alternatively, misprocessing of the semiconductor device 200 may have occurred (e.g., annealing processes associated with the spacer layer 720*c* and/or the ILD layer 250 may have occurred below a target annealing temperature). If the depth D4 is greater than approximately 2 nanometers, content of the Ge in the SiGe material of the spacer layer 720*a* may have been higher than a targeted amount. Additionally, or alternatively, misprocessing of the semiconductor device 200 may have occurred (e.g., annealing processes associated with the spacer layer 720*c* and/or the ILD layer 250 may have occurred above a target annealing temperature). However, other values and ranges for the depth D4 are within the scope of the present disclosure.

The spacer layer 720*c* includes a region 1220*c* of diffused SiGe. The diffused SiGE in the region 1220*c* may be due to the spacer layer 720*c* (previously adjacent to the spacer layer 720*b*, since removed) undergoing a thermal load during patterning of the source/drain regions 225. Additionally, or alternatively, the diffused SiGe in the region 1220*c* may be due to the spacer layer 720*c* (previously adjacent to the spacer layer 720*b*, since removed) being annealed or subjected to an annealing process associated with the ILD layer 250.

The region 1220*c* may include a depth D5 that is in a range of approximately 1 nanometer to approximately 2 nanometers. The depth D5 may correspond to a depth from a surface of the spacer layer 720*c* facing the dielectric region 1040. If the depth D5 is less than approximately 1 nanometer, content of the Ge in the SiGe material of the spacer layer 720*c* may have been less than a targeted amount. Additionally, or alternatively, misprocessing of the semiconductor device 200 may have occurred (e.g., annealing processes associated with the spacer layer 720*c* and/or the ILD layer 250 may have occurred below a target annealing temperature). If the depth D5 is greater than approximately 2 nanometers, content of the Ge in the SiGe material of the spacer layer 720*c* may have been higher than a targeted amount. Additionally, or alternatively, misprocessing of the semiconductor device 200 may have occurred (e.g., annealing processes associated with the spacer layer 720*c* and/or the ILD layer 250 may have occurred above a target annealing temperature). However, other values and ranges for the depth D5 are within the scope of the present disclosure.

FIG. 12C shows an example footprint of the semiconductor device 200. FIG. 12C is illustrated from the perspective of a top view of the semiconductor device 200 in the x-y plane of FIG. 7A.

FIG. 12C shows the gate structures 240. FIG. 12C also shows a hybrid fin structure 620 between a fin structure 345*a* and a fin structure 345*b*. FIG. 12C also shows a footprint of the source/drain region 225 (e.g., a merged epitaxial region). FIG. 12C further shows the dielectric region 1040 adjacent to the gate structure 240.

As indicated above, FIGS. 12A-12C are provided as examples. Other examples may differ from what is described with regard to FIGS. 12A-12C. The semiconductor device 200 of FIGS. 12A-12C may include additional structures, fewer structures, different structures, and/or a different arrangement of structures than those described in connection with FIGS. 12A-12C.

Figure 13:
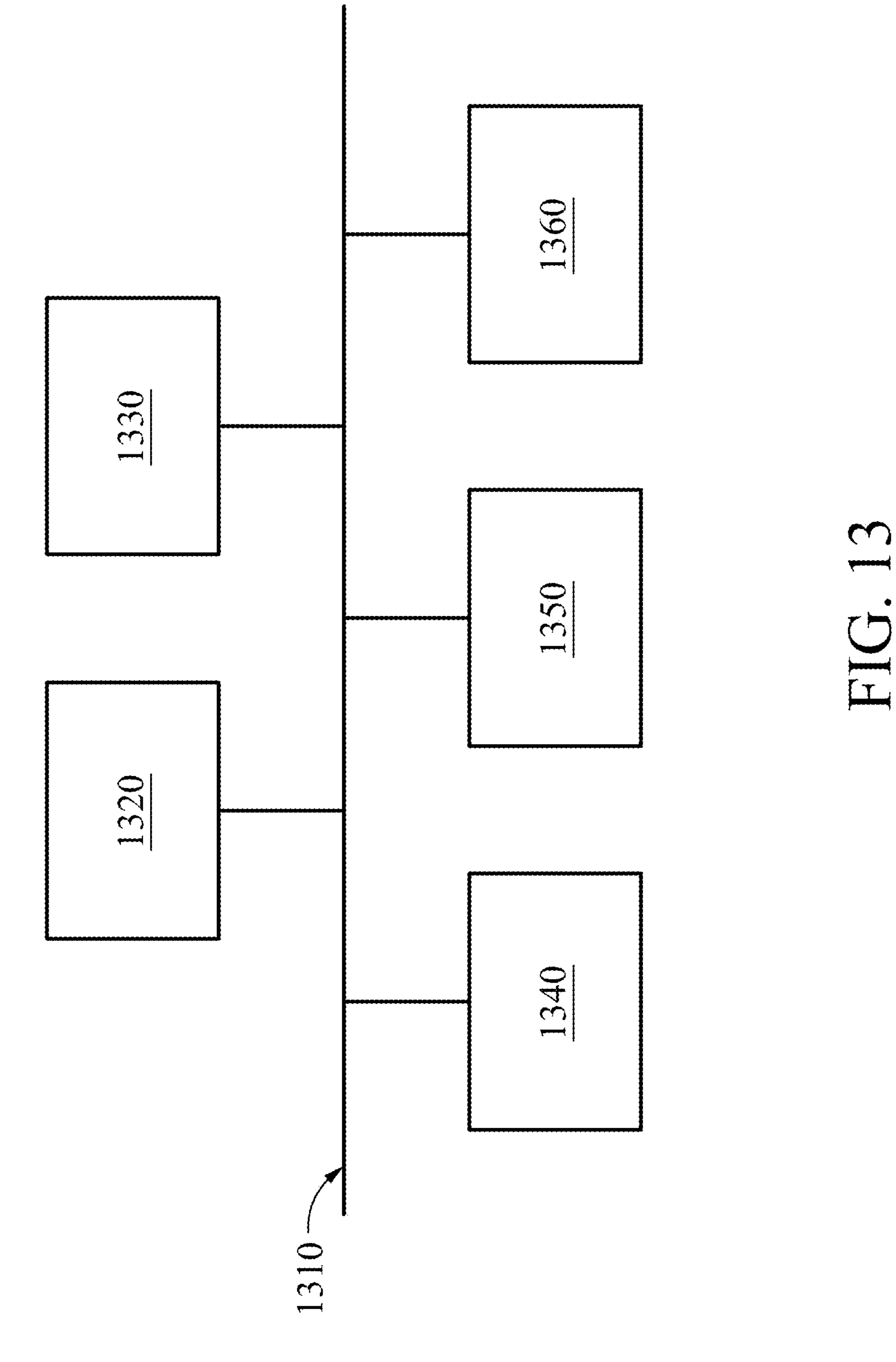
FIG. 13 is a diagram of example components of one or more devices described herein.

FIG. 13 is a diagram of example components of one or more devices 1300 described herein. In some implementations, one or more of the semiconductor processing devices 102-112 and/or the wafer/die transport tool 114 may include one or more devices 1300 and/or one or more components of device 1300. As shown in FIG. 13, device 1300 may include a bus 1310, a processor 1320, a memory 1330, an input component 1340, an output component 1350, and a communication component 1360.

Bus 1310 includes one or more components that enable wired and/or wireless communication among the components of device 1300. Bus 1310 may couple together two or more components of FIG. 13, such as via operative coupling, communicative coupling, electronic coupling, and/or electric coupling. Processor 1320 includes a central processing unit, a graphics processing unit, a microprocessor, a controller, a microcontroller, a digital signal processor, a field-programmable gate array, an application-specific integrated circuit, and/or another type of processing component. Processor 1320 is implemented in hardware, firmware, or a combination of hardware and software. In some implementations, processor 1320 includes one or more processors capable of being programmed to perform one or more operations or processes described elsewhere herein.

Memory 1330 includes volatile and/or nonvolatile memory. For example, memory 1330 may include random access memory (RAM), read only memory (ROM), a hard disk drive, and/or another type of memory (e.g., a flash memory, a magnetic memory, and/or an optical memory). Memory 1330 may include internal memory (e.g., RAM, ROM, or a hard disk drive) and/or removable memory (e.g., removable via a universal serial bus connection). Memory 1330 may be a non-transitory computer-readable medium. Memory 1330 stores information, instructions, and/or software (e.g., one or more software applications) related to the operation of device 1300. In some implementations, memory 1330 includes one or more memories that are coupled to one or more processors (e.g., processor 1320), such as via bus 1310.

Input component 1340 enables device 1300 to receive input, such as user input and/or sensed input. For example, input component 1340 may include a touch screen, a keyboard, a keypad, a mouse, a button, a microphone, a switch, a sensor, a global positioning system sensor, an accelerometer, a gyroscope, and/or an actuator. Output component 1350 enables device 1300 to provide output, such as via a display, a speaker, and/or a light-emitting diode. Communication component 1360 enables device 1300 to communicate with other devices via a wired connection and/or a wireless connection. For example, communication component 1360 may include a receiver, a transmitter, a transceiver, a modem, a network interface card, and/or an antenna.

Device 1300 may perform one or more operations or processes described herein. For example, a non-transitory computer-readable medium (e.g., memory 1330) may store a set of instructions (e.g., one or more instructions or code) for execution by processor 1320. Processor 1320 may execute the set of instructions to perform one or more operations or processes described herein. In some implementations, execution of the set of instructions, by one or more processors 1320, causes the one or more processors 1320 and/or the device 1300 to perform one or more operations or processes described herein. In some implementations, hardwired circuitry is used instead of or in combination with the instructions to perform one or more operations or processes described herein. Additionally, or alternatively, processor 1320 may be configured to perform one or more operations or processes described herein. Thus, implementations described herein are not limited to any specific combination of hardware circuitry and software.

The number and arrangement of components shown in FIG. 13 are provided as an example. Device 1300 may include additional components, fewer components, different components, or differently arranged components than those shown in FIG. 13. Additionally, or alternatively, a set of components (e.g., one or more components) of device 1300 may perform one or more functions described as being performed by another set of components of device 1300.

Figure 14:
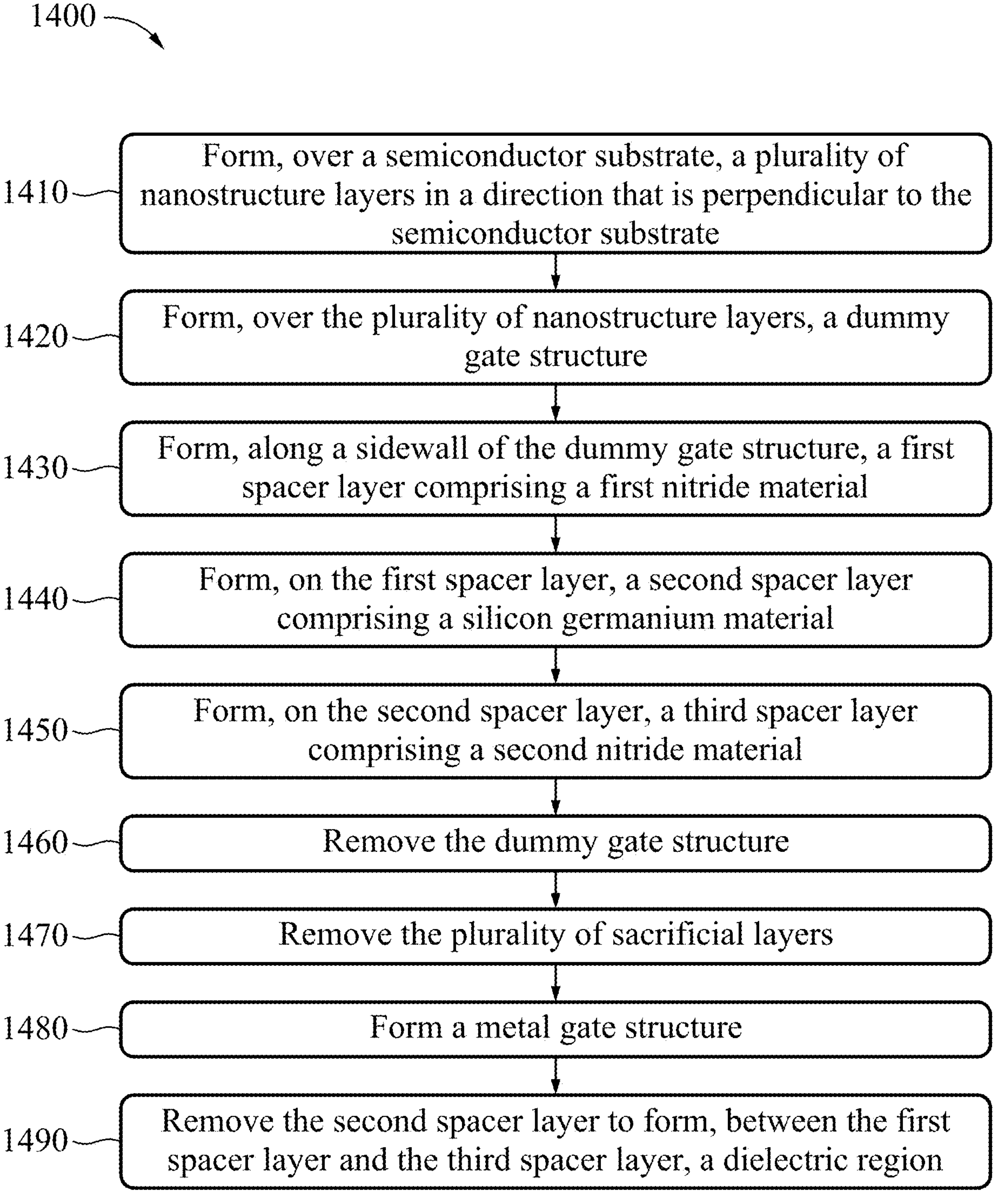
FIGS. 14 and 15 are flowcharts of example processes associated with forming a semiconductor device described herein.

FIG. 14 is a flowchart of an example process 1400 associated with semiconductor device and methods of formation. In some implementations, one or more process blocks of FIG. 14 are performed by one or more semiconductor processing tools (e.g., one or more of the semiconductor processing tools 102-112). Additionally, or alternatively, one or more process blocks of FIG. 14 may be performed by one or more components of device 1300, such as processor 1320, memory 1330, input component 1340, output component 1350, and/or communication component 1360.

As shown in FIG. 14, process 1400 may include forming, over a semiconductor substrate, a plurality of nanostructure layers in a direction that is perpendicular to the semiconductor substrate, wherein the plurality of nanostructure layers includes a plurality of sacrificial layers alternating with a plurality of channel layers (block 1410). For example, the one or more semiconductor processing tools 102-112 may form, over a semiconductor substrate 205, a plurality of nanostructure layers in a direction that is perpendicular to the semiconductor substrate 205, wherein the plurality of nanostructure layers includes a plurality of sacrificial layers (e.g., the first layers 310) alternating with a plurality of channel layers (e.g., the second layers 315), as described above.

As further shown in FIG. 14, process 1400 may include forming, over the plurality of nanostructure layers, a dummy gate structure (block 1420). For example, the one or more semiconductor processing tools 102-112 may form, over the plurality of nanostructure layers, a dummy gate structure 705, as described above.

As further shown in FIG. 14, process 1400 may include forming, along a sidewall of the dummy gate structure, a first spacer layer including a first nitride material (block 1430). For example, the deposition tool 102 may form, along a sidewall of the dummy gate structure 705, a first spacer layer 720*a* including a first nitride material, as described above.

As further shown in FIG. 14, process 1400 may include forming, on the first spacer layer, a second spacer layer including an SiGe material (block 1440). For example, the deposition tool 102 may form, on the first spacer layer 720*a*, a second spacer layer 720*b* including an SiGe material, as described above.

As further shown in FIG. 14, process 1400 may include forming, on the second spacer layer, a third spacer layer including a second nitride material (block 1450). For example, the deposition tool 102 may form, on the second spacer layer 720*b*, a third spacer layer 720*c* including a second nitride material, as described above.

As further shown in FIG. 14, process 1400 may include removing the dummy gate structure (block 1460). For example, the one or more semiconductor processing tools 102-112 may remove the dummy gate structure 705, as described above.

As further shown in FIG. 14, process 1400 may include removing the plurality of sacrificial layers (block 1470). For example, the one or more semiconductor processing tools 102-112 may remove the plurality of sacrificial layers, as described above.

As further shown in FIG. 14, process 1400 may include forming a metal gate structure. (block 1480). For example, the one or more semiconductor processing tools 102-112 may form a metal gate structure 240, as described above. In some implementations, forming the metal gate structure 240 includes forming a first portion 240*a* in place of the dummy gate structure 705 and forming a second portion 240*b* that wraps around a plurality of nanostructure channels 220 formed from the plurality of channel layers.

As further shown in FIG. 14, process 1400 may include removing the second spacer layer to form, between the first spacer layer and the third spacer layer, a dielectric region, wherein the dielectric region includes air (block 1490). For example, the one or more semiconductor processing tools 102-112 may remove the second spacer layer 720*b* to form, between the first spacer layer 720*a* and the third spacer layer 720*c*, a dielectric region 1040, as described above. In some implementations, the dielectric region 1040 includes air.

Process 1400 may include additional implementations, such as any single implementation or any combination of implementations described below and/or in connection with one or more other processes described elsewhere herein.

In a first implementation, forming the second spacer layer 720*b* including the SiGe material includes forming the second spacer layer using the SiGe material. In some implementations, a content of Ge in the SiGe material is in a range of approximately 10% to approximately 40%.

In a second implementation, alone or in combination with the first implementation, removing the second spacer layer 720*b* to form the dielectric region 1040 includes etching the second spacer layer 720*b* using a gaseous mixture including an HF gas.

In a third implementation, alone or in combination with one or more of the first and second implementations, removing the second spacer layer 720*b* to form the dielectric region 1040 includes etching the second spacer layer 720*b* using a gaseous mixture including an $F_2$ gas.

In a fourth implementation, alone or in combination with one or more of the first through third implementations, process 1400 includes forming, at an end of the dielectric region 1040, a filler material 1045 between the first spacer layer 720*a* and the third spacer layer 720*c*.

Although FIG. 14 shows example blocks of process 1400, in some implementations, process 1400 includes additional blocks, fewer blocks, different blocks, or differently arranged blocks than those depicted in FIG. 14. Additionally, or alternatively, two or more of the blocks of process 1400 may be performed in parallel.

Figure 15:
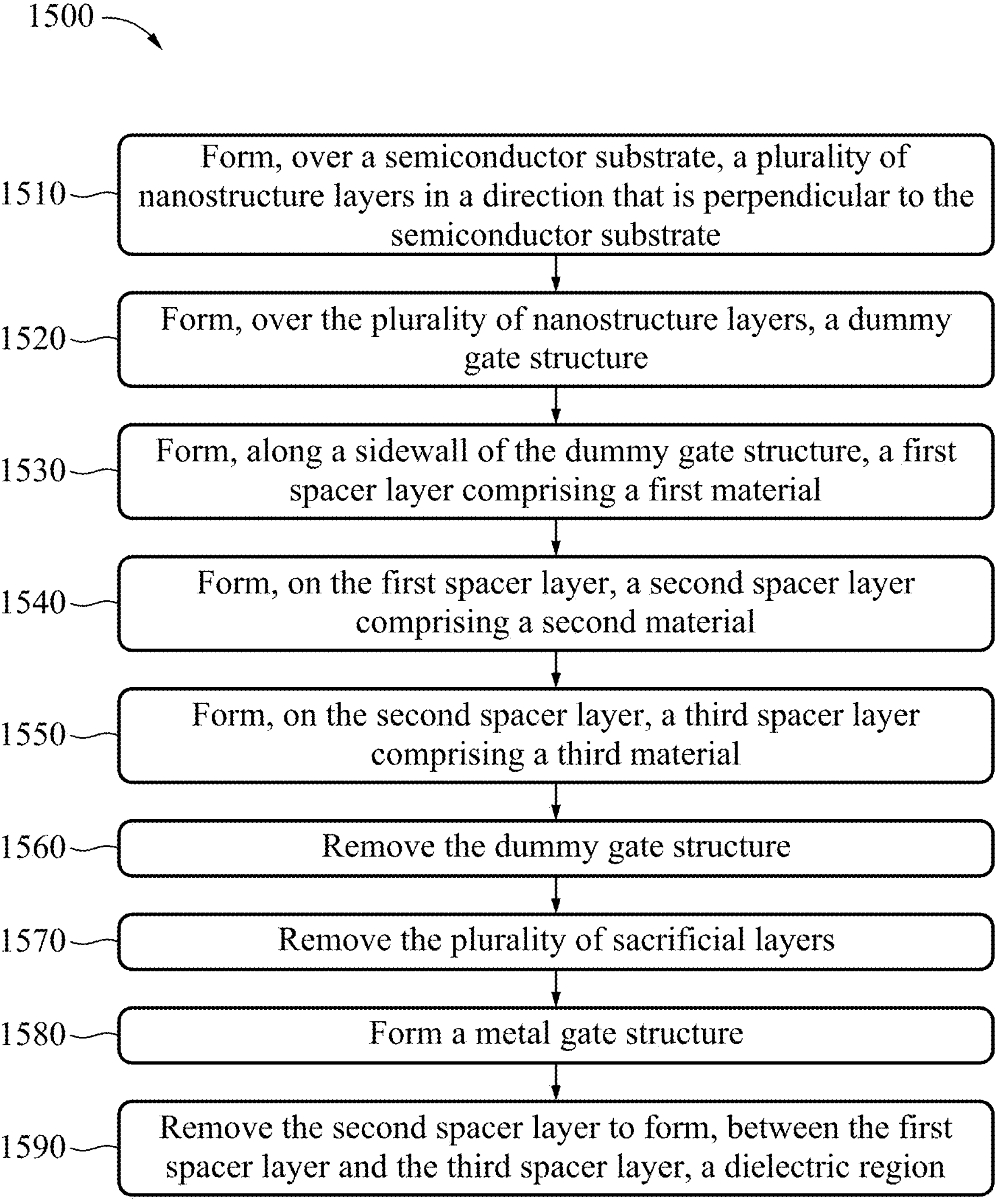

FIG. 15 is a flowchart of an example process 1500 associated with semiconductor device and methods of formation. In some implementations, one or more process blocks of FIG. 15 are performed by one or more semiconductor processing tools (e.g., one or more of the semiconductor processing tools 102-112). Additionally, or alternatively, one or more process blocks of FIG. 15 may be performed by one or more components of device 1300, such as processor 1320, memory 1330, input component 1340, output component 1350, and/or communication component 1360.

As shown in FIG. 15, process 1500 may include forming, over a semiconductor substrate, a plurality of nanostructure layers in a direction that is perpendicular to the semiconductor substrate, wherein the plurality of nanostructure layers includes a plurality of sacrificial layers alternating with a plurality of channel layers (block 1510). For example, the one or more semiconductor processing tools 102-112 may form, over a semiconductor substrate 205, a plurality of nanostructure layers in a direction that is perpendicular to the semiconductor substrate 205, as described above. In some implementations, the plurality of nanostructure layers includes a plurality of sacrificial layers (e.g., the first layers 310) alternating with a plurality of channel layers (e.g., the second layers 315).

As further shown in FIG. 15, process 1500 may include forming, over the plurality of nanostructure layers, a dummy gate structure (block 1520). For example, the one or more semiconductor processing tools 102-112 may form, over the plurality of nanostructure layers, a dummy gate structure 705, as described above.

As further shown in FIG. 15, process 1500 may include forming, along a sidewall of the dummy gate structure, a first spacer layer including a first material (block 1530). For example, the deposition tool 102 may form, along a sidewall of the dummy gate structure 705, a first spacer layer **720*a*** including a first material, as described above.

As further shown in FIG. 15, process 1500 may include forming, on the first spacer layer, a second spacer layer including a second material (block 1540). For example, the deposition tool 102 may form, on the first spacer layer **720*a*, a second spacer layer 720*b*** including a second material, as described above.

As further shown in FIG. 15, process 1500 may include forming, on the second spacer layer, a third spacer layer including a third material (block 1550). For example, the deposition tool 102 may form, on the second spacer layer **720*b*, a third spacer layer 720*c*** including a third material, as described above.

As further shown in FIG. 15, process 1500 may include removing the dummy gate structure (block 1560). For example, the one or more semiconductor processing tools 102-112 may remove the dummy gate structure 705, as described above.

As further shown in FIG. 15, process 1500 may include removing the plurality of sacrificial layers (block 1570). For example, the one or more semiconductor processing tools 102-112 may remove the plurality of sacrificial layers, as described above.

As further shown in FIG. 15, process 1500 may include forming a metal gate structure, wherein forming the metal gate structure includes forming a first portion in place of the dummy gate structure and forming a second portion that wraps around a plurality of nanostructure channels formed from the plurality of channel layers (block 1580). For example, the one or more semiconductor processing tools 102-112 may form a metal gate structure 240, as described above. In some implementations, forming the metal gate structure 240 includes forming a first portion **240*a* in place of the dummy gate structure 705 and forming a second portion 240*b* that wraps around a plurality of nanostructure channels 220** formed from the plurality of channel layers.

As further shown in FIG. 15, process 1500 may include removing the second spacer layer to form, between the first spacer layer and the third spacer layer, a dielectric region. (block 1590). For example, the one or more semiconductor processing tools 102-112 may remove the second spacer layer **720*b* to form, between the first spacer layer 720*a* and the third spacer layer 720*c*, a dielectric region 1040, as described above. In some implementations, removing the second spacer layer 720*b* includes using a gaseous mixture that has an accelerated reaction with the second material, relative to the first material and the third material, to perform an etch-selectivity operation that removes the second spacer layer 720*b* from between the first spacer layer 720*a* and the third spacer layer 720*c* to form the dielectric region 1040**.

Process 1500 may include additional implementations, such as any single implementation or any combination of implementations described below and/or in connection with one or more other processes described elsewhere herein.

In a first implementation, the accelerated reaction with the second material, relative to the first material, corresponds to a blanket film loss rate.

In a second implementation, alone or in combination with the first implementation, process 1500 includes forming, at an end of the dielectric region, a hard masking layer (e.g., the filler material 1045) between the first spacer layer **720*a* and the third spacer layer 720*c* to cap the dielectric region 1040**.

Although FIG. 15 shows example blocks of process 1500, in some implementations, process 1500 includes additional blocks, fewer blocks, different blocks, or differently arranged blocks than those depicted in FIG. 15. Additionally, or alternatively, two or more of the blocks of process 1500 may be performed in parallel.

Some implementations described herein provide techniques and semiconductor devices in which a dielectric region is included in a nanostructure transistor. The dielectric region, which may correspond to an air gap, may be located between dielectric spacer layers located along a sidewall of a metal gate structure. Techniques to form the dielectric region may include using a temporary spacer layer between the dielectric spacer layers during manufacturing of the nanostructure transistor. The temporary spacer layer may include an SiGe material having a reaction mechanism that allows the temporary spacer layer to be selectively removed without causing damage to the dielectric spacer layers, the metal gate structure, or other portions of the nanostructure transistor.

In this way, manufacturing may be simplified to reduce a cost of semiconductor product including dielectric region. Furthermore, a likelihood of damage to the dielectric spacer layers, the metal gate structure, or other portions of the nanostructure transistor may be decreased to increase a yield of semiconductor product including the dielectric region.

As described in greater detail above, some implementations described herein provide a semiconductor device. The semiconductor device includes a plurality of nanostructure channels over a semiconductor substrate, where the plurality of nanostructure channels are arranged in a direction that is perpendicular to the semiconductor substrate. The semiconductor device includes a gate structure including, a first portion over the plurality of nanostructure channels a second portion wrapping around each of the plurality of nanostructure channels. The semiconductor device includes a portion of a first spacer layer, including a first region of diffused silicon germanium, along a sidewall of the first portion of the gate structure. The semiconductor device includes a portion of a second spacer layer, including a second region of diffused silicon germanium, adjacent to the first spacer layer. The semiconductor device includes a dielectric region including a portion between the portion of the first spacer layer and the portion of the second spacer layer, where the dielectric region includes a dielectric gas.

As described in greater detail above, some implementations described herein provide a method. The method includes forming, over a semiconductor substrate, a plurality of nanostructure layers in a direction that is perpendicular to the semiconductor substrate, wherein the plurality of nanostructure layers includes a plurality of sacrificial layers alternating with a plurality of channel layers. The method includes forming, over the plurality of nanostructure layers, a dummy gate structure. The method includes forming, along a sidewall of the dummy gate structure, a first spacer layer including a first nitride material. The method includes forming, on the first spacer layer, a second spacer layer including a silicon germanium material. The method includes forming, on the second spacer layer, a third spacer layer including a second nitride material. The method includes removing the dummy gate structure. The method includes removing the plurality of sacrificial layers. The method includes forming a metal gate structure, where forming the metal gate structure includes forming a first portion in place of the dummy gate structure and forming a second portion that wraps around a plurality of nanostructure channels formed from the plurality of channel layers. The method includes removing the second spacer layer to form, between the first spacer layer and the third spacer layer, a dielectric region, where the dielectric region includes air.

As described in greater detail above, some implementations described herein provide a method. The method includes forming, over a semiconductor substrate, a plurality of nanostructure layers in a direction that is perpendicular to the semiconductor substrate, wherein the plurality of nanostructure layers includes a plurality of sacrificial layers alternating with a plurality of channel layers. The method includes forming, over the plurality of nanostructure layers, a dummy gate structure. The method includes forming, along a sidewall of the dummy gate structure, a first spacer layer including a first material. The method includes forming, on the first spacer layer, a second spacer layer including a second material. The method includes forming, on the second spacer layer, a third spacer layer including a third material. The method includes removing the dummy gate structure. The method includes removing the plurality of sacrificial layers. The method includes forming a metal gate structure, where forming the metal gate structure includes forming a first portion in place of the dummy gate structure and forming a second portion that wraps around a plurality of nanostructure channels formed from the plurality of channel layers. The method includes removing the second spacer layer to form, between the first spacer layer and the third spacer layer, a dielectric region, where removing the second spacer layer includes using a gaseous mixture that has an accelerated reaction with the second material, relative to the first material and the third material, to perform an etch-selectivity operation that removes the second spacer layer from between the first spacer layer and the third spacer layer to form the dielectric region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming, over a semiconductor substrate, a plurality of nanostructure layers in a direction that is perpendicular to the semiconductor substrate, wherein the plurality of nanostructure layers comprises a plurality of sacrificial layers alternating with a plurality of channel layers;

forming, over the plurality of nanostructure layers, a dummy gate structure;

forming, along a sidewall of the dummy gate structure, a first spacer layer comprising a first nitride material;

forming, on the first spacer layer, a second spacer layer comprising a silicon germanium material;

forming, on the second spacer layer and on a top surface of a source drain region adjacent to the plurality of nanostructure layers, a third spacer layer comprising a second nitride material, wherein a portion of at least one of the first spacer layer or the third spacer layer comprises a first region of diffused silicon germanium;

removing the dummy gate structure;

removing the plurality of sacrificial layers;

forming a metal gate structure, wherein forming the metal gate structure comprises forming a first portion in place of the dummy gate structure and forming a second portion that wraps around a plurality of nanostructure channels formed from the plurality of channel layers; and removing the second spacer layer to form, between the first spacer layer and the third spacer layer, a dielectric region, wherein the dielectric region comprises air and resides on a top surface of the first spacer layer, wherein the third spacer layer defines a sidewall of the dielectric region.

2. The method of claim 1, wherein forming the second spacer layer comprising the silicon germanium material comprises:

forming the second spacer layer using the silicon germanium material, wherein a content of germanium in the silicon germanium material is in a range of approximately 10% to approximately 40%.

3. The method of claim 1, wherein removing the second spacer layer to form the dielectric region comprises:

etching the second spacer layer using a gaseous mixture comprising a hydrogen fluoride gas.

4. The method of claim 1, wherein removing the second spacer layer to form the dielectric region comprises:

etching the second spacer layer using a gaseous mixture comprising a fluorine gas.

5. The method of claim 1, further comprising:

forming, at an end of the dielectric region, a filler material between the first spacer layer and the third spacer layer.

6. The method of claim 1, wherein the dielectric region has a width that is in a range of approximately 1 nanometer to approximately 5 nanometers.

7. A method, comprising:

forming, over a semiconductor substrate, a plurality of nanostructure layers in a direction that is perpendicular to the semiconductor substrate, wherein the plurality of nanostructure layers comprises a plurality of sacrificial layers alternating with a plurality of channel layers;

forming, over the plurality of nanostructure layers, a dummy gate structure;

forming, along a sidewall of the dummy gate structure, a first spacer layer comprising a first material;

forming, on the first spacer layer, a second spacer layer comprising a second material;

forming, on the second spacer layer and on a top surface of a source drain region adjacent to the plurality of nanostructure layers, a third spacer layer comprising a third material, wherein a portion of at least one of the first spacer layer or the third spacer layer comprises a region of diffused silicon germanium;

removing the dummy gate structure;

removing the plurality of sacrificial layers;

forming a metal gate structure, wherein forming the metal gate structure comprises forming a first portion in place of the dummy gate structure and forming a second portion that wraps around a plurality of nanostructure channels formed from the plurality of channel layers; and removing the second spacer layer to form, between the first spacer layer and the third spacer layer, a dielectric region that resides on a top surface of the first spacer layer, wherein removing the second spacer layer comprises using a gaseous mixture that has an accelerated reaction with the second material, relative to the first material and the third material, to perform an etch-selectivity operation that removes the second spacer layer from between the first spacer layer and the third spacer layer to form the dielectric region, and wherein the third spacer layer defines a sidewall of the dielectric region.

8. The method of claim 7, wherein the accelerated reaction with the second material, relative to the first material, corresponds to a blanket film loss rate.

9. The method of claim 7, further comprising:

forming, at an end of the dielectric region, a hard masking layer between the first spacer layer and the third spacer layer to cap the dielectric region.

10. A method, comprising:

forming, over a semiconductor substrate, a plurality of nanostructure layers comprising a plurality of sacrificial layers and a plurality of channel layers;

forming, over the plurality of nanostructure layers, a dummy gate structure;

forming, along a sidewall of the dummy gate structure, a plurality of spacer layers;

removing the dummy gate structure;

removing the plurality of sacrificial layers;

forming a metal gate structure, wherein forming the metal gate structure comprises forming a first portion in place of the dummy gate structure and forming a second portion that wraps around a plurality of nanostructure channels formed from the plurality of channel layers; and removing a first spacer layer, of the plurality of spacer layers, to form a dielectric region, and wherein a portion of a second spacer layer, of the plurality of spacer layers, comprises a first region of diffused silicon germanium.

11. The method of claim 10, wherein the dielectric region comprises air.

12. The method of claim 10, wherein the first region of the diffused silicon germanium is at a depth that is in a range of approximately 1 nanometer to approximately 2 nanometers, wherein the depth is from a surface of the second spacer layer facing the dielectric region.

13. The method of claim 10, wherein the second spacer layer has a thickness that is in a range of approximately 1 nanometer to approximately 5 nanometers.

14. The method of claim 10, wherein a portion of a third spacer layer, of the plurality of spacer layers, comprises a second region of diffused silicon germanium.

15. The method of claim 14, wherein the second region of diffused silicon germanium is at a depth that is in a range of approximately 1 nanometer to approximately 2 nanometers, wherein the depth is from a surface of the third spacer layer facing the dielectric region.

16. The method of claim 14, wherein the first spacer layer is between the second spacer layer and the third spacer layer.

17. The method of claim 14, further comprising:

forming, at an end of the dielectric region, a filler material between the second spacer layer and the third spacer layer.

18. The method of claim 10, wherein removing the first spacer layer to form the dielectric region comprises:

etching the first spacer layer using a gaseous mixture comprising a hydrogen fluoride gas.

19. The method of claim 10, wherein removing the first spacer layer to form the dielectric region comprises:

etching the first spacer layer using a gaseous mixture comprising a fluorine gas.

20. The method of claim 10, wherein the dielectric region has a width that is in a range of approximately 1 nanometer to approximately 5 nanometers.

* * * * *